(12) United States Patent
Yoskovitz et al.

(10) Patent No.: US 11,885,667 B2
(45) Date of Patent: Jan. 30, 2024

(54) SYSTEMS AND METHODS FOR MONITORING OF MECHANICAL AND ELECTRICAL MACHINES

(71) Applicant: Augury Systems Ltd., Haifa (IL)

(72) Inventors: Saar Yoskovitz, Haworth, NJ (US); Gal Shaul, Haifa (IL); Ori Negri, Haifa (IL); Eduard Rudyk, Haifa (IL); Gal Ben-Haim, Haifa (IL)

(73) Assignee: AUGURY SYSTEMS LTD., Haifa (IL)

( * ) Notice: Subject to any disclaimer, the term of this patent is extended or adjusted under 35 U.S.C. 154(b) by 0 days.

(21) Appl. No.: 17/934,395

(22) Filed: Sep. 22, 2022

(65) Prior Publication Data

US 2023/0080171 A1 Mar. 16, 2023

Related U.S. Application Data

(63) Continuation of application No. 16/608,563, filed as application No. PCT/IL2018/050410 on Apr. 9, 2018, now Pat. No. 11,493,379.
(Continued)

(51) Int. Cl.
*G01H 1/00* (2006.01)
*G01H 1/04* (2006.01)
(Continued)

(52) U.S. Cl.
CPC .............. *G01H 1/003* (2013.01); *G01H 1/04* (2013.01); *G01R 33/02* (2013.01); *G05B 23/0283* (2013.01)

(58) Field of Classification Search
CPC . G01H 1/003; G01H 1/04; G01H 9/00; G01R 33/02; G05B 23/0283; G01N 29/14; G01V 3/081
(Continued)

(56) References Cited

U.S. PATENT DOCUMENTS 6,199,018 B1 3/2001 Quist et al.
11,493,379 B2 11/2022 Yoskovitz et al.
(Continued)

FOREIGN PATENT DOCUMENTS

WO 2004/090486 10/2004
WO 2018/198111 11/2018

OTHER PUBLICATIONS

U.S. Appl. No. 62/579,356, filed Oct. 31, 2017.
(Continued)

*Primary Examiner* — Alesa Allgood
*Assistant Examiner* — Byung Ro Lee

(57) ABSTRACT

A system for continuously monitoring at least one machine including at least one magnetic sensor sensing magnetic fields emitted by at least one machine, at least one vibration sensor synchronously sensing vibrations emitted by the at least one machine, a signal analyzer receiving at least a portion of the magnetic field emission signals and vibration signals and performing analysis thereof, the signal analyzer providing an output based on the analysis, the output including at least an indication of a condition of the at least one machine, and a control module initiating at least one of a repair event on the at least one machine, an adjustment to a maintenance schedule of the at least one machine and an adjustment to an operating parameter of the at least one machine based on the indication, whereby efficacy of the at least one machine is improved.

20 Claims, 30 Drawing Sheets

Related U.S. Application Data

(60) Provisional application No. 62/579,356, filed on Oct. 31, 2017, provisional application No. 62/579,348, filed on Oct. 31, 2017, provisional application No. 62/503,984, filed on May 10, 2017, provisional application No. 62/490,108, filed on Apr. 26, 2017.

(51) Int. Cl.
*G01R 33/02* (2006.01)
*G05B 23/02* (2006.01)

(58) Field of Classification Search
USPC .......................................................... 73/570
See application file for complete search history.

(56) References Cited

U.S. PATENT DOCUMENTS

| | | | | |
|---|---|---|---|---|
| 2004/0154715 A1* | 8/2004 | Dufournier | ............. | B60C 11/24 |
| | | | | 340/425.5 |
| 2006/0136131 A1* | 6/2006 | Dugan | ................... | G07B 15/02 |
| | | | | 705/13 |
| 2008/0134727 A1* | 6/2008 | May | ....................... | G01D 5/145 |
| | | | | 324/207.13 |
| 2008/0159619 A1* | 7/2008 | Suh | ........................ | G06V 10/44 |
| | | | | 382/152 |
| 2009/0322373 A1 | 12/2009 | Dooley | | |
| 2011/0098968 A1* | 4/2011 | Srinivasa | ............... | G01H 1/003 |
| | | | | 324/164 |
| 2011/0125419 A1* | 5/2011 | Bechhoefer | ............. | F03D 17/00 |
| | | | | 702/34 |
| 2012/0319854 A1* | 12/2012 | Maruyama | ............. | G01R 33/02 |
| | | | | 340/635 |
| 2013/0291657 A1 | 11/2013 | Purekar et al. | | |
| 2014/0324367 A1 | 10/2014 | Garvey, III et al. | | |
| 2015/0226805 A1 | 8/2015 | Albers et al. | | |
| 2016/0070015 A1 | 3/2016 | Sastry et al. | | |
| 2016/0146646 A1* | 5/2016 | Willis | .................... | G05B 15/02 |
| | | | | 702/89 |
| 2016/0245686 A1* | 8/2016 | Pal | ....................... | G01M 13/045 |
| 2016/0306012 A1* | 10/2016 | Pinto | .................... | G01R 31/343 |
| 2020/0182684 A1 | 6/2020 | Yoskovitz et al. | | |

OTHER PUBLICATIONS

U.S. Appl. No. 62/503,984, filed May 10, 2017.
U.S. Appl. No. 62/490,108, filed Apr. 26, 2017.
U.S. Appl. No. 62/579,348, filed Oct. 31, 2017.
An International Preliminary Report on Patentability dated Oct. 29, 2019, which issued during the prosecution of Applicant's PCT/IL2018/050410.
An International Search Report and a Written Opinion both dated Aug. 30, 2018, which issued during the prosecution of Applicant's PCT/IL2018/050410.
An Invitation to pay additional fees dated Jun. 18, 2018, which issued during the prosecution of Applicant's PCT/IL2018/050410.
European Search Report dated Dec. 14, 2020 which issued during the prosecution of Applicant's European App No. 18789859.8.
An Office Action dated Feb. 18, 2022, which issued during the prosecution of U.S. Appl. No. 16/608,563.
Notice of Allowance dated Jun. 29, 2022, which issued during the prosecution of U.S. Appl. No. 16/608,563.

\* cited by examiner

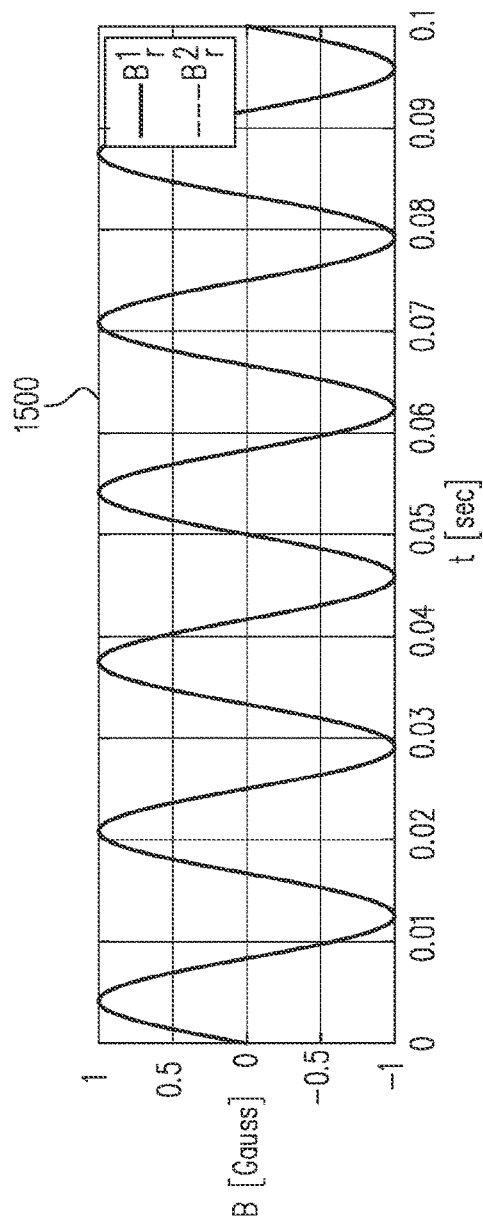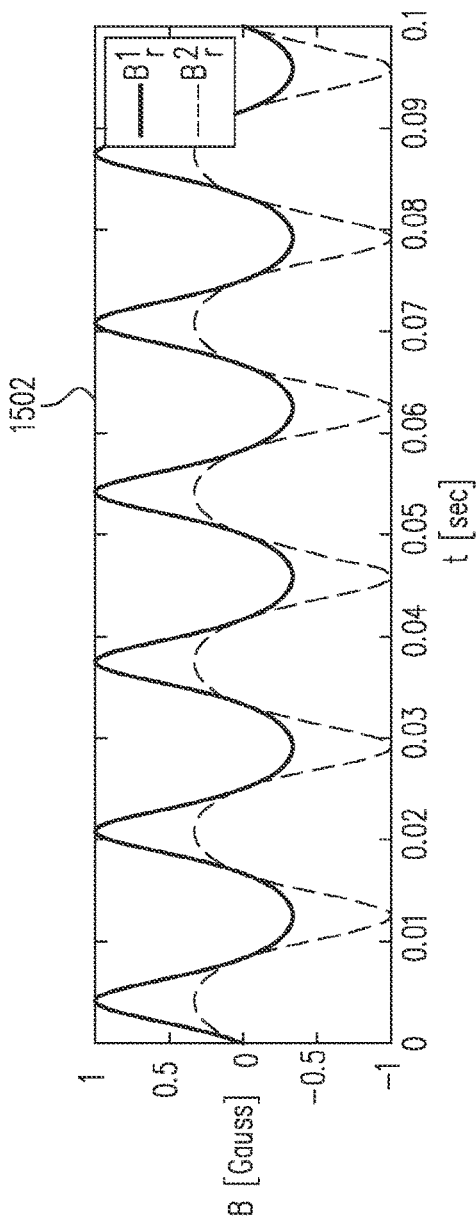
FIG. 15A
FIG. 15B

SYSTEMS AND METHODS FOR MONITORING OF MECHANICAL AND ELECTRICAL MACHINES

RELATED APPLICATIONS

Reference is hereby made to U.S. Provisional Patent Application No. 62/490,108 entitled MAGNETIC ANALYSIS OF ELECTRICAL MOTORS, filed Apr. 26, 2017; to U.S. Provisional Patent Application No. 62/503,984 entitled CONTINUOUS MONITORING AND DIAGNOSIS TOOL FOR MECHANICAL SYSTEMS, filed May 10, 2017; to U.S. Provisional Patent Application No. 62/579,348, entitled AUTOMATED SYSTEMS AND METHODS FOR MONITORING ELECTRICAL MACHINES USING MAGNETIC FIELDS MEASUREMENTS, filed Oct. 31, 2017; and to U.S. Provisional Patent Application No. 62/579,356, entitled AUTOMATED MONITORING AND DIAGNOSIS OF MECHANICAL SYSTEMS, filed Oct. 31, 2017, the disclosures of all of which are hereby incorporated by reference and priorities of all of which are hereby claimed pursuant to 37 CFR 1.78(a)(4) and (5)(i).

Reference is also made to U.S. Pat. No. 9,835,594 entitled AUTOMATIC MECHANICAL SYSTEM DIAGNOSIS, filed Oct. 22, 2012, the disclosure of which is hereby incorporated by reference.

FIELD OF THE INVENTION

The present application relates generally to systems and methods for monitoring machines, including mechanical and electrical machines, and more particularly to the detection of problems in mechanical and electrical machines based on such monitoring.

BACKGROUND OF THE INVENTION

Various types of systems for monitoring mechanical and electrical machines are known in the art.

SUMMARY OF THE INVENTION

The present invention seeks to provide novel systems and methods for monitoring operation of mechanical and electrical machines and for the detection and prediction of problems in such machines based on the monitoring thereof.

There is thus provided in accordance with a preferred embodiment of the present invention a system for continuously monitoring at least one machine including a plurality of magnetic sensors synchronously sensing magnetic fields emitted by at least one machine, the plurality of magnetic sensors sensing the magnetic fields along a corresponding plurality of channels and outputting magnetic field emission signals corresponding to the magnetic fields, a signal analyzer receiving at least a portion of the magnetic field emission signals and performing analysis of the magnetic field emission signals, the signal analyzer providing an output based on the analysis, the output including at least an indication of a condition of the at least one machine and a control module receiving the indication of the condition and initiating at least one of a repair event on the at least one machine, an adjustment to a maintenance schedule of the at least one machine and an adjustment to an operating parameter of the at least one machine based on the indication, whereby efficacy of the at least one machine is improved.

Preferably, the system also includes at least one vibration sensor sensing vibrations arising from the at least one machine and outputting vibration signals corresponding to the vibrations, the sensing of the vibrations being performed synchronously with the sensing of the magnetic fields, the signal analyzer receiving at least a portion of the vibration signals.

Preferably, the analysis includes phase analysis of phases at least of the magnetic field emission signals.

Preferably, the analysis includes machine-learning functionality.

Preferably, the signal analyzer includes at least one data processing module in communication with at least one of the plurality of magnetic sensors and a cloud processing server in communication with the at least one data processing module.

Preferably, the system also includes a low-power consumption sensor having a power uptake of less than or equal to 1 microwatt, for continuously sensing at least one operational parameter of the at least one machine.

Preferably, the low-power consumption sensor is operatively coupled to at least one of the plurality of magnetic sensors for automatically controlling operation of the at least one of the plurality of magnetic sensors based on the operational parameter.

Preferably, the at least one machine includes at least one of an electrical machine and a mechanical machine.

Preferably, the electrical machine includes at least one of a synchronous and asynchronous electrical machine.

Preferably, the electrical machine includes at least one of a motor and a generator.

There is also provided in accordance with another preferred embodiment of the present invention a system for continuously monitoring at least one machine including at least one magnetic sensor sensing magnetic field emission arising from at least one machine and outputting magnetic field emission signals corresponding to the magnetic field emission, at least one vibration sensor sensing vibrations arising from the at least one machine and outputting vibration signals corresponding to the vibrations, the sensing of the vibrations being performed synchronously with the sensing of the magnetic field emission, a signal analyzer receiving at least a portion of the magnetic field emission signals and the vibration signals and performing analysis of the magnetic field emission signals with respect to the vibration signals, the signal analyzer providing an output based on the analysis, the output including at least an indication of a condition of the at least one machine and a control module receiving the indication of the condition and initiating at least one of a repair event on the at least one machine, an adjustment to a maintenance schedule of the at least one machine and an adjustment to an operating parameter of the at least one machine based on the indication, whereby efficacy of the at least one machine is improved.

Preferably, the analysis includes phase analysis of phases of the magnetic field emission signals and the vibration signals.

Preferably, the analysis includes machine-learning functionality.

Preferably, the signal analyzer includes at least one data processing module in communication with the at least one magnetic sensor and vibration sensor and a cloud processing server in communication with the at least one data processing module.

Preferably, the system also includes a low-power consumption sensor having a power uptake of less than or equal to 1 microwatt, for continuously sensing at least one operational parameter of the at least one machine.

Preferably, the low-power consumption sensor is operatively coupled to the at least one magnetic sensor and vibration sensor for automatically controlling operation thereof based on the operational parameter.

Preferably, the automatically controlling includes adjusting a sampling periodicity of at least one of the magnetic and vibration sensor.

Preferably, the at least one machine includes at least one of an electrical machine and a mechanical machine.

Preferably, the electrical machine includes at least one of a synchronous and asynchronous electrical machine.

Preferably, the electrical machine includes at least one of a motor and a generator.

There is further provided in accordance with an additional preferred embodiment of the present invention a system for continuously monitoring at least one machine including a low-power sensor having a power uptake of less than or equal to 1 microwatt at least near continuously monitoring an operating parameter of at least one machine and outputting signals corresponding to the operating parameter, a signal analyzer receiving at least a portion of the signals and providing an output indication of a condition of the at least one machine based on analysis of the signals and at least one additional sensor cooperatively coupled to the low-power sensor, operation of the at least one additional sensor being initiated based on the condition.

Preferably, the low-power sensor includes a vibration sensor and the operating parameter includes vibrations.

Preferably, the condition includes an on condition or an off condition.

Additionally or alternatively, the condition includes a properly operating or improperly operating condition.

Preferably, the improperly operating condition includes one of an actual or impending faulty condition.

Preferably, the additional sensor includes a sensor having a power uptake greater than the power uptake of the low-power sensor.

Preferably, the additional sensor includes at least one operating parameter sensor for sensing at least one additional operating parameter of the machine.

Preferably, the additional operating parameter is not the same operating parameter as the operating parameter sensed by the low-power sensor.

Preferably, the additional sensor includes at least one of a magnetic sensor and a vibration sensor.

Preferably, the additional sensor includes at least one magnetic sensor and at least one vibration sensor operating mutually synchronously.

There is still further provided in accordance with another preferred embodiment of the present invention a system for continuously monitoring at least one machine including a low-power sensor at least near continuously monitoring an operating parameter of at least one machine and outputting signals corresponding to the operating parameter, a signal analyzer receiving at least a portion of the signals and providing an indication of exceedance by the signals of a predetermined threshold and at least one high-power sensor having a power uptake greater than a power uptake of the low-power sensor and cooperatively coupled to the low-power sensor, operation of the at least one high-power sensor being initiated based on the indication of exceedance of the predetermined threshold.

Preferably, the low-power sensor includes a vibration sensor and the operating parameter includes vibrations.

Preferably, the high-power sensor includes at least one of a magnetic sensor and a vibration sensor.

Preferably, the high-power sensor includes at least one magnetic sensor and at least one vibration sensor operating mutually synchronously.

Preferably, the signal analyzer includes a CPU coupled to the low-power sensor.

Preferably, the system also includes circuitry connecting the CPU to the at least one high-power sensor for initiating operation of the at least one high-power sensor.

Preferably, the signal analyzer includes a cloud-based signal analyzer.

Preferably, the predetermined threshold is set based on machine learning.

Preferably, the low-power sensor has a power uptake of less than or equal to one microwatt.

Preferably, the low-power sensor monitors the operating parameter at a sampling rate of at least six times per second.

There is yet further provided in accordance with still another preferred embodiment of the present invention a system for continuously monitoring at least one machine including at least one sensor monitoring at least one operational parameter of at least one machine with a sampling periodicity and providing at least one output signal corresponding to the at least one operational parameter, a signal analyzer receiving at least a portion of the at least one output signal and performing analysis of the at least one output signal, the signal analyzer providing an output indication of at least one of a condition of the at least one machine and a condition of the at least one sensor based on the analysis and a control module receiving the output indication and adjusting the sampling periodicity in at least near real time based thereon.

Preferably, the condition of the machine includes an on condition or an off condition.

Additionally or alternatively, the condition of the machine includes a properly operating or improperly operating condition.

Additionally or alternatively, the condition of the machine includes one of an actual or impending faulty condition.

Preferably, the condition of the at least one sensor includes a measure of remaining useful life (RUL) of the sensor.

Preferably, the RUL of the sensor includes a measure of remaining battery life of the sensor.

Preferably, the signal analyzer includes a CPU coupled to the sensor.

Additionally or alternatively, the signal analyzer includes a cloud-based signal analyzer.

Preferably, the analysis includes machine-learning functionality.

Preferably, the analysis takes into account a maintenance schedule of the at least one machine.

There is also provided in accordance with yet another preferred embodiment of the present invention a system for maintenance of at least one electrical machine having at least one shared characteristic with a plurality of electrical machines, the system including, a plurality of magnetic sensors coupled to a corresponding plurality of electrical machines having at least one shared characteristic for sensing magnetic fields generated thereby, the plurality of magnetic sensors providing output indications of the magnetic fields of the corresponding plurality of electrical machines, correlating functionality receiving the output indications of the magnetic fields of the corresponding plurality of electrical machines and providing a correlation output indication of a correlation between the magnetic fields and past failures of corresponding ones of the plurality of electrical machines, at least one magnetic sensor associated with a given electrical machine having the at least one shared characteristic for providing an individual output indication of magnetic fields generated by the given electrical machine, predicting functionality receiving the correlation output indication and the individual output indication and providing a predictive output indication at least of time to failure of the given electrical machine, based on applying the correlation output indication to the individual output indication and a notification module providing a human-sensible notification including at least the predictive output indication, at least one of control, repair or maintenance activities being performed upon the given electrical machine in accordance with the notification.

Preferably, the electrical machine includes at least one of a synchronous and asynchronous electrical machine.

Preferably, the given electrical machine includes an electrical generator.

Preferably, the given electrical machine includes an electrical motor.

Preferably, the given electrical machine includes at least one of an AC or DC electrical machine.

Preferably, the correlating functionality and the predicting functionality include machine learning functionality.

Preferably, the shared characteristic includes at least one of a shared mechanical characteristic, shared electrical characteristic, shared environmental characteristic and shared performance characteristic.

Preferably, the plurality of electrical machines includes the given electrical machine.

Alternatively, the plurality of electrical machines does not include the given electrical machine.

Preferably, the predictive output indication includes an indication of an impending fault, the impending fault including at least one of a crawling fault, eccentricity, a damaged rotor bar, a stator short, electrical discharge, mechanical imbalance, energy loss, negative phase sequence and faults arising from extremum operating conditions.

There is further provided in accordance with another preferred embodiment of the present invention a system for automatically alleviating problematic conditions in electrical machines due to hacking, the system including a plurality of magnetic field sensors associated with a plurality of electrical machines having at least one shared characteristic, the plurality of magnetic field sensors providing historical output indications of magnetic fields generated by the plurality of electrical machines, a correlator for correlating the magnetic fields generated by ones of the plurality of electrical machines to at least one operational parameter in ones of the plurality of electrical machines and providing a correlation output indication, a magnetic field sensor associated with a given electrical machine having the at least one shared characteristic for providing an individual output indication of magnetic fields generated by the given electrical machine and a control output generator operative to receive the correlation output indication and the individual output indication for providing a hacking responsive control output to the given electrical machine based on a dissimilarity between the correlation output indication and at least one of the individual output indication and the at least one operational parameter of the given electrical machine.

Preferably, the given electrical machine includes at least one of a synchronous and asynchronous electrical machine.

Preferably, the given electrical machine includes an electrical generator.

Alternatively, the given electrical machine includes an electrical motor.

Preferably, the given electrical machine includes at least one of an AC or DC electrical machine.

Preferably, the correlating functionality and the predicting functionality include machine learning functionality.

Preferably, the shared characteristic includes at least one of a shared mechanical characteristic, shared electrical characteristic, shared environmental characteristic and shared performance characteristic.

Preferably, the plurality of electrical machines includes the given electrical machine.

Alternatively, the plurality of electrical machines does not include the given electrical machine.

Preferably, the predictive output indication includes an indication of an impending fault, the impending fault including at least one of a crawling fault, eccentricity, a damaged rotor bar, a stator short, electrical discharge, mechanical imbalance, energy loss, negative phase sequence and faults arising from extremum operating conditions.

There is also provided in accordance with another preferred embodiment of the present invention a system for identifying potential failures and providing pre-failure alerts for at least one machine having at least one shared feature with a plurality of machines, the system including a plurality of operational parameter sensing modules associated with a plurality of machines having at least one common feature, the plurality of operational parameter sensing modules providing historical output indications of at least changes over time in at least one operational parameter of each of the plurality of machines, a correlator operative to correlate patterns of changes in the at least one operational parameter in ones of the plurality of machines to past failures in corresponding ones of the plurality of machines and to provide a correlation output indication, an operational parameter sensing module associated with a given machine having the at least one common feature for providing an individual output indication of at least a change over time in the at least one operational parameter of the given machine, a predictor operative to receive the correlation output indication and the individual output indication for providing a predictive output indication of an impending failure in the given machine, based on a similarity between the change over time in the at least one operational parameter of the given machine indicated by the individual output indication and the patterns of changes over time in the at least one operational parameter in the plurality of machines indicated by the historical output indications and a notification module providing a notification of a status of the given machine based on the predictive output indication, at least one of control, repair or maintenance activities being performed upon the given machine in accordance with the notification.

Preferably, the system also includes an audio playback module operative to playback an audio signal having at least one characteristic corresponding to the predictive output indication of an impending failure.

Preferably, the audio playback module is operative to selectively enhance the at least one characteristic of the audio signal corresponding to the predictive output indication.

Preferably, the plurality of machines includes at least one of electrical machines and mechanical machines.

Preferably, the given machine includes an electrical motor.

Alternatively, the given machine includes a generator.

Preferably, the common feature includes at least one of a common mechanical feature, common electrical feature, common environmental feature and common performance feature.

Preferably, the operational parameter includes vibration.

Additionally or alternatively, the operational parameter includes magnetic fields.

Preferably, the operational parameter includes synchronously sensed magnetic fields and vibrations.

There is additionally provided in accordance with another preferred embodiment of the present invention a system for optimizing operation of machines, the system including a plurality of operational parameter sensing modules associated with a plurality of machines having at least one common feature, the plurality of operational parameter sensing modules providing historical output indications of at least one operational parameter of each of the plurality of machines over time, a correlator operative to correlate the at least one operational parameter in ones of the plurality of machines to at least one optimization metric of corresponding ones of the plurality of machines and providing a correlator output, an operational parameter sensing module associated with a given machine having the at least one common feature for providing an individual output indication of the at least one operational parameter of the given machine and a control output generator operative to receive the correlator output and the individual output indication, for providing a control output useful for enabling the given machine to operate in accordance with an operational parameter which is correlated by the correlator output to a desired optimization metric.

Preferably, the plurality of machines includes at least one of electrical machines and mechanical machines.

Preferably, the given machine includes an electrical motor.

Alternatively, the given machine includes a generator.

Preferably, the common feature includes at least one of a common mechanical feature, common electrical feature, common environmental feature and common performance feature.

Preferably, the operational parameter includes vibration.

Additionally or alternatively, the operational parameter includes magnetic fields.

Preferably, the operational parameter includes synchronously sensed magnetic fields and vibrations.

Preferably, the optimization metric includes at least one of machine efficiency, machine power consumption and machine vibration levels.

Preferably, the at least one optimization metric is obtained from an external source.

There is also provided in accordance with another preferred embodiment of the present invention q system for automatically alleviating problematic conditions in machine systems, the system including at least one operational parameter sensing module providing historical output indications of at least one operational parameter of at least one component in a machine system, a correlator for correlating the historical output indications of the at least one operational parameter to historical indications of at least one parameter associated with at least one other component in the machine system and providing a correlation output indication, an individual operational parameter sensing module associated with a given component in a given machine system, the given component having at least one feature in common with the at least one component, for providing an individual output indication of the at least one operational parameter of the given component and a control output generator operative to receive the correlation output indication and the individual output indication, for applying the correlation output indication to the individual output indication and deriving the at least one parameter associated with at least one other given component in the given system having at least one feature in common with the at least one other component, and providing a control output to the given system based on the at least one parameter derived.

Preferably, the component in the machine system is an electrical device.

Additionally or alternatively, the component in the machine system is a mechanical device.

Preferably, the common feature includes at least one of a common mechanical feature, common electrical feature, common environmental feature and common performance feature.

Preferably, the operational parameter includes vibration.

Additionally or alternatively, the operational parameter includes magnetic fields.

Preferably, the operational parameter includes synchronously sensed magnetic fields and vibrations.

Preferably, the operating parameters of the other given component are not directly sensed.

Preferably, the given component is cooperatively coupled to the other given component in the machine system.

Preferably, the given component is a pump and the other given component is a chiller.

There is also provided in accordance with another preferred embodiment of the present invention a system for automatically sensing problematic conditions in machine systems due to malicious intervention therewith, the system including a plurality of operational parameter sensing modules associated with a plurality of machine systems having at least one common feature, the plurality of operational parameter sensing modules providing historical output indications of at least one operational parameter of each of the plurality of machine systems, a correlator operative to correlate the at least one operational parameter in ones of the plurality of machine systems to at least one other parameter in ones of the plurality of machine systems and to provide a correlation output indication, a parameter sensing module associated with a given machine system having the at least one common feature for providing an individual output indication of at least one of the operational parameter and the other parameter of the given machine system and an anomaly alert generator operative to receive the correlation output indication and the individual output indication for providing an anomaly alert based on a dissimilarity between at least one of the operational parameter and the other parameter of the given machine indicated by the individual output indication and at least one of the operational parameter and the other parameter indicated by the historical output indications.

Preferably, the plurality of machine systems includes at least one of electrical machine systems and mechanical machine systems.

Preferably, the given machine system includes an electrical motor.

Additionally or alternatively, the given machine system includes a generator.

Preferably, the common feature includes at least one of a common mechanical feature, common electrical feature, common environmental feature and common performance feature.

Preferably, the operational parameter includes vibration.

Additionally or alternatively, the operational parameter includes magnetic fields.

Preferably, the operational parameter includes synchronously sensed magnetic fields and vibrations.

There is also provided in accordance with still another preferred embodiment of the present invention a system for identifying potential failures and providing pre-failure alerts for at least one machine having at least one shared feature with a plurality of machines, the system including a plurality of magnetic field sensing modules at least near continuously sensing magnetic fields arising from a plurality of machines having at least one common feature, the plurality of magnetic field sensing modules providing historical output indications of at least changes over time in a magnetic fields of each of the plurality of machines, a correlator operative to correlate patterns of changes in the magnetic fields in ones of the plurality of machines to past failures in corresponding ones of the plurality of machines and to provide a correlation output indication, a plurality of magnetic field sensors associated with a given machine having the at least one common feature for synchronously providing a plurality of individual output indications of at least a change over time in the magnetic fields of the given machine, a predictor operative to receive the correlation output indication and the plurality of individual output indications for providing a predictive output indication of an impending failure in the given machine, based on a similarity between the change over time in the magnetic fields of the given machine indicated by the plurality of individual output indications and the patterns of changes over time in the magnetic fields in the plurality of machines indicated by the historical output indications and a notification module providing a notification of a status of the given machine based on the predictive output indication, at least one of control, repair or maintenance activities being performed upon the given machine in accordance with the notification.

There is further provided in accordance with an additional preferred embodiment of the present invention a system for identifying potential failures and providing pre-failure alerts for at least one machine having at least one shared feature with a plurality of machines, the system including a plurality of vibration sensing modules at least near continuously sensing vibrations arising from a plurality of machines having at least one common feature, the plurality of vibration sensing modules providing historical output indications of at least changes over time in vibrations of each of the plurality of machines, a plurality of magnetic field sensing modules at least near continuously sensing magnetic fields arising from the plurality of machines having the at least one common feature, the sensing of the magnetic fields being performed synchronously with the sensing of the vibrations, the plurality of magnetic field sensing modules providing historical output indications of at least changes over time in the magnetic fields of each of the plurality of machines, a correlator operative to correlate patterns of changes in the vibrations with respect to the magnetic fields in ones of the plurality of machines to past failures in corresponding ones of the plurality of machines and to provide a correlation output indication, at least one magnetic field sensor associated with a given machine having the at least one common feature for near continuously providing at least one individual output indication of at least a change over time in the magnetic fields of the given machine, at least one vibration sensor associated with the given machine for near continuously providing, synchronously with the near continuously providing by the at least one magnetic field sensor, at least one individual output indication of at least a change over time in the vibrations of the given machine, a predictor operative to receive the correlation output indication and the indications of changes over time of the magnetic fields and vibrations, for providing a predictive output indication of an impending failure in the given machine, based on a similarity between the changes over time in the magnetic fields and vibrations of the given machine and the patterns of changes over time in the magnetic fields and vibrations in the plurality of machines indicated by the historical output indications and a notification module providing a notification of a status of the given machine based on the predictive output indication, at least one of control, repair or maintenance activities being performed upon the given machine in accordance with the notification.

There is also provided in accordance with another preferred embodiment of the present invention a system for optimizing operation of machines, the system including a plurality of magnetic sensor modules associated with a plurality of machines having at least one common feature, each of the plurality of magnetic sensor modules synchronously sensing magnetic fields along at least two signal channels and providing historical output indications of magnetic fields along the at least two signal channels arising from each of the plurality of machines over time, a correlator operative to correlate the historical output indications of the magnetic fields in ones of the plurality of machines to at least one optimization metric of corresponding ones of the plurality of machines and to provide a correlator output, a magnetic sensor module associated with a given machine having the at least one common feature for providing an individual output indication of magnetic fields arising from the given machine, the magnetic sensor module synchronously sensing magnetic fields along at least two signal channels and a control output generator operative to receive the correlator output and the individual output indication, for providing a control output useful for enabling the given machine to operate in accordance with an operational parameter which is correlated by the correlator output to a desired optimization metric.

There is additionally provided in accordance with another preferred embodiment of the present invention a method for continuously monitoring at least one machine including continuously synchronously sensing magnetic fields emitted by at least one machine along a plurality of channels and outputting magnetic field emission signals corresponding to the magnetic fields, receiving at least a portion of the magnetic field emission signals, performing analysis of the magnetic field emission signals and providing an output based on the analysis, the output including at least an indication of a condition of the at least one machine and receiving the indication of the condition and initiating at least one of a repair event on the at least one machine, an adjustment to a maintenance schedule of the at least one machine and an adjustment to an operating parameter of the at least one machine based on the indication, whereby efficacy of the at least one machine is improved.

Preferably, the method also includes sensing vibrations arising from the at least one machine and outputting vibration signals corresponding to the vibrations, the sensing of the vibrations being performed synchronously with the sensing of the magnetic fields.

Preferably, the analysis includes phase analysis of phases at least of the magnetic field emission signals.

Preferably, the analysis includes machine-learning functionality.

Preferably, the analysis is performed by at least one data processing module and a cloud processing server in communication with the at least one data processing module.

Preferably, the method also includes continuously sensing at least one operational parameter of the at least one machine by a low-power consumption sensor having a power uptake of less than or equal to 1 microwatt.

Preferably, the low-power consumption sensor is operatively coupled to at least one magnetic sensor for automatically controlling operation of the at least one magnetic sensor based on the operational parameter.

Preferably, the at least one machine includes at least one of an electrical machine and a mechanical machine.

Preferably, the electrical machine includes at least one of a synchronous and asynchronous electrical machine.

Preferably, the electrical machine includes at least one of a motor and a generator.

There is further provided in accordance with another preferred embodiment of the present invention a method for continuously monitoring at least one machine including sensing magnetic field emission arising from at least one machine and outputting magnetic field emission signals corresponding to the magnetic field emission, sensing vibrations arising from the at least one machine and outputting vibration signals corresponding to the vibrations, the sensing of the vibrations being performed synchronously with the sensing of the magnetic field emission, receiving at least a portion of the magnetic field emission signals and the vibration signals and performing analysis of the magnetic field emission signals with respect to the vibration signals, and providing an output based on the analysis, the output including at least an indication of a condition of the at least one machine and receiving the indication of the condition and initiating at least one of a repair event on the at least one machine, an adjustment to a maintenance schedule of the at least one machine and an adjustment to an operating parameter of the at least one machine based on the indication, whereby efficacy of the at least one machine is improved.

Preferably, the analysis includes phase analysis of phases of the magnetic field emission signals and the vibration signals.

Preferably, the analysis includes machine-learning functionality.

Preferably, the analysis is performed by at least one data processing module and a cloud processing server in communication with the at least one data processing module.

Preferably, the method also includes continuously sensing at least one operational parameter of the at least one machine by a low-power consumption sensor having a power uptake of less than or equal to 1 microwatt.

Preferably, the low-power consumption sensor is operatively coupled to at least one magnetic sensor and vibration sensor for automatically controlling operation thereof based on the operational parameter.

Preferably, the automatically controlling includes adjusting a sampling periodicity of at least one of the magnetic and vibration sensor.

Preferably, the at least one machine includes at least one of an electrical machine and a mechanical machine.

Preferably, the electrical machine includes at least one of a synchronous and asynchronous electrical machine.

Preferably, the electrical machine includes at east one of a motor and a generator.

There is also provided in accordance with another preferred embodiment of the present invention a method for continuously monitoring at least one machine including at least near continuously monitoring an operating parameter of at least one machine by a low-power sensor having a power uptake of less than or equal to microwatt and outputting signals corresponding to the operating parameter, receiving at least a portion of the signals and providing an output indication of a condition of the at least one machine based on analysis of the signals and initiating operation of at least one additional sensor cooperatively coupled to the low-power sensor, based on the condition.

Preferably, the low-power sensor includes a vibration sensor and the operating parameter includes vibrations.

Preferably, the condition includes an on condition or an off condition.

Additionally or alternatively, the condition includes a properly operating or improperly operating condition.

Preferably, the improperly operating condition includes one of an actual or impending faulty condition.

Preferably, the additional sensor includes a sensor having a power uptake greater than the power uptake of the low-power sensor.

Preferably, the additional sensor includes at least one operating parameter sensor for sensing at least one additional operating parameter of the machine.

Preferably, the additional operating parameter is not the same operating parameter as the operating parameter sensed by the low-power sensor.

Preferably, the additional sensor includes at least one of a magnetic sensor and a vibration sensor.

Preferably, the additional sensor includes at least one magnetic sensor and at least one vibration sensor operating mutually synchronously.

There is also provided in accordance with yet another preferred embodiment of the present invention a method for continuously monitoring at least one machine including at least near continuously monitoring by a low-power sensor an operating parameter of at least one machine and outputting signals corresponding to the operating parameter receiving at least a portion of the signals and providing an indication of exceedance by the signals of a predetermined threshold and initiating operation of at least one high-power sensor having a power uptake greater than a power uptake of the low-power sensor and cooperatively coupled to the low-power sensor, based on the indication of exceedance of the predetermined threshold.

Preferably, the low-power sensor includes a vibration sensor and the operating parameter includes vibrations.

Preferably, the high-power sensor includes at least one of a magnetic sensor and a vibration sensor.

Preferably, the high-power sensor includes at least one magnetic sensor and at least one vibration sensor operating mutually synchronously.

Preferably, the receiving and providing is performed by a CPU coupled to the low-power sensor.

Preferably, the method also includes connecting the CPU to the at least one high-power sensor for initiating operation of the at least one high-power sensor.

Preferably, the receiving and providing is performed by a cloud-based signal analyzer.

Preferably, the predetermined threshold is set based on machine learning.

Preferably, the low-power sensor has a power uptake of less than or equal to one microwatt.

Preferably, the low-power sensor monitors the operating parameter at a sampling rate of at least six times per second.

There is also provided in accordance with a still further preferred embodiment of the present invention a method for continuously monitoring at least one machine including monitoring at least one operational parameter of at least one machine by at least one sensor with a sampling periodicity and providing at least one output signal corresponding to the at least one operational parameter, receiving at least a portion of the at least one output signal and performing analysis of the at least one output signal, and providing an output indication of at least one of a condition of the at least one machine and a condition of the at least one sensor based on the analysis and receiving the output indication and adjusting the sampling periodicity in at least near real time based thereon.

Preferably, the condition of the machine includes an on condition or an off condition.

Preferably, the condition of the machine includes a properly operating or improperly operating condition.

Preferably, the condition of the machine includes one of an actual or impending faulty condition.

Preferably, the condition of the at least one sensor includes a measure of remaining useful life (RUL) of the sensor.

Preferably, the RUL of the sensor includes a measure of remaining battery life of the sensor.

Preferably, the analysis is performed by a CPU coupled to the sensor.

Preferably, the analysis is performed by a cloud-based signal analyzer.

Preferably, the analysis includes machine-learning functionality.

Preferably, the analysis takes into account a maintenance schedule of the at least one machine.

There is also provided in accordance with yet another preferred embodiment of the present invention a method for maintenance of at least one electrical machine having at least one shared characteristic with a plurality of electrical machines, the method including coupling a plurality of magnetic sensors to a corresponding plurality of electrical machines having at least one shared characteristic for sensing magnetic fields generated thereby, the plurality of magnetic sensors providing output indications of the magnetic fields of the corresponding plurality of electrical machines, receiving the output indications of the magnetic fields and providing a correlation output indication of a correlation between the magnetic fields and past failures of corresponding ones of the plurality of electrical machines, coupling at least one magnetic sensor to a given electrical machine having the at least one shared characteristic for providing an individual output indication of magnetic fields generated by the given electrical machine, receiving the correlation output indication and the individual output indication and providing a predictive output indication at least of time to failure of the given electrical machine, based on applying the correlation output indication to the individual output indication and providing a human-sensible notification including at least the predictive output indication, at least one of control, repair or maintenance activities being performed upon the given electrical machine in accordance with the notification.

Preferably, the given electrical machine includes at least one of a synchronous and asynchronous electrical machine.

Preferably, given electrical machine includes an electrical generator.

Preferably, the given electrical machine includes an electrical motor.

Preferably, the given electrical machine includes at least one of an AC or DC electrical machine.

Preferably, the providing the correlation output indication and the predictive output indication includes machine learning functionality.

Preferably, the shared characteristic includes at least one of a shared mechanical characteristic, shared electrical characteristic, shared environmental characteristic and shared performance characteristic.

Preferably, the plurality of electrical machines includes the given electrical machine.

Alternatively, the plurality of electrical machines does not include the given electrical machine.

Preferably, the predictive output indication includes an indication of an impending fault, the impending fault including at least one of a crawling fault, eccentricity, a damaged rotor bar, a stator short, electrical discharge, mechanical imbalance, energy loss, negative phase sequence and faults arising from extremum operating conditions.

There is also provided in accordance with another preferred embodiment of the present invention a method for automatically alleviating problematic conditions in electrical machines due to hacking, the method including associating a plurality of magnetic field sensors with a plurality of electrical machines having at least one shared characteristic, the plurality of magnetic field sensors providing historical output indications of magnetic fields generated by the plurality of electrical machines, correlating the magnetic fields generated by ones of the plurality of electrical machines to at least one operational parameter in ones of the plurality of electrical machines and providing a correlation output indication, associating a magnetic field sensor with a given electrical machine having the at least one shared characteristic for providing an individual output indication of magnetic fields generated by the given electrical machine and receiving the correlation output indication and the individual output indication and providing a hacking responsive control output to the given electrical machine based on a dissimilarity between the correlation output indication and at least one of the individual output indication and the at least one operational parameter of the given electrical machine.

Preferably, the given electrical machine includes at least one of a synchronous and asynchronous electrical machine.

Preferably, the given electrical machine includes an electrical generator.

Preferably, the given electrical machine includes an electrical motor.

Preferably, the given electrical machine includes at least one of an AC or DC electrical machine.

Preferably, the correlating includes machine learning functionality.

Preferably, the shared characteristic includes at least one of a shared mechanical characteristic, shared electrical characteristic, shared environmental characteristic and shared performance characteristic.

Preferably, the plurality of electrical machines includes the given electrical machine.

Alternatively, the plurality of electrical machines does not include the given electrical machine.

Preferably, the predictive output indication includes an indication of an impending fault, the impending fault including at least one of a crawling fault, eccentricity, a damaged rotor bar, a stator short, electrical discharge, mechanical imbalance, energy loss, negative phase sequence and faults arising from extremum operating conditions.

There is also provided in accordance with another preferred embodiment of the present invention a method for identifying potential failures and providing pre-failure alerts for at least one machine having at least one shared feature with a plurality of machines, the method including associating a plurality of operational parameter sensing modules with a plurality of machines having at least one common feature, the plurality of operational parameter sensing modules providing historical output indications of at least changes over time in at least one operational parameter of each of the plurality of machines, correlating patterns of changes in the at least one operational parameter in ones of the plurality of machines to past failures in corresponding ones of the plurality of machines and providing a correlation output indication, associating an operational parameter sensing module with a given machine having the at least one common feature for providing an individual output indication of at least a change over time in the at least one operational parameter of the given machine, receiving the correlation output indication and the individual output indication and providing a predictive output indication of an impending failure in the given machine, based on a similarity between the change over time in the at least one operational parameter of the given machine indicated by the individual output indication and the patterns of changes over time in the at least one operational parameter in the plurality of machines indicated by the historical output indications, and providing a notification of a status of the given machine based on the predictive output indication, at least one of control, repair or maintenance activities being performed upon the given machine in accordance with the notification.

Preferably, the method also includes playing back an audio signal having at least one characteristic corresponding to the predictive output indication of an impending failure.

Preferably, the playing back includes selectively enhancing the at least one characteristic of the audio signal corresponding to the predictive output indication.

Preferably, the plurality of machines includes at least one of electrical machines and mechanical machines.

Preferably, the given machine includes an electrical motor.

Preferably, the given machine includes a generator.

Preferably, the common feature includes at least one of a common mechanical feature, common electrical feature, common environmental feature and common performance feature.

Preferably, the operational parameter includes vibration.

Additionally or alternatively, the operational parameter includes magnetic fields.

Preferably, the operational parameter includes synchronously sensed magnetic fields and vibrations.

There is also provided in accordance with another preferred embodiment of the present invention a method for optimizing operation of machines, the method including associating a plurality of operational parameter sensing modules with a plurality of machines having at least one common feature, the plurality of operational parameter sensing modules providing historical output indications of at least one operational parameter of each of the plurality of machines over time, correlating the at least one operational parameter in ones of the plurality of machines to at least one optimization metric of corresponding ones of the plurality of machines and providing a correlator output, associating an operational parameter sensing module with a given machine having the at least one common feature for providing an individual output indication of the at least one operational parameter of the given machine and receiving the correlator output and the individual output indication and providing a control output useful for enabling the given machine to operate in accordance with an operational parameter which is correlated by the correlator output to a desired optimization metric.

Preferably, the plurality of machines includes at least one of electrical machines and mechanical machines.

Preferably, the given machine includes an electrical motor.

Alternatively, the given machine includes a generator.

Preferably, the common feature includes at least one of a common mechanical feature, common electrical feature, common environmental feature and common performance feature.

Preferably, the operational parameter includes vibration.

Additionally or alternatively, the operational parameter includes magnetic fields.

Preferably, the operational parameter includes synchronously sensed magnetic fields and vibrations.

Preferably, the optimization metric includes at least one of machine efficiency, machine power consumption and machine vibration levels.

Preferably, the at least one optimization metric is obtained from an external source.

There is also provided in accordance with another preferred embodiment of the present invention a method for automatically alleviating problematic conditions in machine systems, the method including providing historical output indications by at least one operational parameter sensing module of at least one operational parameter of at least one component in a machine system, correlating the historical output indications of the at least one operational parameter to historical indications of at least one parameter associated with at least one other component in the machine system and providing a correlation output indication, associating an individual operational parameter sensing module with a given component in a given machine system, the given component having at least one feature in common with the at least one component, for providing an individual output indication of the at least one operational parameter of the given component and receiving the correlation output indication and the individual output indication, applying the correlation output indication to the individual output indication and deriving the at least one parameter associated with at least one other given component in the given system having at least one feature in common with the at least one other component, and providing a control output to the given system based on the at least one parameter derived.

Preferably, the component in the machine system is an electrical device.

Additionally or alternatively, the component in the machine system is a mechanical device.

Preferably, the common feature includes at least one of a common mechanical feature, common electrical feature, common environmental feature and common performance feature.

Preferably, the operational parameter includes vibration.

Additionally or alternatively, the operational parameter includes magnetic fields.

Preferably, the operational parameter includes synchronously sensed magnetic fields and vibrations.

Preferably, the operating parameters of the other given component are not directly sensed.

Preferably, the given component is cooperatively coupled to the other given component in the machine system.

Preferably, the given component is a pump and the other given component is a chiller.

There is also provided in accordance with another preferred embodiment of the present invention a method for automatically sensing problematic conditions in machine systems due to malicious intervention therewith, the method including associating a plurality of operational parameter sensing modules with a plurality of machine systems having at least one common feature, the plurality of operational parameter sensing modules providing historical output indications of at least one operational parameter of each of the plurality of machine systems, correlating the at least one operational parameter in ones of the plurality of machine systems to at least one other parameter in ones of the plurality of machine systems and providing a correlation output indication, associating a parameter sensing module with a given machine system having the at least one common feature for providing an individual output indication of at least one of the operational parameter and the other parameter of the given machine system and receiving the correlation output indication and the individual output indication and providing an anomaly alert based on a dissimilarity between at least one of the operational parameter and the other parameter of the given machine indicated by the individual output indication and at least one of the operational parameter and the other parameter indicated by the historical output indications.

Preferably, the plurality of machine systems includes at least one of electrical machine systems and mechanical machine systems.

Preferably, the given machine system includes an electrical motor.

Additionally or alternatively, the given machine system includes a generator.

Preferably, the common feature includes at least one of a common mechanical feature, common electrical feature, common environmental feature and common performance feature.

Preferably, the operational parameter includes vibration.

Additionally or alternatively, the operational parameter includes magnetic fields.

Preferably, the operational parameter includes synchronously sensed magnetic fields and vibrations.

There is also provided in accordance with another preferred embodiment of the present invention a method for identifying potential failures and providing pre-failure alerts for at least one machine having at least one shared feature with a plurality of machines, the method including at least near continuously sensing, by a plurality of magnetic field sensing modules, magnetic fields arising from a plurality of machines having at least one common feature, the plurality of magnetic field sensing modules providing historical output indications of at least changes over time in a magnetic fields of each of the plurality of machines, correlating patterns of changes in the magnetic fields in ones of the plurality of machines to past failures in corresponding ones of the plurality of machines and to provide a correlation output indication, associating a plurality of magnetic field sensors with a given machine having the at least one common feature for synchronously providing a plurality of individual output indications of at least a change over time in the magnetic fields of the given machine, receiving the correlation output indication and the plurality of individual output indications and providing a predictive output indication of an impending failure in the given machine, based on a similarity between the change over time in the magnetic fields of the given machine indicated by the plurality of individual output indications and the patterns of changes over time in the magnetic fields in the plurality of machines indicated by the historical output indications and providing a notification of a status of the given machine based on the predictive output indication, at least one of control, repair or maintenance activities being performed upon the given machine in accordance with the notification.

There is additionally provided in accordance with another preferred embodiment of the present invention a method for identifying potential failures and providing pre-failure alerts for at least one machine having at least one shared feature with a plurality of machines, the method including at least near continuously sensing, by a plurality of vibration sensing modules, vibrations arising from a plurality of machines having at least one common feature, the plurality of vibration sensing modules providing historical output indications of at least changes over time in vibrations of each of the plurality of machines, at least near continuously sensing, by a plurality of magnetic field sensing modules, magnetic fields arising from the plurality of machines having the at least one common feature, the sensing of the magnetic fields being performed synchronously with the sensing of the vibrations, the plurality of magnetic field sensing modules providing historical output indications of at least changes over time in the magnetic fields of each of the plurality of machines, correlating patterns of changes in the vibrations with respect to the magnetic fields in ones of the plurality of machines to past failures in corresponding ones of the plurality of machines and providing a correlation output indication, associating at least one magnetic field sensor with a given machine having the at least one common feature for near continuously providing at least one individual output indication of at least a change over time in the magnetic fields of the given machine, associating at least one vibration sensor with the given machine for near continuously providing, synchronously with the near continuously providing by the at least one magnetic field sensor, at least one individual output indication of at least a change over time in the vibrations of the given machine, receiving the correlation output indication and the indications of changes over time of the magnetic fields and vibrations and providing a predictive output indication of an impending failure in the given machine, based on a similarity between the changes over time in the magnetic fields and vibrations of the given machine and the patterns of changes over time in the magnetic fields and vibrations in the plurality of machines indicated by the historical output indications and providing a notification of a status of the given machine based on the predictive output indication, at least one of control, repair or maintenance activities being performed upon the given machine in accordance with the notification.

There is still further provided in accordance with still another preferred embodiment of the present invention a method for optimizing operation of machines, the method including associating a plurality of magnetic sensor modules with a plurality of machines having at least one common feature, each of the plurality of magnetic sensor modules synchronously sensing magnetic fields along at least two signal channels and providing historical output indications of magnetic fields along the at least two signal channels arising from each of the plurality of machines over time, correlating the historical output indications of the magnetic fields in ones of the plurality of machines to at least one optimization metric of corresponding ones of the plurality of machines and providing a correlator output, associating a magnetic sensor module with a given machine having the at least one common feature for providing an individual output indication of magnetic fields arising from the given machine, the magnetic sensor module synchronously sensing magnetic fields along at least two signal channels and receiving the correlator output and the individual output indication, for providing a control output useful for enabling the given machine to operate in accordance with an operational parameter which is correlated by the correlator output to a desired optimization metric.

BRIEF DESCRIPTION OF THE DRAWINGS

The present invention will be understood and appreciated more fully based on the following detailed description taken in conjunction with the drawings in which:

FIGS. 15A and 15B are simplified graphs displaying magnetic field data synchronously acquired along multiple channels by a system of the type illustrated in FIG. 13, as respectively measured for a properly operating and improperly operating synchronous electrical machine;

DETAILED DESCRIPTION OF PREFERRED EMBODIMENTS

Figure 1:
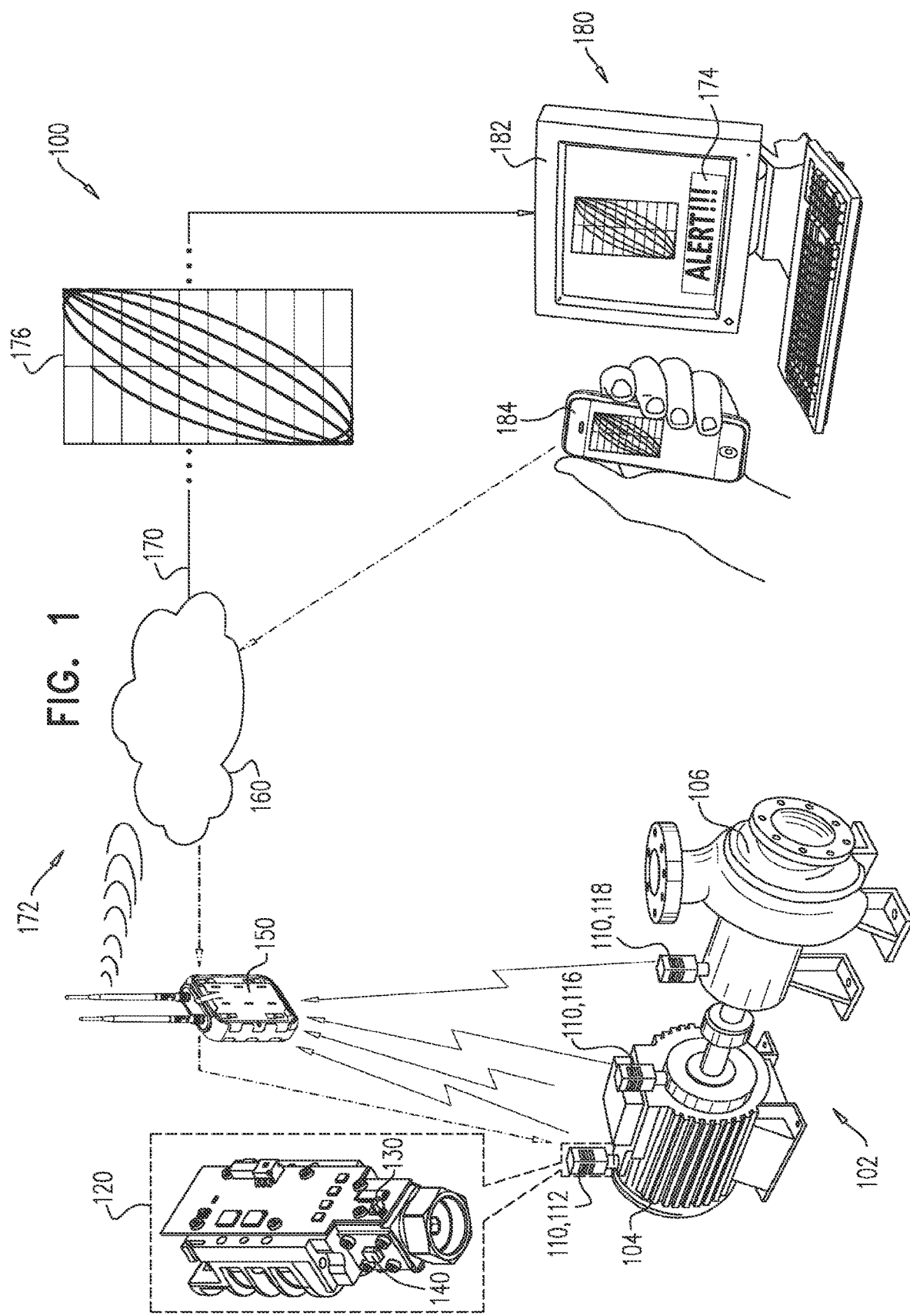
FIG. 1 is a simplified schematic illustration of a system for monitoring a machine, constructed and operative in accordance with a preferred embodiment of the present invention.

Reference is now made to FIG. 1, which is a simplified schematic illustration of a system for monitoring a machine, constructed and operative in accordance with a preferred embodiment of the present invention.

As seen in FIG. 1, there is provided a system 100 for monitoring, preferably although not necessarily continuously, operation of at least one machine 102. Machine 102 may be one or more of a mechanical machine and/or an electrical machine, which electrical machine may be an asynchronous electrical machine, such as an asynchronous motor or generator, or a synchronous electrical machine such as a synchronous motor or generator. Machine 102 may furthermore be embodied as an alternating current (AC) or direct current (DC) electrical machine. Here, by way of example, at least one machine 102 is seen to be embodied as an asynchronous electrical motor 104 cooperatively coupled to a mechanical device 106, here embodied by way of example as a pump 106. Mechanical device 106 may be any type of mechanical device suitable for cooperation with asynchronous motor 104, including a fan, chiller, compressor or turbine.

Operation of motor 104 and mechanical device 106 is preferably monitored by at least one sensor module 110 for sensing operating parameters of at least one of motor 104 and device 106. Here, by way of example, at least one sensor module 110 is seen to be embodied as a first sensor module 112 and a second sensor module 116 mounted on motor 104 and an additional third sensor module 118 mounted on device 106. It is appreciated, however, that system 100 may include a fewer or greater number of sensor modules 110 distributed between motor 104 and device 106.

Sensor modules 112-118 are preferably mounted on various locations of the frames of motor 104 and device 106, for example in close proximity to machine bearings. Multiple ones of sensor modules associated with a particular machine, such as sensor modules 112 and 116 associated with motor 104, may be mounted at mutually similar orientations or may be mounted at different orientations depending on the nature of the operating parameter to be sensed and monitored thereby. Sensor modules 110 may be in physical contact with the machine monitored thereby, as here illustrated to be the case for sensor modules 112-118 with respect to motor 104 and device 106. Alternatively, sensor modules 110 may be physically offset from the machine monitored thereby, provided that sensor modules 110 are positioned so as to be capable of sensing at least one operating parameter of the machine to be monitored thereby.

Each sensor module 110 preferably comprises at least one sensor, and more preferably a collection of sensors, for sensing at least one operating parameter of at least one of motor 104 and device 106. As seen most clearly at an enlargement 120, sensor module 110 may comprise at least one magnetic sensor 130 for sensing magnetic fields emitted by motor 104. Sensor module 110 may additionally comprise at least one vibration sensor 140 for sensing vibrations arising from motor 104, device 106 or both. Sensor module 110 may further include additional sensors for sensing a variety of operational parameters including, but not limited to, temperature and acoustic emission, as is detailed henceforth.

It is a particular feature of a preferred embodiment of the present invention that in the case that motor 104 is monitored by at least two magnetic sensors 130, the at least two magnetic sensors 130 are preferably operative to mutually synchronously sense magnetic fields emitted by the at least one machine being monitored thereby, here embodied as motor 104, along a corresponding plurality of signal channels. The two or more magnetic sensors 130 may be included in a single sensor module 110 or in multiple individual ones of sensor module 110. It is understood that in the context of the present invention, sensing by two or more sensors may be considered to be synchronous when the sampling difference in time between the sensors is of the order of less than or equal to about $0.01/F$, where $F_s$ is the sensor sampling frequency.

It is a further particular feature of a preferred embodiment of the present invention that in the case that motor 104 is monitored by at least one magnetic sensor 130 and at least one vibration sensor 140, the at least one magnetic sensor 130 and at least one vibration sensor 140 are operative to synchronously sense magnetic fields and vibrations emitted by the at least one machine being monitored thereby, here embodied as at least one of motor 104 and device 106. The at least one magnetic sensor 130 and at least one vibration sensor 140 may both be included in a single sensor module 110 or in separate ones of sensor module 110.

Further details pertaining to the preferable structure and operation of sensor module 110 are provided henceforth with reference to FIGS. 2A-2E.

Sensor module 110 preferably includes communication functionality and is preferably adapted for wireless communication with at least one data processing module 150. Data processing module 150 is preferably operative to receive signals, preferably wirelessly, from ones of sensor module 110. Furthermore, data processing module 150 is preferably operative to control sensor module 110 and particularly preferably to synchronize between ones of sensor module 110, as required in order for sensor modules 110 to perform synchronous magnetic and/or magnetic and vibrational sensing as described hereinabove.

Each data sample from sensor module 110 is preferably collected for a predetermined duration of time at a predetermined sampling frequency, for example, for a duration of 4 seconds at a 20 kHz sampling frequency. Samples are collected periodically, for example, once an hour. The periodicity with which data samples are collected may be referred to as the sampling periodicity or number of data acquisition cycles.

Preferably, a single data processing module 150 is operative to receive data in the form of signals from multiple ones of sensor module 110 mounted on at least one machine, here embodied, by way of example as three sensor modules 112, 116 and 118 mounted on motor 104 and device 106 and all in communication with data processing module 150.

Data processing module 150 may be located remotely from the various sensor modules 110 in communication therewith, provided that data processing module 110 is capable of receiving signals from the various sensor modules 110. By way of example, data processing module 150 may be mounted on the wall of a room in which motor 104 and device 106 are located.

At least a portion of the data received at data processing module 150 is preferably transmitted thereby to a server 160, typically on the cloud, for processing. In addition to transmitting data to server 160, data processing module 150 may also be operative to itself perform edge analysis of the data and to control sensor modules 110 based on the results of the edge analysis performed thereby. Such edge analysis may serve to reduce the quantity of data required to be transmitted to server 160.

Figure 3A:
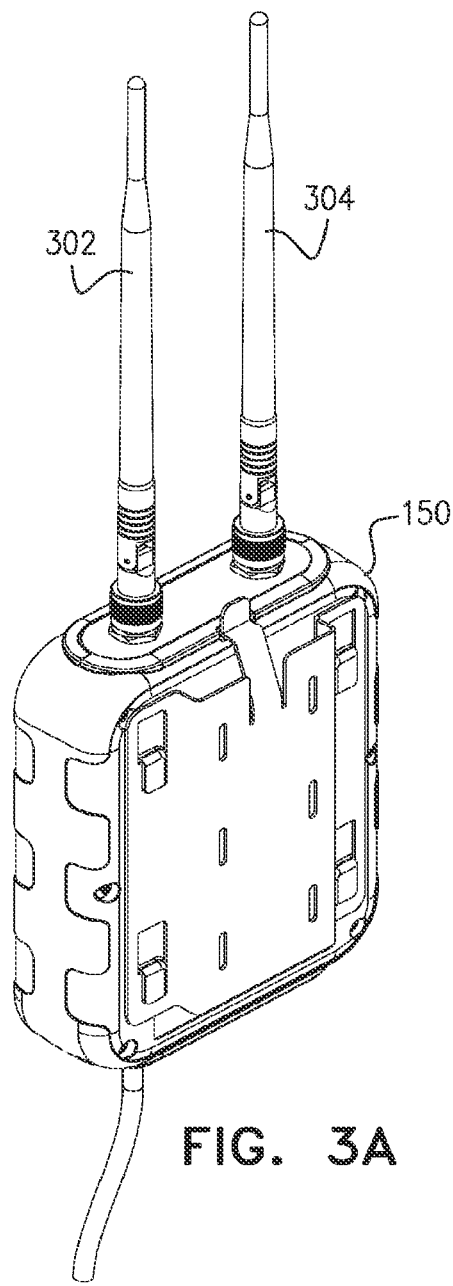
FIGS. 3A, 3B and 3C are simplified respective external and internal perspective views and a block diagram representation of a processing and communication module useful in a system of the type illustrated in FIG. 1.
Figure 3B:
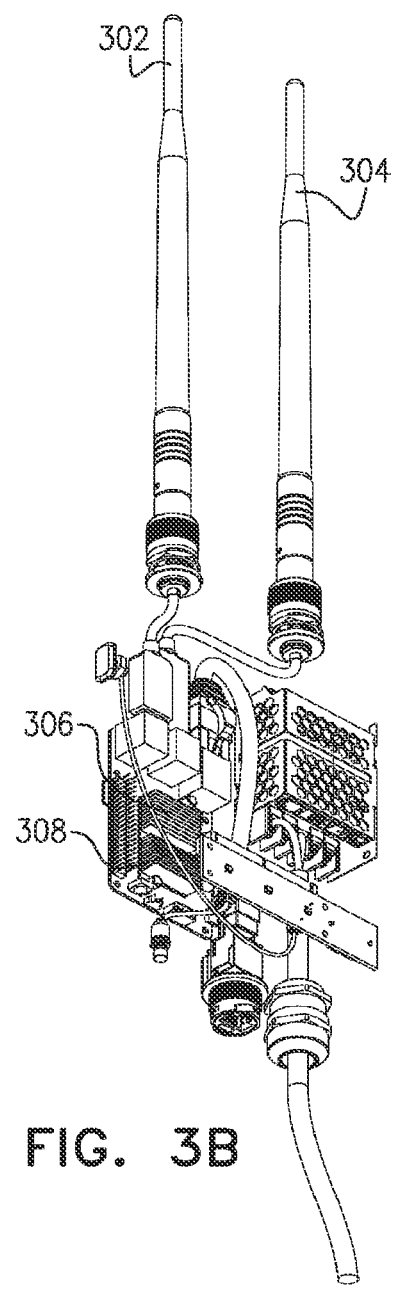
Figure 3C:
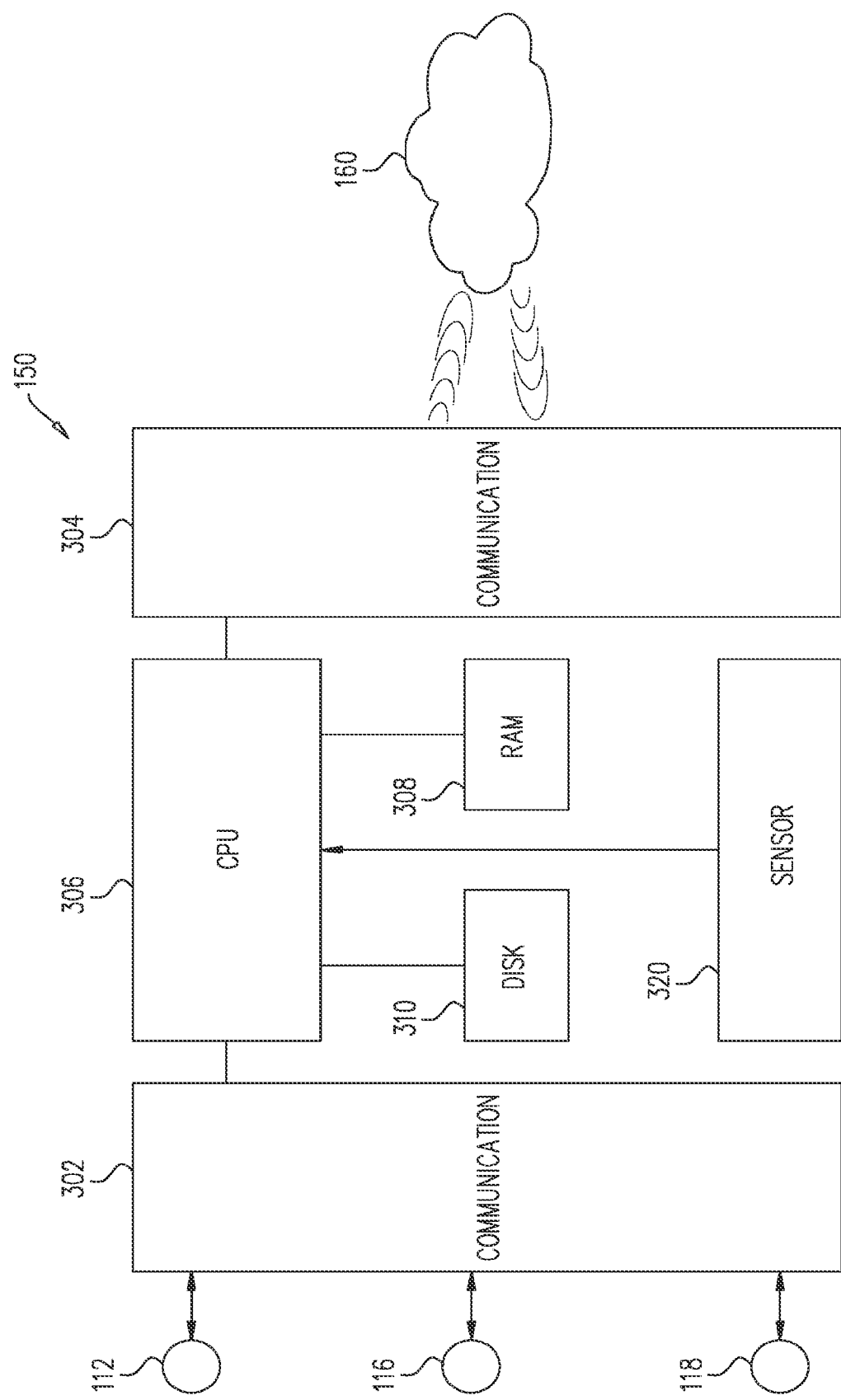

Further details pertaining to the preferable structure and operation of data processing module 150 are provided henceforth with reference to FIGS. 3A-3C.

Server 160 is preferably operative to receive data from at least one data processing module 150 and to analyze the data in accordance with automatic algorithms, preferably including machine learning algorithms. Analysis of data by server 160 may include processing of information in a cloud server as described in U.S. Pat. No. 9,835,594, filed Oct. 22, 2012 and entitled AUTOMATIC MECHANICAL SYSTEM DIAGNOSIS, the disclosure of which is hereby incorporated by reference.

Analysis of data by server 160 may include the execution of algorithms for detection of a condition of motor 104 and/or device 106, including detection or prediction of mechanical and electrical faults, efficiency analysis and analysis of degradation of performance of motor 104 and/or device 106. Furthermore, analysis of data by server 160 may be used to identify possible security breaches in control of motor 104 and/or device 106, due for example to hacking or other malicious activities directed against motor 104 and/or device 106 via computerized controls thereof.

Further details pertaining to the processing steps performed by server 160 are provided henceforth below with reference to FIGS. 5A and 5B and 20-26.

At least one of data processing module 150 and server 160 preferably provides an output 170 based on the analysis performed thereby, which output 170 preferably includes at least an indication of a condition of the at least one machine being monitored, such as motor 104 and/or device 106.

It is appreciated that data processing module 150 in combination with server 160 thus preferably constitutes a particularly preferred embodiment of a signal analyzer 172, receiving at least a portion of the signals sensed by sensor module 110, performing analysis of the signals and providing an output based on the analysis, which output preferably includes at least an indication of a condition of the at least one machine being monitored.

Classification of the continuous data measured by ones of sensor module 110 as received by data processing module 150 and server 160 may be based on the modeling of valid system performance and comparison of current system performance with known performance of the same system under similar operating conditions in the past.

Any type of suitable model may be used for data classification, including a statistical model or machine learning model. Additional types of models may include nearest neighbor or any other probability density function estimation and classification methods such as Parzen windows or SVM. Models may be created from characteristic signatures or based on features provided by other data processing algorithms. For example, the combined normalized energy of detected harmonic series relative to the total signal energy may be generated by an algorithm for detection of non-synchronous harmonic series.

The machine model may be updated during a learning period, in order to collect data corresponding to as many machine operating conditions as possible during workload changes.

Several models may be associated with the same machine. A machine may have a simple model associated therewith, which simple model may be processed on low computing power devices included in sensor module 110. Additionally or alternatively, a machine may have a more complex model associated therewith, which more complex model may be processed by medium power computing devices included in data processing module 150. Still additionally or alternatively, a machine may have a highly complex model associated therewith, which highly complex model may be processed by high power computing devices such as at cloud server 160. Models of different complexity facilitate optimization of overall performance of system 100 and may significantly improve efficiency.

Data collected by sensor module 110 is preferably compared to the low-complexity model. If the data does not fit the model, the data may be sent to data processing module 150, at which the data is compared to the medium complexity model. If the data does not fit the medium complexity model, the data may be sent to cloud server 160 and compared to the high complexity model. In cases that a significant deviation is found between the data and the high complexity model, the model may be updated. Alternatively, an alert such as an alert 174 may be issued regarding machine performance.

Algorithms employed in data processing module 150 and server 160 may be used to build a baseline for motor 104 and/or device 106 being monitored and to detect deviations and anomalies, for example in magnetic field data, acquired for the monitored machine with respect to the baseline. Particularly preferably, the algorithms used both to build a baseline and to detect deviation therefrom are machine learning algorithms, operating in the time and/or frequency domain.

The baseline signal, such as a baseline magnetic signal, and corresponding deviation therefrom may be one or more of an experimentally determined threshold signal associated with a given machine, exceedance of which is indicative of an incipient or actual machine fault; a historical magnetic signal or set of signals associated with a particular machine, deviation from which by a given statistical measure is indicative of an incipient or actual machine fault and a collection of historical magnetic signals or set of signals from corresponding although not necessarily identical machines, deviation from which by a given statistical measure is indicative of an actual or incipient fault in the machine. Alternatively machine learning techniques such as anomaly detection, for example, may be employed to detect deterioration from a known machine condition. Such faults may include, by way of example only, crawling faults, eccentricity, damaged rotor bars, electrical shorts such as winding shorts, electrical discharge, load instabilities, power source problems such as in VFD systems, unbalanced magnetic polls and mechanical imbalance of motor 104 and device 106, as is described in further detail henceforth.

Machine learning algorithms may also be useful in identifying whether electrical machines such as motor 104 have been affected by hacking or other malicious activities directed against the electrical machine via computerized controls thereof. In the case that an electrical machine or controller thereof is subject to a malicious attack, the incoming current and hence magnetic field emission may deviate with respect to baseline magnetic emission patterns established during regular, non-interfered operation of that particular machine or other similar machines.

Here, by way of example only, sensor modules 112, 116 and 118 preferably simultaneously sense at least magnetic fields emitted by motor 104 during operation thereof. Each of sensor modules 112, 116, 118 preferably includes a single magnetic sensor 130, such that magnetic fields emitted by motor 104 are sensed by a total of three magnetic sensors 130, which three magnetic sensors 130 preferably operate synchronously respect to each other as regulated by data processing module 150. Each magnetic field sensor 130 preferably outputs a magnetic field emission signal corresponding to the magnetic field sensed thereby along a corresponding signal channel, which signal is preferably received by data processing module 150 and transmitted thereby to cloud server 160. It is appreciated that server 160 thus preferably receives magnetic field emission data sensed simultaneously along three signal channels in the embodiment of monitoring system 100 illustrated in FIG. 1.

Server 160, and optionally data processing module 150, preferably analyzes the magnetic field emission signals received thereat and provides an output based on the analysis. Here, the analysis performed at server 160, and optionally at data processing module 150, preferably includes phase analysis of the simultaneously sampled magnetic signals sensed by sensor modules 112, 116 and 118, as indicated by a phase analysis graph 176. Such phase analysis may be useful in deriving a condition of motor 104 and/or device 106. It is appreciated, however, that the analysis performed at one or both of data processing module 150 and server 160 does not necessarily include phase analysis, nor is limited to phase analysis, and may involve any type of data processing and analysis as is known in the art in order to provide an output indication of a condition of the machine being monitored.

System 100 further preferably includes a control module 180, receiving the indication of a condition of the machine being monitored from server 160 and/or data processing module 150. Control module 180 may be any computing device, such as a computer 182 or personal communication device 184 illustrated herein. Control module 180 preferably initiates at least one of a repair event on the at least one machine being monitored, an adjustment to a maintenance schedule of the at least one machine, and an adjustment to an operating parameter of the at least one machine based on the indication provided thereto.

Here, by way of example, magnetic signal phase analysis performed by server 160 and/or data processing unit 150 may automatically yield an indication of an actual or incipient fault in motor 104. Control module 180 may receive indication of the fault predicted or detected and repair, deactivate or otherwise adjust motor 104 responsively. It is appreciated that the control actions performed by control module 180 thus preferably serve to improve the efficacy of the at least one machine being monitored.

Reference is now made to FIGS. 2A-2E, which are simplified respective external, internal first and second perspective and side views and a block diagram representation of a sensor module useful in a system of the type illustrated in FIG. 1.

Figure 2A:
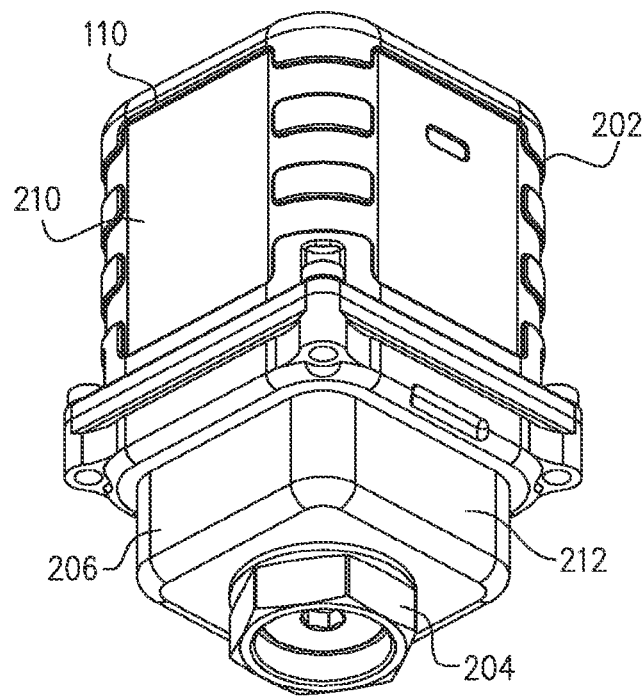
FIGS. 2A, 2B, 2C, 2D and 2E are simplified respective external and internal views and a block diagram representation of a sensing module useful in a system of the type illustrated in FIG. 1.
Figure 2B:
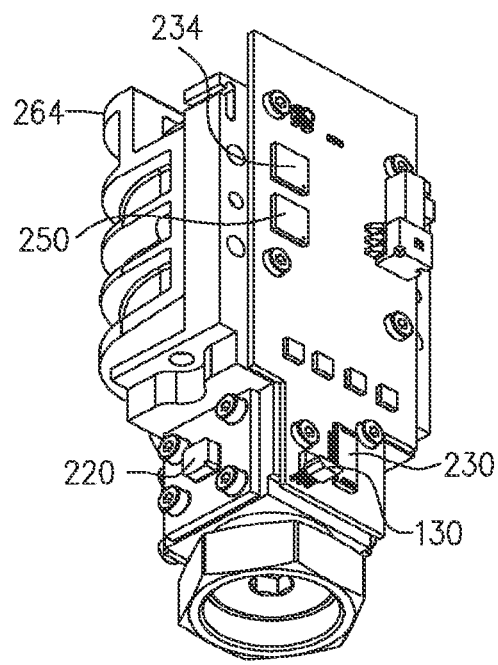
Figure 2C:
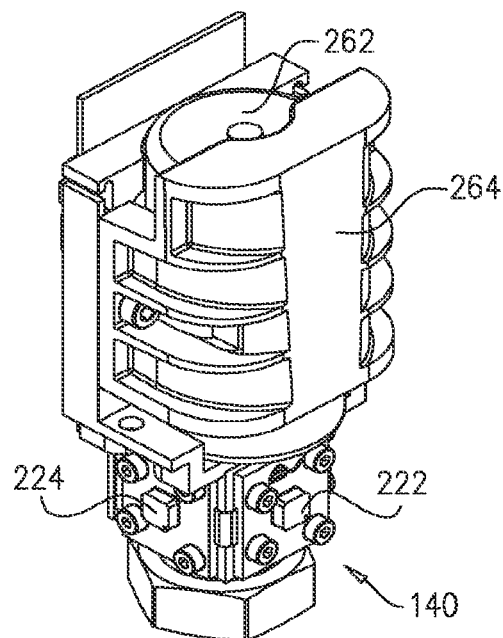
Figure 2D:
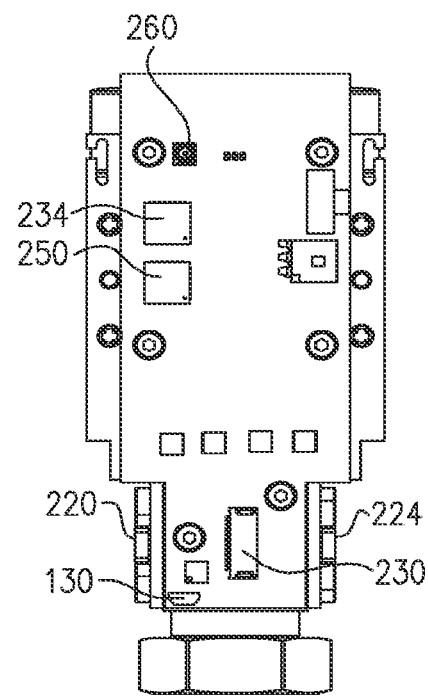
Figure 2E:
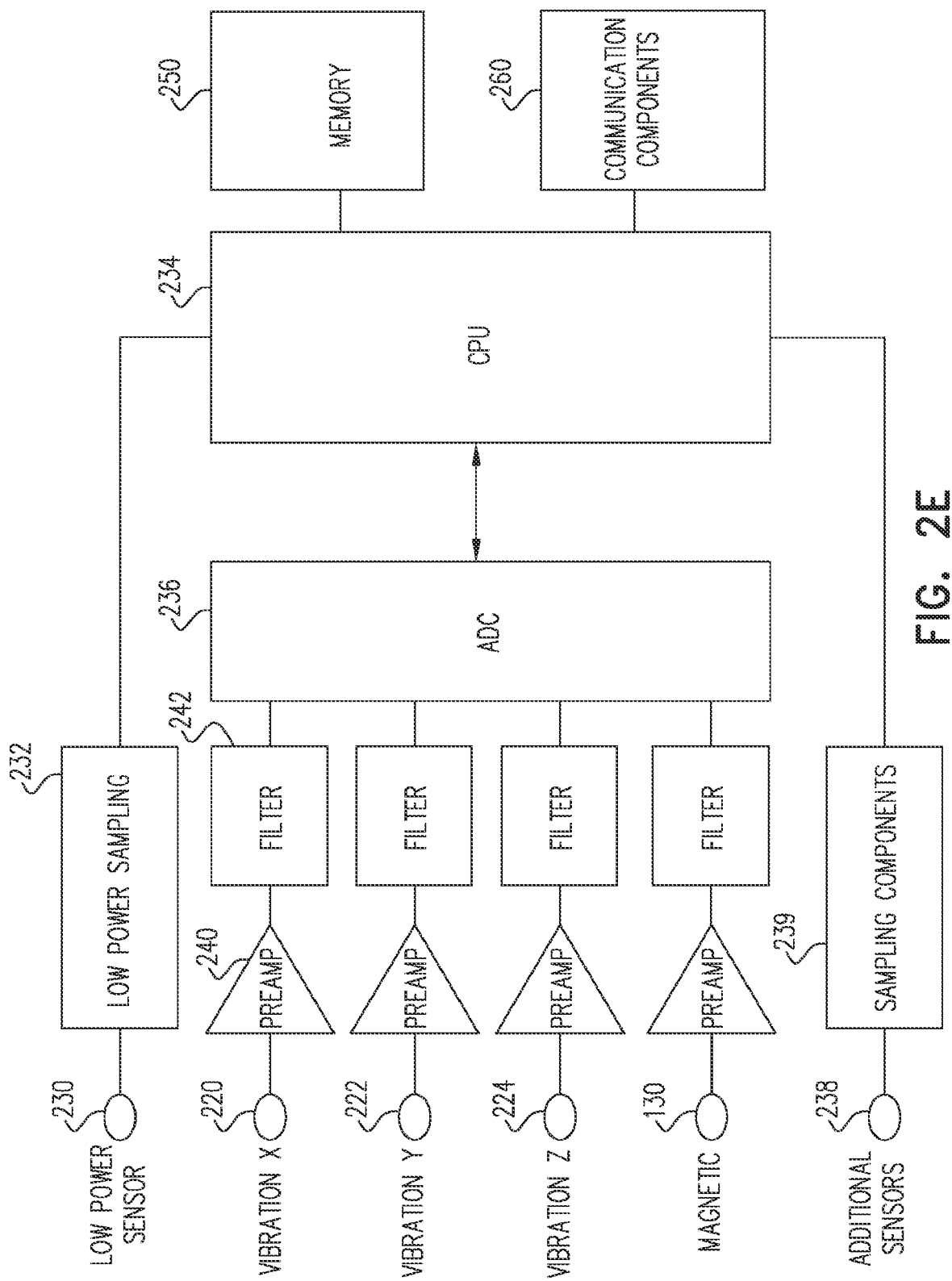

As seen most clearly in FIG. 2A, sensor module 110 preferably comprises an external cover 202 housing the internal components thereof. A protrusion 204 is preferably formed at a base 206 of external cover 202, which protrusion 204 is adapted for mounting sensor module 110 on the machine 102 to be monitored thereby. By way of example, protrusion 204 may be attached to a stud (not shown), which stud may be screwed, glued or otherwise mounted on machine 102. Cover 202 preferably includes an upper portion 210 preferably formed of a rigid material such as a metal and a lower portion 212 preferably formed of a rigid dielectric material such as plastic, so as not to attenuate the magnetic signal arising from motor 104 as sensed by magnetic sensor 130 within sensing module 110.

Turning now to FIGS. 2B-2E, sensing module 110 is seen to preferably comprise a plurality of sensors for sensing operating parameters of machine 102, preferably including at least one magnetic field sensor 130. Magnetic field sensor 130 may be embodied as any type of magnetic sensor including, for example, an analog Hall bar magnetic sensor. In one embodiment of the present invention, magnetic field sensor 130 may operate at a bandwidth of approximately 40 kHz, a sampling frequency of greater than or equal to approximately 20 kH, may draw a current of several mA and may operate at a power of approximately 1 milliWatt or more. However, it is appreciated that these values are exemplary only and may be readily varied in accordance with the desired operating specifications of magnetic field sensor 130.

Magnetic sensor 130 is preferably operative to provide continuous wide-band high resolution measurement of synchronized magnetic field data to be processed by algorithms included in data processing unit 150 and/or server 160. Such magnetic field data may be useful in analyzing a condition of the machine 102 being monitored by sensor module 110, including, by way of example only, motor speed detection, detection of anomalies in the operation of the machine 102 being monitored, detection of mechanical and electrical faults, and electrical energy loss and efficiency analysis.

Additionally, the collection of magnetic field data by magnetic sensor 130 in synchrony with other ones of magnetic sensor 130 and/or in synchrony with sensing of vibrations by vibration sensor 140, facilitates the performance of phase analysis on the magnetic signals, which phase analysis may serve to enhance the data analysis.

It is appreciated that although sensor module 110 is shown here to include only a single magnetic sensor 130, sensor module 110 may include a greater number of magnetic fields sensors located along one or more axes. Sensor module 110 and magnetic sensor 130 therein may be orientated to sense axial or radial magnetic fields, in accordance with the desired analysis to be performed thereupon. For example, magnetic sensor 130 may be embodied as a tri-axial magnetic sensor synchronously sampling magnetic fields along three axes.

Sensor module 110 preferably additionally includes at least one vibration sensor 140, here embodied, by way of example, as a first analog accelerometer 220, a second analog accelerometer 222 and a third analog accelerometer 224. First, second and third accelerometers 220, 222, 224 are preferably tri-axially positioned, for respectively sensing vibrations along three mutually perpendicular axes of machine 102. Accelerometers 220, 222, 224 preferably operate mutually simultaneously and preferably, although not necessarily, synchronously with at least one magnetic sensor 130.

Accelerometers 220, 222, 224 are preferably operative to provide continuous wide-band high resolution measurement of preferably synchronized vibration data to be processed by algorithms included in data processing unit 150 and/or server 160. Accelerometers 220, 222, 224 may operate at any sampling frequency and appropriately calibrated bandwidth. By way of example only, accelerometers 220, 222, 224 may operate at a bandwidth of approximately 11 kHz, a sampling frequency of greater than or equal to approximately 20 kHz and draw a current of several mA.

Vibration data sensed by accelerometers 220, 222, 224 may be useful in detection of anomalies in machine operation, in detection of actual or incipient faults, in analysis of mechanical energy loss and efficiency and in phase analysis both of multiple synchronous vibration signals and multiple synchronous vibration and magnetic field signals.

Sensor module 110 preferably additionally includes at least one low-power consumption sensor 230. Low power sensor 230 may be embodied as any suitable type of digital or analogue low-power sensor, including but not limited to a low-power acoustic sensor, low-power vibration sensor, low-power magnetic sensor and low-power temperature sensor. Low-power sensor 230 preferably has a power uptake significantly lower than that of other operational parameter sensors, such as magnetic sensor 140 and vibration sensor 140, included in sensor module 110. By way of example, low-power sensor 230 may draw a current of less than one microampere and may consume a power of approximately 1 microwatt or less.

Low-power sensor 230 preferably monitors an operating parameter of machine 102, such as vibration, at a relatively high sampling rate, such as approximately six times per second and preferably outputs signals corresponding to the operating parameter monitored thereby. Low-power sensor 230 thus preferably provides at least near real time, at least near continuous high resolution measurements of a given operating parameter, preferably at a low bandwidth of less than 1 kHz.

Due to the low power consumption by low-power sensor 230, the continuous sampling performed by low-power sensor 230 preferably has a minor or negligible effect on the overall power consumption by sensor module 110. Low-power sensor 230 is preferably operatively coupled to at least one additional sensor, such as at least one of magnetic sensor 130 and vibration sensor 140, for automatically controlling operation thereof based on the operational parameter sensed thereby. The at least one additional sensor may sense the same or a different operational parameter than the operational parameter sensed by low-power sensor 230.

Low-power sensor 230 is preferably connected to a sampling circuit 232, which sampling circuit 232 is preferably connected to a signal analyzer, here embodied, by way of example, as a CPU 234. During operation of low-power sensor 230, low-power sensor 230 may continuously sample a given operating parameter of machine 102, such as vibrations, and output signals corresponding to the measured operating parameter.

CPU 234 is preferably operative to receive at least a portion of the signals output by low-power sensor 230 and to perform an analysis of the signals in order to ascertain a condition of the machine 102 being monitored thereby.

Such analysis may include detection of possible exceedance by the signals of at least one predetermined threshold, which at least one predetermined threshold may be set based on machine-learning methods. For example, low-power sensor 230 may be embodied as a low-power vibration sensor continuously monitoring vibrations of motor 104 and/or device 106 and providing vibration data to CPU 234. In this case the analysis performed by CPU 234 may include detecting deviations in the vibration energy, possibly based on machine learning methods. Upon CPU 234 finding deviations in the measured vibration energy to exceed a predetermined vibration energy deviation threshold, operation of additional sensors included in sensor module 110, such as higher powered magnetic sensor 130 and vibration sensor 140, may be initiated.

Further by way of example, detection of possible exceedance of at least one predetermined threshold by the signals provided by low-power sensor 230 may be performed in order to ascertain whether motor 104 or device 106 is in an 'on' or 'off' state. In the case that the analysis performed by CPU 234 finds machine 102 to be in an 'on' state, based on exceedance by the measured signals of at least one predetermined threshold, operation of additional sensors included in sensor module 110, such as higher powered magnetic sensor 130 and vibration sensor 140, may be initiated. By way of example, operation of magnetic sensor 130 and vibration sensor 140 may be initiated by way of CPU 234 waking up a data acquisition unit such as an ADC 236 cooperatively coupled to magnetic sensor 130 and vibration sensor 140.

By way of example, in the case that low-power sensor 230 is embodied as a low-power vibration sensor, power consumption by low-power sensor 230 operating in an on-off detection mode may be approximately 0.54 microwatts with a current uptake of approximately 0.27 microamps and a voltage uptake of approximately 2 V.

Additionally or alternatively, the analysis of the signals from low-power sensor 230 by CPU 234 may include derivation of a condition of the machine being monitored thereby, such as motor 104 and device 106. For example, CPU 234 may include algorithms for detecting anomalies in operation of the machine being monitored, for detecting actual or impending faults in the machine being monitored or for evaluating mechanical energy loss and resultant efficiency.

Operation of additional sensors included in sensor module 110, such as higher powered magnetic sensor 130 and vibration sensor 140, may be adjusted based on the condition of the machine ascertained by CPU 234. By way of example, operation of magnetic sensor 130 and vibration sensor 140 may be initiated by way of CPU 234 waking up ADC 236 cooperatively coupled to magnetic sensor 130 and vibration sensor 140. Alternatively, a sampling periodicity or frequency of operation of magnetic sensor 130 and vibration sensor 140 may be adjusted based on the detected condition.

By way of example, in the case that low-power sensor 230 is embodied as a low-power vibration sensor, power consumption by low-power sensor 230 operating in a condition detection mode may be of the order of approximately 6 microwatts, with a current uptake of approximately 3 microamps and a voltage uptake of approximately 2 V.

The output of the analysis performed by CPU 234, including detection of the on or off state of the machine or other machine condition such as proper or improper operation, is preferably sent to data processing module 150, which data processing module 150 preferably transmits at least a part of the data to cloud server 160.

It is appreciated that the inclusion of a low-power sensor such as low-power sensor 230 in sensor module 110 is optional only. Furthermore, the function of low-power sensor 230 may be replaced by higher power sensors, such as at least one of magnetic sensor 130 and vibration sensor 140, which higher power sensors may be additionally operative in a low-power mode. In a low-power mode, at least one of magnetic sensor 130 and vibration sensor 140 if present may continuously sense, for example multiple times per second, at least one operating parameter of the machine being monitored and provide corresponding signals to a signal analyzer included in sensor module 110, such as CPU 234.

In the case that analysis of the signals by CPU 234 finds the machine being monitored to be in a faulty or impending faulty condition, CPU 234 may adjust the operating characteristics of magnetic sensor 130 and/or vibration sensor 140. Additionally or alternatively, CPU 234 may provide an output indicative of the actual or incipient fault to cloud server 160 by way of data processing module 150. Cloud server 160 may provide an output to control module 180 including an indication of the fault and prompting the initiation of additional higher power monitoring. Such higher power monitoring may be provided, by way of example, in the form of use of an external sampling unit by a user or by the initiation of higher power operation of at least one of magnetic sensor 130 and vibration sensor 140.

In one possible embodiment of the present invention, at least one sensor such as magnetic sensor 130 and vibration sensor 140 may monitor at least one operational parameter of at least one machine with a sampling periodicity and provide at least one output signal corresponding to the at least one operational parameter monitored thereby. A signal analyzer, such as CPU 234, data processing module 150 or cloud server 160 may receive at least a portion of the at least one output signal and perform analysis of the at least one output signal. The signal analyzer may provide an output indication of at least one of a condition of the at least one machine and a condition of the at least one sensor based on the analysis. A control module may receive the output indication and adjust the sampling periodicity of the at least one sensor in at least near real time based on the output indication. For example, the sampling periodicity of sensors in sensor module 110 may be adjusted based on whether the machine is in an on or off condition, a properly or improperly operating condition, and an actual or impending faulty condition. Such conditions may be ascertained based on machine learning functionality or by other methods.

In one possible embodiment, system 100 may perform an estimation of the remaining useful life (RUL) of motor 104 or device 106 based on the signals sensed by sensor module 110. Such an RUL estimation may be performed at CPU 234, at data processing module 150 or at cloud server 160. Based on the RUL, the sampling periodicity of the higher power sensors, including magnetic sensor 130 and/or vibration sensor 140, may be adjusted. By way of example, for machines with a longer RUL the sampling periodicity of sensors in sensor module 110 may be reduced, whereas for machines with a shorter RUL, the sampling periodicity of sensors in sensor module 110 may be increased, in order to accurately detect early signs of machine deterioration.

It is appreciated that the description of the inclusion in sensor module 110 of at least one magnetic sensor, such as magnetic sensor 130, at least one vibration sensor, such as tri-axial vibration sensors 220, 222, 224 and a low-power sensor, such as low-power sensor 230, is by no way intended to be limiting and sensor module 110 may include additional sensors 238 and corresponding sampling components 239, such as, by way of example only, temperature, humidity, optical and acoustic sensors.

ADC 236 is preferably connected to the sensors from which data is acquired thereby by way of at least one amplifier 240 and at least one filter 242, for enhancing the signal quality. CPU 234 is preferably operative to control the sensors included in sensor module 110, such a magnetic sensor 130 and vibration sensors 220, 222, 224 and low-power sensor 230, and perform analysis on data collected thereby, as detailed hereinabove. Sensor module 110 preferably includes a memory 250 for storage of data therein. Sensor module 110 additionally preferably includes a communication component 260, such an antenna, for communicating with data processing module 150.

Sensor module 110 is preferably powered by a battery 262. Battery 262 is preferably enclosed by a cage 264, which cage 264 preferably holds battery 262 extremely tightly so as to prevent vibration thereof during machine operation. It is appreciated that should battery 262 not be held sufficiently tightly within cage 264 vibrations of battery 262 may be sensed by vibration sensors 220, 222, 224 and thus potentially distort the vibration data sensed thereby.

It is appreciated that battery 262 may alternatively be held in an external unit connected to sensor module 110, rather than within the body of sensor module 110. This may be advantageous in that such an arrangement renders sensor module 110 more compact, allowing sensor module 110 to be easily mounted even within small available spaces on the machine to be monitored thereby.

In one preferred embodiment of the present invention, operation of sensor module 110 may be optimized based on remaining battery life of battery 262. By way of example, the sampling periodicity of sensors in sensor module 110 may be reduced in the case of low remaining battery life of battery 262, in order to maintain system 100 as operational for as long as possible before battery 262 requires replacement. The reduction in sampling periodicity may be based on an expected battery replacement schedule. For example, if a fully charged battery is capable of 10,000 cycles of data acquisition, a battery 262 with 5% remaining useful life is capable of 500 cycles of data acquisition. If battery replacement is scheduled to be carried out in 50 days, system 100 may be limited to perform no more than ten data acquisition cycles per day, in order for battery 262 to sustain system 100 until such time as battery 262 is replaced. Algorithms for detecting remaining battery life and automatically changing the sampling regime may be included in one or more of CPU 234, data processing module 150 and cloud server 160.

Reference is now made to FIGS. 3A, 3B and 3C, which are simplified respective external and internal perspective views and a block diagram representation of a processing and communication module useful in a system of the type illustrated in FIG. 1.

As seen in FIGS. 3A-3C, data processing module 150 preferably includes a first communication component 302 for receiving incoming signals from at least one sensor module 110 and a second communication component 304 for transmitting signals to cloud server 160. Preferably, first and second communication components 302, 304 are antennas operative to wirelessly respectively receive and transmit signals.

Data processing module 150 further preferably includes a CPU 306, a memory 308 and data storage disk 310. CPU 306 is preferably operative to perform local analysis of data received from sensor modules 110. Such local analysis may include anomaly detection, fault detection and derivation of a machine condition. In some embodiments, CPU 306 may be capable of running all or part of the analysis algorithms held in cloud server 160. Data processing module 150 may also include at least one additional sensor 320. For example, additional sensor 320 may be embodied as a temperature sensor for sensing environmental temperature conditions, which may be used as a basis for deriving the temperature of the machine being monitored.

Data processing module 150 is preferably operative to synchronize operation of the various sensor modules 110 in communication therewith. Here, for example, data processing module 150 is preferably operative to synchronize operation of three sensor modules 112, 116 and 118 in communication therewith. Sensor modules 112, 116 and 118 preferably operate synchronously under the control of a single data processing module 150 to provide overall twelve synchronized sensors, including a total of three sets of three tri-axial accelerometers 220, 222, 224 and a total of three magnetic sensors 130 included in sensor modules 112, 116 and 118.

In the case that the twelve synchronized sensors, including three magnetic sensors 130 and nine accelerometers 220, 222, 224, each operating at a sampling frequency of approximately 20 kHz, the sampling of each of the twelve sensors is preferably synchronized by data processing module 150 to be performed at least near simultaneously across all of the sensors. It is understood that in the context of the present invention, sensing by two or more sensors may be considered to be synchronous when the sampling difference in time between the sensors is of the order of less than or equal to about $0.01/F_s$ where $F_s$ is the sensor sampling frequency. By way of example, the sampling performed across all of the sensors may be synchronized to within 1 microsecond or within several microseconds.

It is appreciated that the description of twelve synchronized sensors providing synchronized magnetic and vibration signals along twelve channels is exemplary only, and that system 100 may be scaled to provide an even greater number of synchronized signals along a corresponding number of channels, depending on the number of sensor nodules 110 employed.

Figure 4:
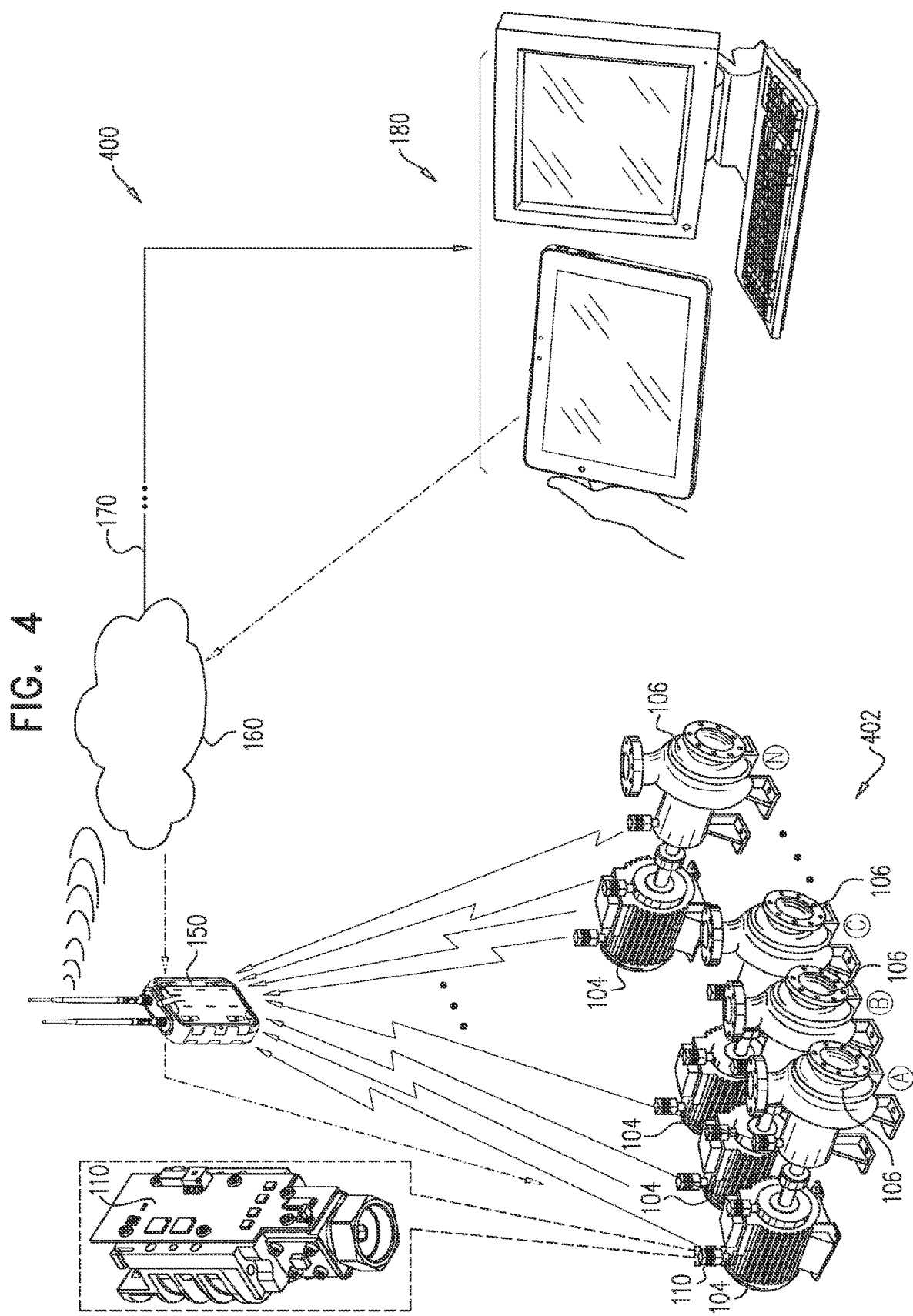
FIG. 4 is a simplified schematic illustration of a system for monitoring a plurality of machines, constructed and operative in accordance with another preferred embodiment of the present invention.

It is understood that although data processing module 150 is illustrated herein as being in communication with a single motor 104 and device 106, system 100 may be adapted to include a plurality of electrical and/or mechanical machines 102 in communication with one or more data processing modules 150, as shown to be the case for a monitoring system 400 in FIG. 4.

As seen in FIG. 4, monitoring system 400 preferably includes a plurality of electrical and/or mechanical machines 402 here embodied, by way of example, as a large number 'n' of asynchronous motors 104 each coupled to device 106 and monitored by a corresponding plurality of sensor modules 110, as described hereinabove with reference to system 100 of FIG. 1. It is appreciated, however, that the illustration of plurality of electrical and/or mechanical machines 402 as comprising a plurality of asynchronous motors 104 and machines 106 is exemplary only and that plurality of electrical and/or mechanical machines 402 may comprise any type of electrical and/or mechanical machines including synchronous or asynchronous, AC or DC electrical machines.

Plurality of sensor modules 110 may be in communication with a single data processing module 150 or with more than one data processing module 150, depending on the number and spatial distribution of plurality of machines 402. The at least one data processing module 150 included in system 400 is preferably in communication with cloud server 160. Cloud server 160 preferably includes algorithms to analyze signals sensed by sensor modules 110 and communicated to cloud server 160 via at least one data processing module 150. Feedback control is preferably provided to at least one of plurality of machines 402 based on the results of the analysis performed by automatic algorithms included in at least one of data processing module 150 and cloud server 160.

It is understood that although plurality of machines 402 is here shown to comprise a plurality of n identical and co-located machines, this is not necessarily the case. Rather, system 400 may monitor a plurality of non-identical machines co-located or remotely located with respect to each other, which plurality of machines preferably share at least one common mechanical or electrical characteristic. By way of example, the plurality of machines being monitored by system 400 may have a common mechanical structure; common motor type such as part number; share a common environmental characteristic such as co-located ones of motor 104; share a common operating parameter such as load, temperature or humidity; or share a common operational purpose or performance characteristic, such as motors working in parallel on the same task or similar tasks.

It is appreciated that the employment of system 400 to monitor a large number of similar although not necessarily identical machines sharing at least one common mechanical or electrical characteristic, allows system 400 to operate in accordance with a crowd-sourcing approach. In such a crowd-sourcing implementation of system 400, server 160 preferably accumulates data from a large population of similar or identical mechanical and/or electrical machines, at least one operating parameter of each of which machines is preferably monitored by at least one sensor module 110 in communication with a data processing module 150.

The accumulation of operational parameter data for a large population of electrical or mechanical machines sharing at least one electrical or mechanical characteristic based on crowd sourcing is highly advantageous, due to the enhancement of the reliability and robustness of the analysis performed at server 160 and the accuracy of the condition classification of a given mechanical or electrical machine. It is appreciated that the given mechanical or electrical machine being classified may or may not be included in the population of electrical or mechanical machines from which data was accumulated, provided the given mechanical or electrical machine shares at least one electrical or mechanical characteristic with members of the population of the electrical or mechanical machines.

It is appreciated that the analysis performed on crowd-sourced data acquired by system 400 does not necessarily include, nor is limited to, phase analysis of synchronous magnetic and vibration signals. Rather, the crowd-sourced data may be analyzed in accordance with any suitable methods known in the art. Particularly preferably, crowd-sourced magnetic signals acquired by system 400 may be analyzed in order to derive a condition of motor 104.

Such analysis of magnetic signals based on crowd-sourcing may include calculation of the machine slip frequency based on the machine synchronous frequency as derived from the magnetic signal. The machine slip frequency may be useful for detecting changes in machine load or in identifying a crawling fault.

Analysis of magnetic signals based on crowd sourcing may additionally or alternatively include detection or prediction of eccentricity, wherein the machine rotor and stator are not centered with respect to each other. Eccentricity may be identified based on changes in the magnetic power spectrum. Particularly, during eccentricity the peak amplitude of the magnetic signal develops side bands, frequently accompanied by harmonics, thus allowing detection and evaluation of the severity of this fault. Detection of eccentricity may be enhanced by correlation of magnetic to vibration signals arising from the machine being monitored, due to the modified vibration patterns.

Analysis of magnetic signals based on crowd sourcing may additionally or alternatively include detection of a cracked or broken rotor bar based on the presence of new frequency component peaks in the magnetic power spectrum of a faulty machine in comparison to a non-faulty machine. The new frequency component peaks will be manifested as side bands of $s*f_s$, where s is the slip frequency, as well as harmonics thereof. The presence and severity of cracked or broken rotor bars may be evaluated based on features of the magnetic power spectrum. Furthermore, the vibrations generated by a machine having a cracked or broken rotor bar also tend to change, due to the interaction between the stator field and the increased currents present in regions surrounding the cracked or broken rotor bars. Detection of cracked or broken rotor bars may thus be enhanced by correlation of magnetic to vibration signals.

Analysis of magnetic signals based on crowd sourcing may additionally or alternatively include detection of electrical shorts in electrical machine windings, since the shorted current flow produces an additional magnetic field component perpendicular to the field produced by the magnetic poles of the electrical machine. The shorted magnetic field is typically more prominent in the axial magnetic field and may be detected based on analysis of spectral peaks in the axial magnetic field spectrum, in order to identify an increase in the frequencies associated with a shorted field. Detection of winding electrical shorts may be enhanced by correlation of magnetic to vibration signals arising from a machine being monitored, due to the breakdown of the field symmetry.

Analysis of magnetic signals based on crowd sourcing may additionally or alternatively include detection of electrical discharge due to irregularities in magnetic circuits in the electrical machine. Such electrical discharge creates transient currents through the machine shafts, bearings and bearing supports and may cause bearing failure. In order to detect electrical discharge, a magnetic sensor such as magnetic sensor 130 functioning in a low-power mode or low-power sensor 230 may be operated, in order to provide at least near real time magnetic data. Anomalies and/or deviations in the magnetic time waveform may be detected. Non-stationary magnetic fields with an appropriate time decay characteristic may be detected and classified as discharge, with severity graded according to the discharge magnitude and repetition rate. Filtering may be used to prevent masking of the discharge signal. In addition, the high frequency energy of the magnetic power spectrum may be calculated, which high frequency energy has been found to increase in the case of non-stationary fields.

Analysis of magnetic signals based on crowd sourcing may additionally or alternatively include detection of mechanical unbalancing, wherein the center of mass of the electrical machine is not aligned with the geometrical center thereof. This fault introduces a time varying component in the magnetic field, detectable by the monitoring system of the present invention.

Analysis of magnetic signals based on crowd sourcing may additionally or alternatively include detection of extremum operating conditions, such as due to overloading, over-voltage or over-speeding of an electrical machine. Extremum operating conditions may be detected based on deviation of the magnetic signature of the machine from a baseline signature associated with normal machine operation. By way of example, overloading and over-voltage may be detected based on increased magnetic energy and may be verified based on changes in additional operating parameters, such as temperature or vibrations.

Analysis of magnetic signals based on crowd sourcing may additionally or alternatively include detection of problems due to machine controllers, in particular Variable Frequency Drive (VFD) controllers. Problems due to such controllers typically create anomalies in the incoming current provided to the electrical machine being monitored, and hence in the machine generated magnetic field. These anomalies may be detected by signal processing functionality included in the present invention, as described herein, and used to identify faults in the controller. By way of example, high VFD noise may give rise to a magnetic signal having increased noise in comparison to a baseline signal noise level. This allows detection of deterioration of the VFD prior to the occurrence of severe faults. Detection of problems in machine controllers may be enhanced by correlation of the magnetic signal to a vibration signal, since anomalies in the magnetic signal result in variation of the generated torque and hence in the vibration signature of the machine.

It is appreciated that the above-mentioned faults are provided by way of example only and that system 400 may be used to monitor and detect a wide range of mechanical or electrical faults of electrical machines, particularly preferably based on the acquisition and analysis of at least magnetic data using a crowd sourcing technique, which analysis may or may not include phase analysis of synchronously acquired signals.

Figure 5A:
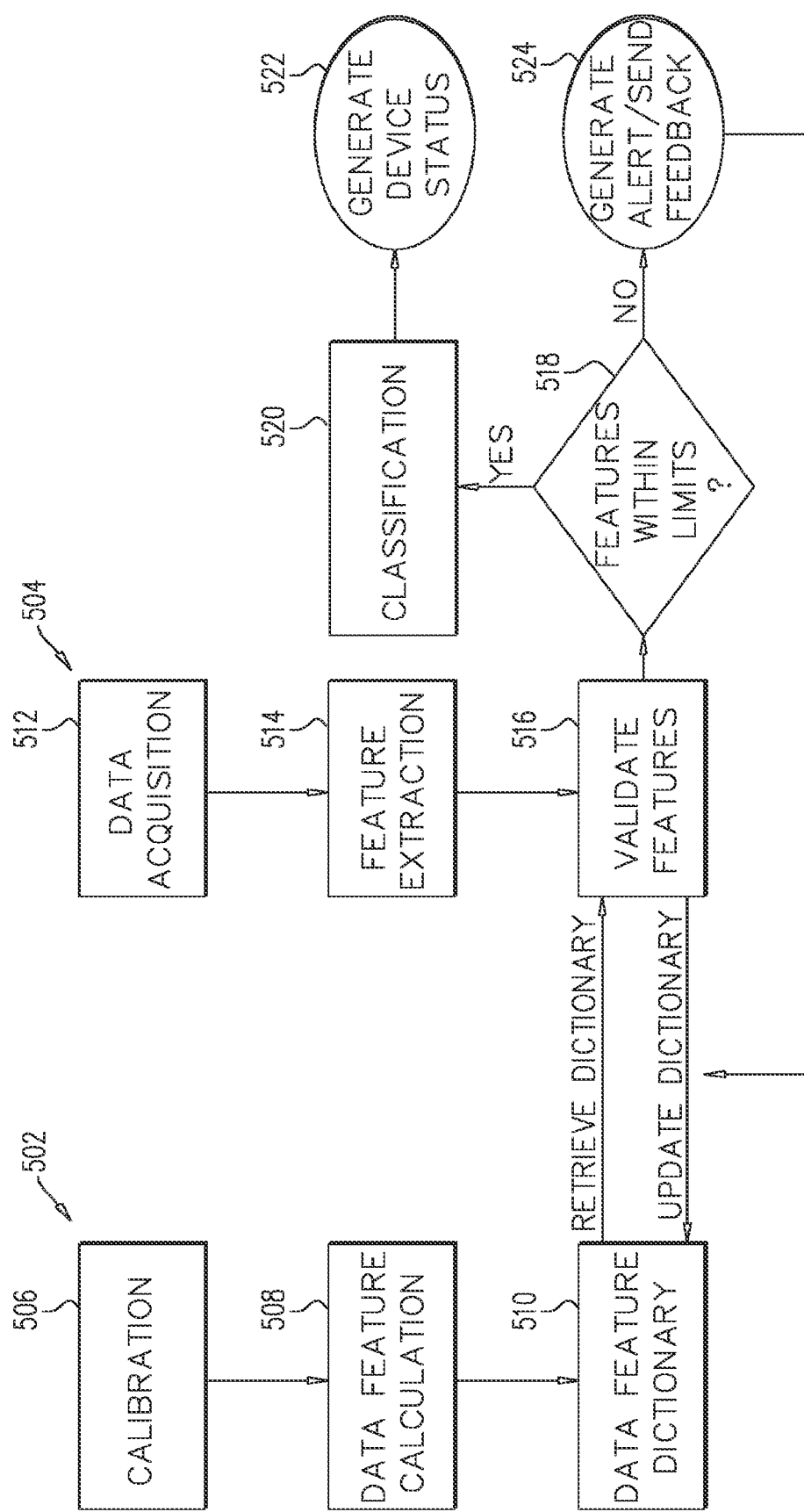
FIGS. 5A and 5B are simplified flow charts illustrating signal processing functionality of systems of the types shown in FIGS. 1-4.
Figure 5B:
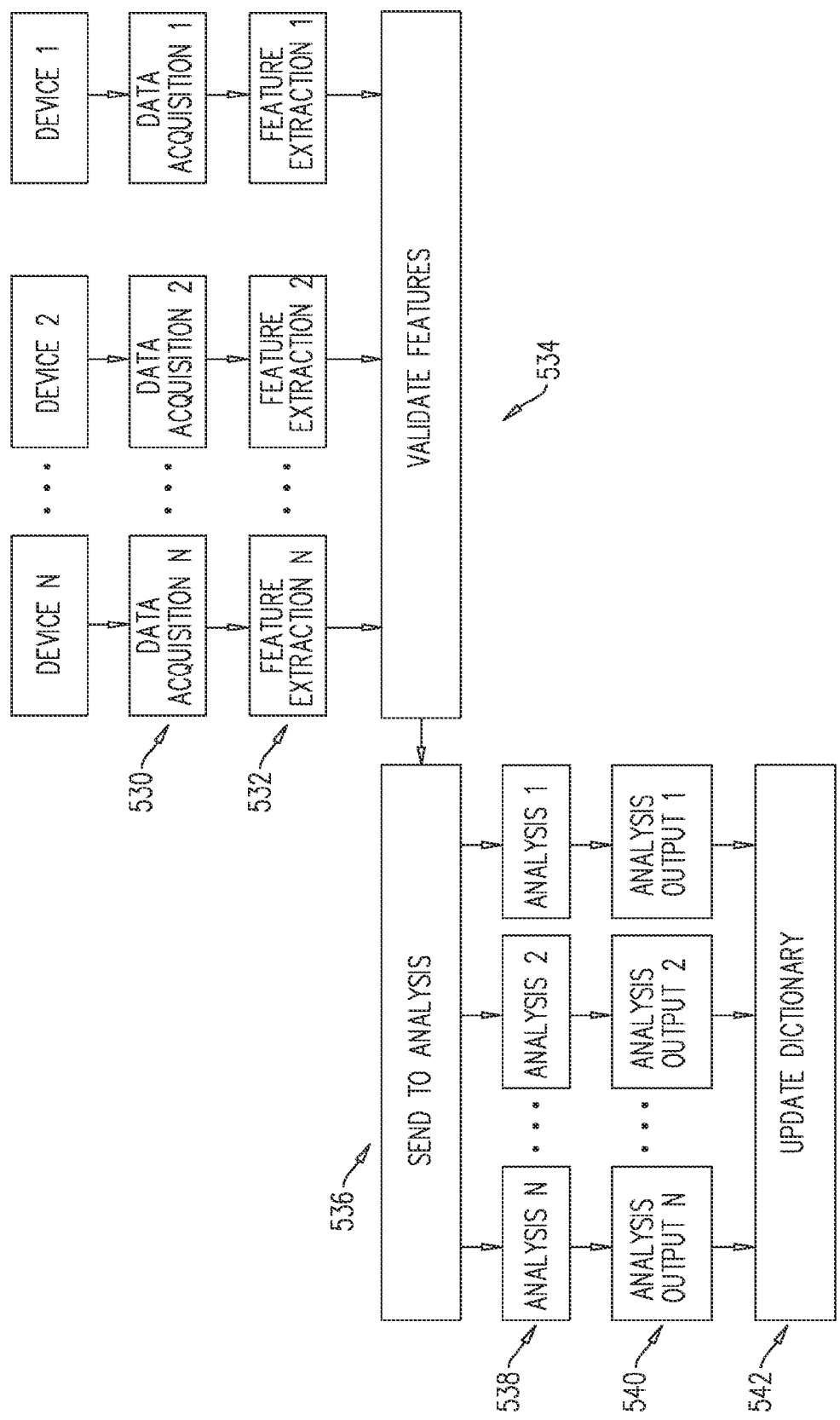

Reference is now made to FIG. 5A, which is a simplified flow chart illustrating signal processing functionality useful in a system of the type shown in FIGS. 1-3; and to FIG. 5B, which is a simplified flow chart illustrating additional signal processing functionality useful in a system of the type shown in FIG. 4.

As seen in FIG. 5A, the signal processing functionality performed by system 100 preferably includes steps for calibration of a given mechanical or electrical machine, as illustrated in a first calibration column 502, as well as steps for actual measurement of the mechanical or electrical machine, as illustrated in a second measurement column 504.

Turning now to first calibration column 502, the machine under test (MUT) is preferably calibrated at a first calibration step 506. First calibration step 506 preferably involves the measurement of at least one operating parameter of the MUT, such as magnetic field emission, and calibration thereof in a variety of operational states of the machine. Such calibration may be used to establish a baseline signal, corresponding to normal operation of the MUT, which normal operation may be healthy rather than faulty operation or legitimate rather than illegitimate operation.

The calibrated output is preferably used to establish data patterns or features associated with various machine conditions, as seen at a second calculation step 508. Such features may be thresholds based on one or both of time domain and frequency domain spectral features of data of the MUT in the various calibrated operational states thereof. Such features may additionally or alternatively be machine-learning based data trends or models. These emission features may be used to build up a dictionary of data features, as seen at third compilation step 510.

By way of example, the data features derived at second calculation step 508 may be discrete magnetic field signal thresholds corresponding to respective operational states of the MUT. These discrete thresholds may be unique to the particular MUT or may be standard thresholds found to be applicable to a range of similar electrical machines.

Alternatively, the data features derived at second step 508 may correspond to models of signals, such as magnetic field signals, statistically correlated to respective operational states of the MUT, which models may be based on historical measurements of the magnetic field emission signal over time and between various operating conditions of the MUT.

It is appreciated that first-third steps 506-510 shown in calibration column 502 may be carried out by one or more data processing modules 150 in cooperation with server 160. Alternatively, depending on the particular thresholds applied, first-third steps 506-510 may be carried out by external, additional signal collection and processing modules and the data pattern dictionary compiled at third step 510 stored at server 160.

Turning now to second measurement column 504, operational parameter data generated by the MUT is acquired at a fourth step 512. By way of example, magnetic field emission data may be acquired by magnetic field emission sensor 130 in sensor module 110 and received therefrom by data processing unit 150.

At a fifth step 514, data features are extracted from the acquired data. Feature extraction may include extraction of physical features of the data. For example, in the case of magnetic field emission data, step 514 may involve extraction of features used to represent the magnetic signal, such as principle components of the magnetic waveform and the power spectrum thereof, total magnetic signal energy, magnetic energy within defined time frames, magnetic energy within defined frequency bins and fluctuations in magnetic energy. Feature extraction may also include extraction of statistical features of the magnetic field emission, including statistical moments and correlations and cumulants of operation parameter signals, signal entropy and signal noise, as well as extraction of signal integrity features such as signal span and stationarity. Feature extraction at step 514 may also involve extraction of features indicative of the presence and/or severity of faults, as is further detailed henceforth.

At a sixth step 516 and seventh step 518, features extracted at fifth step 514 are respectively validated by and compared to features of data patterns held in the dictionary built up at third step 510. Particularly, features extracted from the received data may be compared to features of the baseline operating parameter signal, such that validation of the features takes into account the baseline signal associated with normal operation of the MUT. Validated features may be fed back to the dictionary, thereby further building up the MUT dictionary. As a result of such feedback, the reference data patterns held in the MUT dictionary may be dynamically changing patterns. Feature validation may include comparing patterns of change over time of the signal sensed from the MUT to patterns of change over time of historical signals associated with past failures of the MUT or of machines similar to the MUT.

Extracted features may be within predefined or machine-learned limits, allowing classification of the state of the MUT, as seen at an eighth step 520, leading to generation of a machine status at a ninth step 522. The status may indicate deterioration of the MUT and predict impending failure prior to the occurrence of operational failure. Furthermore, the status may indicate the particular nature of the operational failure likely to occur. Alternatively, extracted features may deviate from the pre-defined or machine-learned baseline signals, indicating anomalous operation of the MUT as seen at a tenth step 524. Identification of malfunction of the MUT may result in the generation of a malfunction alert and/or feedback to the MUT, for example by way of control module 180.

It is understood that calibration of the MUT and compilation of the MUT dictionary may involve the measurement and calibration of signals from the MUT itself. Alternatively, calibration and compilation of the MUT dictionary may involve the measurement and calibration of signals from a population of similar machines resembling but not necessarily identical to the MUT, using machine learning algorithms in combination with a crowd-sourcing approach as illustrated in FIG. 4 and further detailed with respect to FIG. 5B.

As seen in FIG. 5B, members of a population of machines used for calibration measurements may be devices 1-N, selected based on having at least one electrical or mechanical characteristic in common with the MUT such as, by way of example, a common part or model number. The population of electrical or mechanical machines based on which a given machine may be calibrated may or may not include the machine itself.

In the crowd-sourcing approach illustrated in FIG. 5B, data is acquired from each of devices 1-N at a data acquisition step 530. Features are then extracted from the data acquired for each device at a feature acquisition step 532. The extracted features are preferably validated at a feature validation step 534. Validated features are preferably sent for further analysis at an analysis step 536. Analysis step 536 may involve analysis of extracted features by human experts, as seen at an analysis step 538. The performance of the analysis results in an analysis output, as seen at an analysis output step 540, which output is preferably fed back into the data feature dictionary at an updating step 542.

The dictionary compiled at third step 510 of FIG. 5A thus may comprise or be augmented by data patterns identified based on statistical models of signals, such as magnetic field emission signals, gleaned from measurements of signals of machines sharing mechanical or electrical characteristics with the MUT but not necessarily being identical thereto, based on a crowd-sourcing approach as illustrated in FIG. 5B. The incorporation of data patterns based on related machines in the data patterns dictionary allows the compilation of a richer, more widely applicable dictionary having a higher confidence level associated therewith.

In the case that patterns of change over time of the operational parameter signal sensed from the MUT are found to be similar to patterns of change over time of historical operational parameter signals associated with past failures of the MUT or of electrical machines similar to the MUT, an output may be generated by control module 180 comprising a prediction of impending failure of the MUT based on similarities between patterns of change over time of the present measured operational parameter signal and patterns of change over time of historical operational parameter signals. Extracted features found to deviate from the pre-defined or machine-learned limits may also be fed back to the data feature dictionary in order to update the data feature dictionary.

By way of example, in the case that a system such as system 100 or 400 is used in detecting anomalous operating states as means of identifying undesirable malicious interference in the operation of motor 104 or device 106, data processing unit 150 may receive measured magnetic field emission signals and extract features therefrom. Data processing unit 150 in optional cooperation with server 160 may furthermore identify an operating state of motor 104 or device 106 based on the extracted features and compare the identified operating state to historical operating states of at least one reference machine having at least one shared mechanical or electrical characteristic with the monitored machine. It is appreciated that the historical operating states may or may not include historical operating states of the monitored machine itself.

Additionally, data processing unit 150 and/or server 160 may provide an output based on the comparing, the output being indicative at least of whether the identified operating state is anomalous with respect to the historical operating states. As detailed above, an anomalous operating state may be caused, for example, by security breaches in the operation of motor 104 or device 106 or errors in the operating code thereof.

In the case that feature extraction and validation involves machine learning, a possible input of machine learning algorithms is a normalized set of various feature parameters as described above and the desired output may be, for example, predicted time-to-failure of the MUT. Training of such machine learning algorithms is preferably performed by providing historical examples of data relating to failures and faults. During an evaluation stage, each time data is recorded from the operational parameter sensors in sensor module 110 relevant parameters are calculated on the data, which parameters may be identified as p1, p2 etc, as indicated in equation (1) below.

$$p = \{p_1, p_2, \ldots, p_N\} \quad (1)$$

These parameters may include, for example, peak amplitude, peak frequency, time waveform and total energy. The data may then be normalized using Z-score transformation relative to a historical baseline, in accordance with equation (2) below.

$$z = \{z_1, z_2, \ldots, z_N\} \quad (2)$$

where $$z_i = (p_i - \mu_i)/\sigma_i$$

and $\mu_i$ is mean of parameter $p_i$ under similar operating conditions in the same or similar machine. In a more general multivariate case:

$$z = (p-\mu)^T \Sigma^{-1} (p-\mu)$$

where $\mu$ is a mean of parameter vector p known from historical data, and $\Sigma$ is a covariance matrix calculated from historical data as well. The output of the system is expected time-to-failure ($T_{ttf}$).

During a training stage, various parameters are calculated using historical data as the input to the algorithm and time-to-failure provided as a target output. In this formulation the task is a simple regression:

$$T_{ttf} = f(z, C)$$

where C represents parameters of the learning system calculated from historical data on the same or similar devices. One of the simplest solutions is using linear or logistic regression. In a linear case:

$$T_{ttf} = z \cdot C = \Sigma z_i C_i$$

It is understood that the forgoing corresponds to one possible implementation of machine learning algorithms useful in the present invention, and that the use of any appropriate machine learning algorithm may be possible.

It is appreciated that the signal processing steps illustrated in FIGS. 5A and 5B are not necessarily carried out in the order shown and described and that various steps may be interchanged with other steps. Furthermore, it is appreciated that the signal processing steps may include additional steps not described herein, as may be known in the art.

Performance of signal analysis, in accordance with algorithms outlined hereinabove or in accordance with any other signal processing algorithms known in the art, may be useful in deriving a condition of the at least one machine 102 being monitored. Examples of various machine conditions identifiable based on analysis by data sensor module 150 and/or server 160 of signal output by at least one sensor module 110 are provided hereinbelow with reference to FIGS. 6-12. More specifically, examples of various asynchronous electrical machine conditions identifiable based on analysis of magnetic field emission signals synchronously sensed along a plurality of channels, optionally in synchronous combination with vibration signals, are provided. It is appreciated, however, that the particular faults described hereinbelow are exemplary only and that systems and methods of the present invention may be used to derive a wide range of electrical and mechanical machine conditions.

Figure 6:
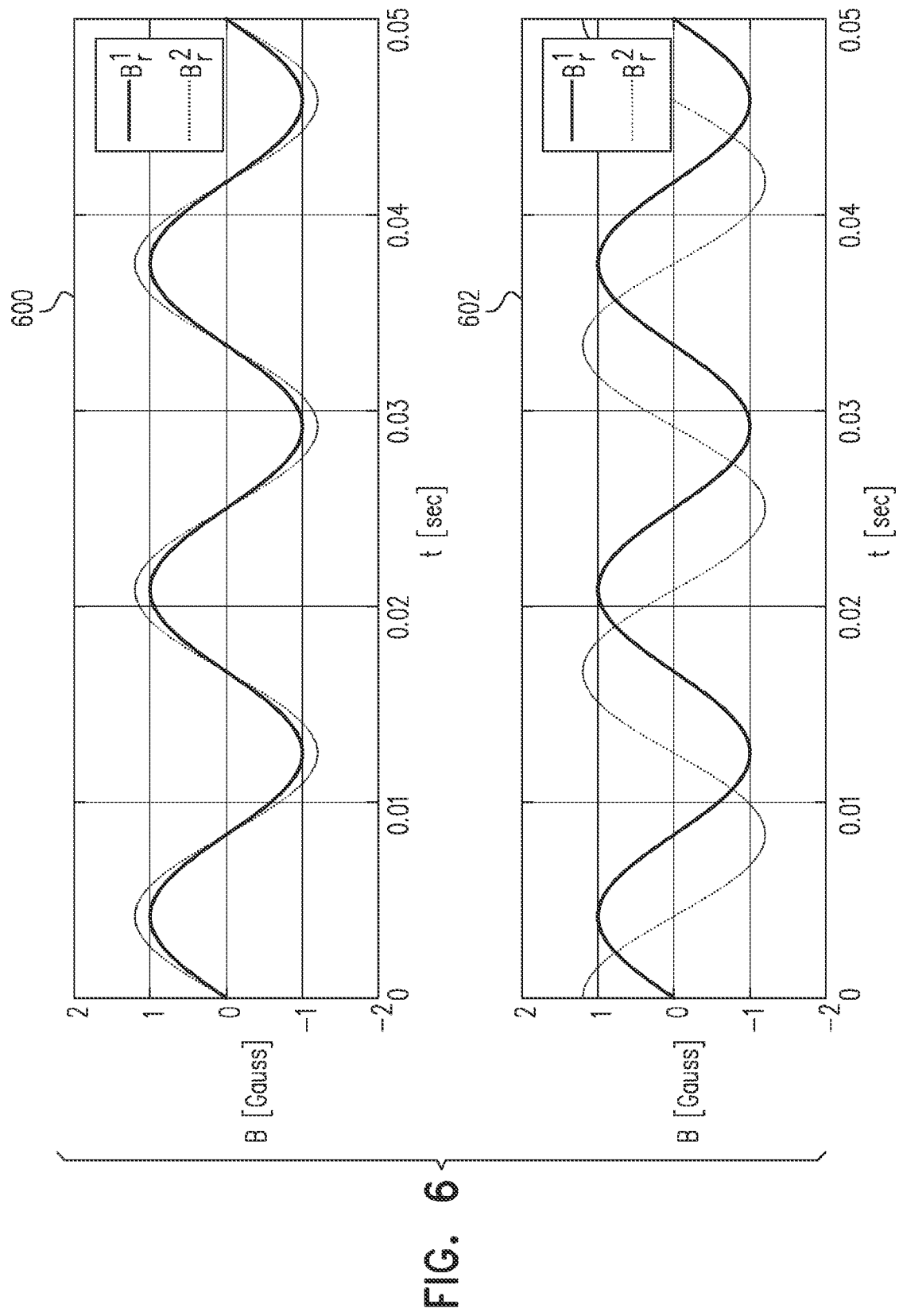
FIG. 6 is a simplified graphical representation of magnetic field data synchronously acquired along multiple channels by a system of any of the types illustrated in FIGS. 1-4, as measured for a properly operating asynchronous electrical machine.

Reference is now made to FIG. 6, which is a simplified graph displaying magnetic field data synchronously acquired along multiple channels by a system of the types illustrated in FIGS. 1-4, as measured for a properly operating asynchronous electrical machine.

As seen in FIG. 6, a first graph 600 and a second graph 602 are provided, both of which first and second graphs 600 and 602 display magnetic field emission signals as synchronously measured along two signal channels by two magnetic field emission sensors 130 associated with asynchronous motor 104. The signal denoted $B_r^1$ corresponds to the radial magnetic field signal as measured by a first magnetic sensor 130, for example included in sensor module 112 and the signal denoted $B_r^2$ corresponds to the radial magnetic field signal as measured by a second magnetic sensor 130, for example included in sensor module 116. It is appreciated that the two magnetic field emission sensors 130 may alternatively be included in a single sensor module 110. It is understood that the radial magnetic field is measured in this case by way of example, due to the typical dominance thereof.

First graph 600 displays magnetic field data as measured by two magnetic sensors 130 located in the same orientation with respect to motor 104, for example, mounted at two ends of motor 104. As seen in graph 600, magnetic signals $B_r^1$ and $B_r^2$ coincide in phase. The amplitude of signals $B_r^1$ and $B_r^2$ is seen to differ slightly, due to the differing distance between each sensor module 112 and 116 and the magnetic pole within motor 104.

Second graph 602 displays magnetic field data as measured by two magnetic sensors 130 located on the same plane of motor 104 in the case that one sensor module is rotated by $\pi/2$ with respect to the other sensor module. The difference in orientation of the sensor modules creates a corresponding constant phase difference of $\pi/2$ between magnetic signals $B_r^1$ and $B_r^2$ in the case of a healthy, properly operating motor 104.

It is appreciated that coincident phase of magnetic signals $B_r^1$ and $B_r^2$ in the case of graph 600 and the constant phase offset of magnetic signals $B_r^1$ and $B_r^2$ in the case of graph 602 indicate motor 104 to be in a properly operating, healthy state. Should motor 104 be in a faulty or impending faulty state, the phase relationship of magnetic signals $B_r^1$ and $B_r^2$ would be disrupted and the amplitude of magnetic signals $B_r^1$ and $B_r^2$ would change. Features of synchronous magnetic data of the type displayed in FIG. 6, including signal phase and amplitude, may thus be used to ascertain that machine 104 is in a properly operating, healthy state. It is appreciated that such analysis is enabled by the synchronous sampling of magnetic signals $B_r^1$ and $B_r^2$.

Figure 7C:
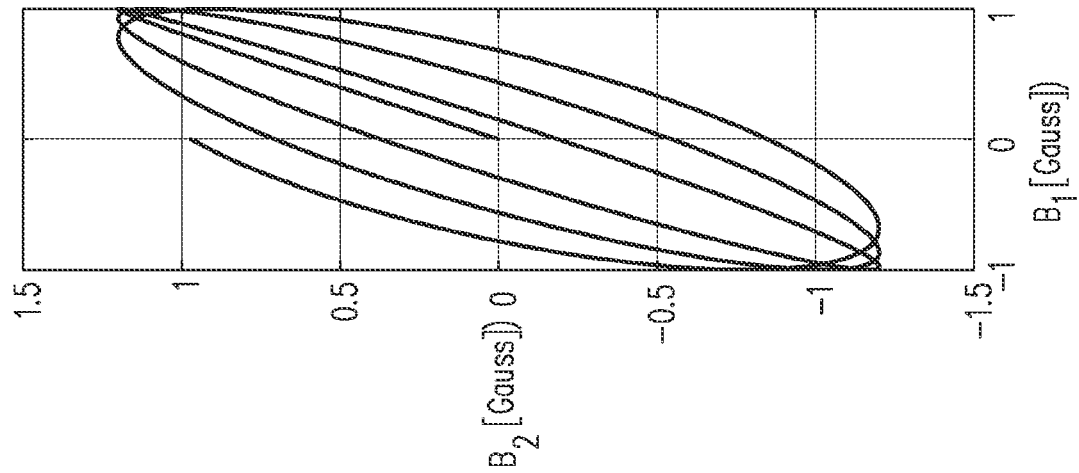
FIGS. 7A, 7B and 7C are respective orbit plots based on data acquired by synchronous magnetic sampling along multiple channels for a properly and improperly operating asynchronous electrical machine, as acquired by a system of any of the types illustrated in FIGS. 1-4.
Figure 7B:
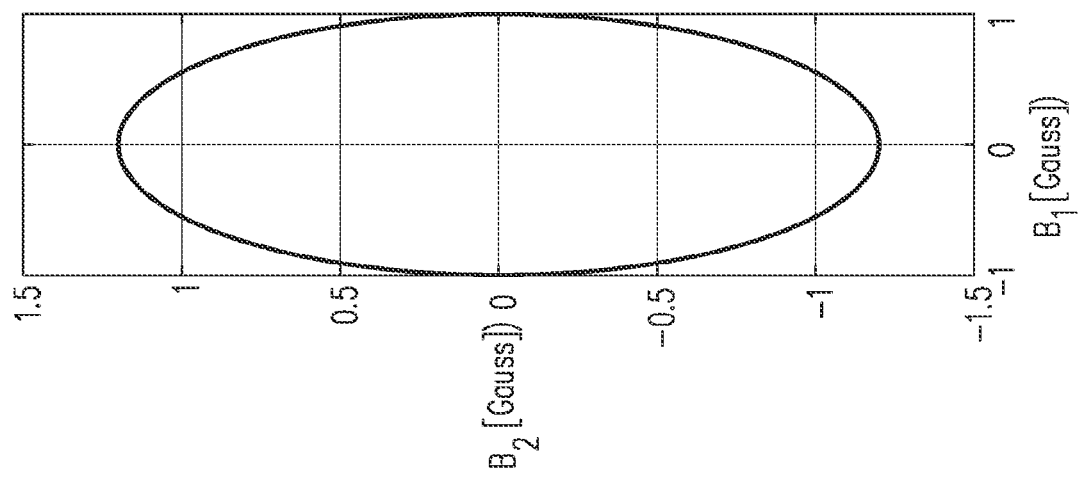
Figure 7A:
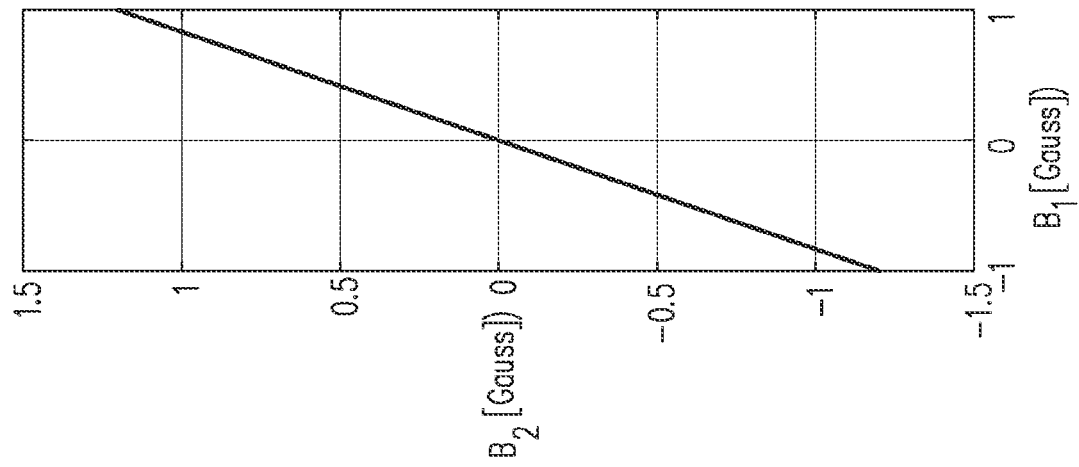

Orbit plots of magnetic signals $B_r^1$ and $B_r^2$ corresponding to the sensor arrangement giving rise to data of graphs 600 and 602 are displayed in FIGS. 7A-7C.

As seen in FIG. 7A, in the case of two magnetic sensors 130 located in the same orientation with respect to motor 104 and therefore with no phase difference therebetween, magnetic signals $B_r^1$ and $B_r^2$ are linearly related when motor 104 operates in a healthy manner. This corresponds to the data presented in graph 600.

As seen in FIG. 7B, in the case of two magnetic sensors 130 located on the same plane of motor 104 where one sensor module is rotated by $\pi/2$ with respect to the other sensor module, thereby creating a corresponding constant phase difference of $\pi/2$, magnetic signals $B_r^1$ and $B_r^2$ have an elliptical relationship when motor 104 operates in healthy manner. This corresponds to the data presented in graph 602. It is appreciated that should magnetic signals $B_r^1$ and $B_r^2$ be of the same amplitude, a circular rather than elliptical relationship would exist therebetween in a healthy machine state.

As seen in FIG. 7C, for the same mounting positions of magnetic sensors corresponding to graph 600 and FIG. 7A, but when motor 104 is in a faulty state, the linear relationship between magnetic signals $B_r^1$ and $B_r^2$ is disrupted and the two field frequencies of $B_r^1$ and $B_r^2$ differ by approximately 5%. This gives rise to the disrupted quasi-elliptical orbit plot of FIG. 7C. The loss of the elliptical relationship between $B_r^1$ and $B_r^2$ indicates a problem in one of the electrical phases of the incoming current. Feature of the orbit plot of FIG. 7C, such as phase and magnitude which may be extracted from the graph of FIG. 7C, may be used to derive the particular nature and severity of the fault. Based on this, faults in a VFD or controller may be detected and analyzed.

It is appreciated that the data presented in FIG. 7C corresponds to data collected over only a relatively short time and thus small number of magnetic signal cycles. As the duration of measurement is increased, the quasi-ellipse of FIG. 7C would be expected to become increasingly distorted.

It is further appreciated that such analysis is enabled by the synchronous sampling of magnetic signals $B_r^1$ and $B_r^2$. Should magnetic signals $B_r^1$ and $B_r^2$ not be synchronously sampled, the construction of orbit plots, such as those shown in FIGS. 7A-7C, would not be possible due to the phase difference between the various magnetic signals due to the sampling regime. It is understood that such phase analysis is highly advantageous in allowing earlier detection of faults than would be possible by other signal analysis methods such as, for example, FFT.

Figure 8:
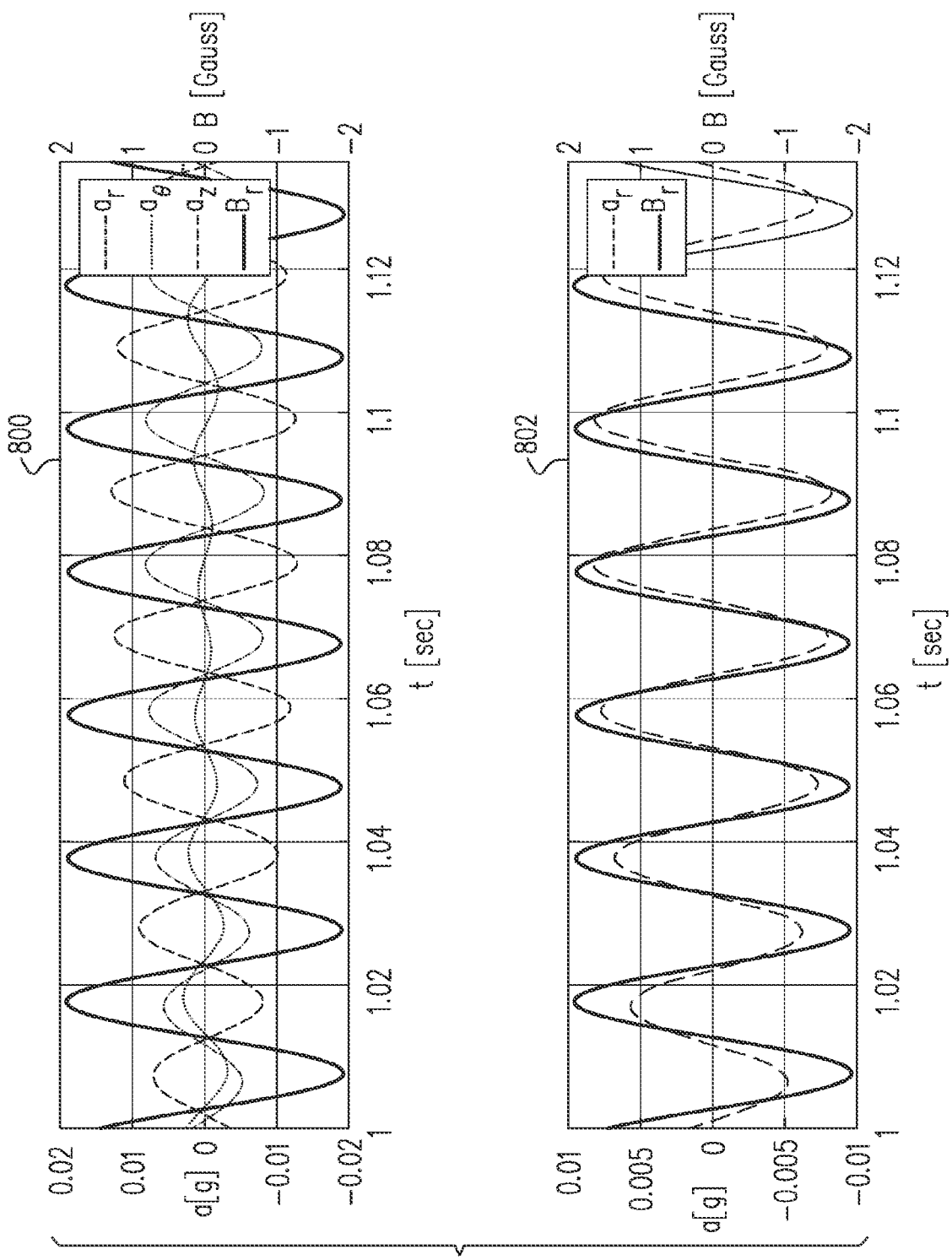
FIG. 8 is a simplified graphical representation of magnetic field data acquired along a single channel and vibrational data synchronously acquired along multiple channels by a system of any of the types illustrated in FIGS. 1-4, as measured for a properly operating asynchronous electrical machine.

Reference is now made to FIG. 8, which is a simplified first and second graph displaying magnetic and vibrational data synchronously acquired along multiple channels by a system of any of the types illustrated in FIGS. 1-4, as measured for a properly operating asynchronous electrical machine.

As seen in FIG. 8, a first graph 800 and a second graph 802 are provided, both of which first and second graphs 800 and 802 display vibration signals as synchronously measured along three signal channels by three vibration sensors in addition to magnetic signals as synchronously measured by a single magnetic sensor, all of which vibration and magnetic sensors are associated with asynchronous motor 104 connected to device 106, which in this case is embodied as a pump.

The signal denoted $B_r$ corresponds to the radial magnetic field signal as measured by magnetic sensor 130, for example included in sensor module 112; the signal denoted $a_r$ corresponds to the radial (vibration) acceleration signal, for example as measured by radial tri-axial vibration sensor 220; the signal denoted $a_\theta$ corresponds to the theta direction (vibration) acceleration signal, for example as measured by theta-direction vibration sensor 222; and the signal denoted $a_z$ corresponds to the z direction (vibration) acceleration signal, for example as measured by z-direction vibration sensor 224. It is understood that the radial magnetic field is measured in this case by way of example, due to the typical dominance thereof. It is appreciated that the data displayed in graphs 800 and 802 thus may correspond to data measured by sensors included in a single sensor module 110.

First graph 800 displays synchronous magnetic and vibration data, filtered in order to show the rpm frequency. The rpm frequency is the frequency of the waves and is given by the reciprocal of the wave cycle period. As seen in graph 800, the magnetic and vibration data is synchronized. Second graph 802 displays synchronous magnetic and radial vibration acceleration data only. As best appreciated from consideration of second graph 802, the magnetic signal $B_r$ varies at a greater rate than the radial (vibration) acceleration signal $a_r$, indicating that the magnetic field speed is greater than the vibration rotation speed. This is as would be expected to be the case for an induction motor, which is an asynchronous AC machine. The difference between the magnetic and vibration signals corresponds to the slip frequency of the induction motor.

Features of synchronous magnetic and vibration data of the type displayed in FIG. 8, including signal phase and amplitude, may be used to ascertain that motor 104 is in a properly operating, healthy state. It is appreciated that such analysis is enabled by the synchronous sampling of magnetic and vibration signals.

Figure 9:
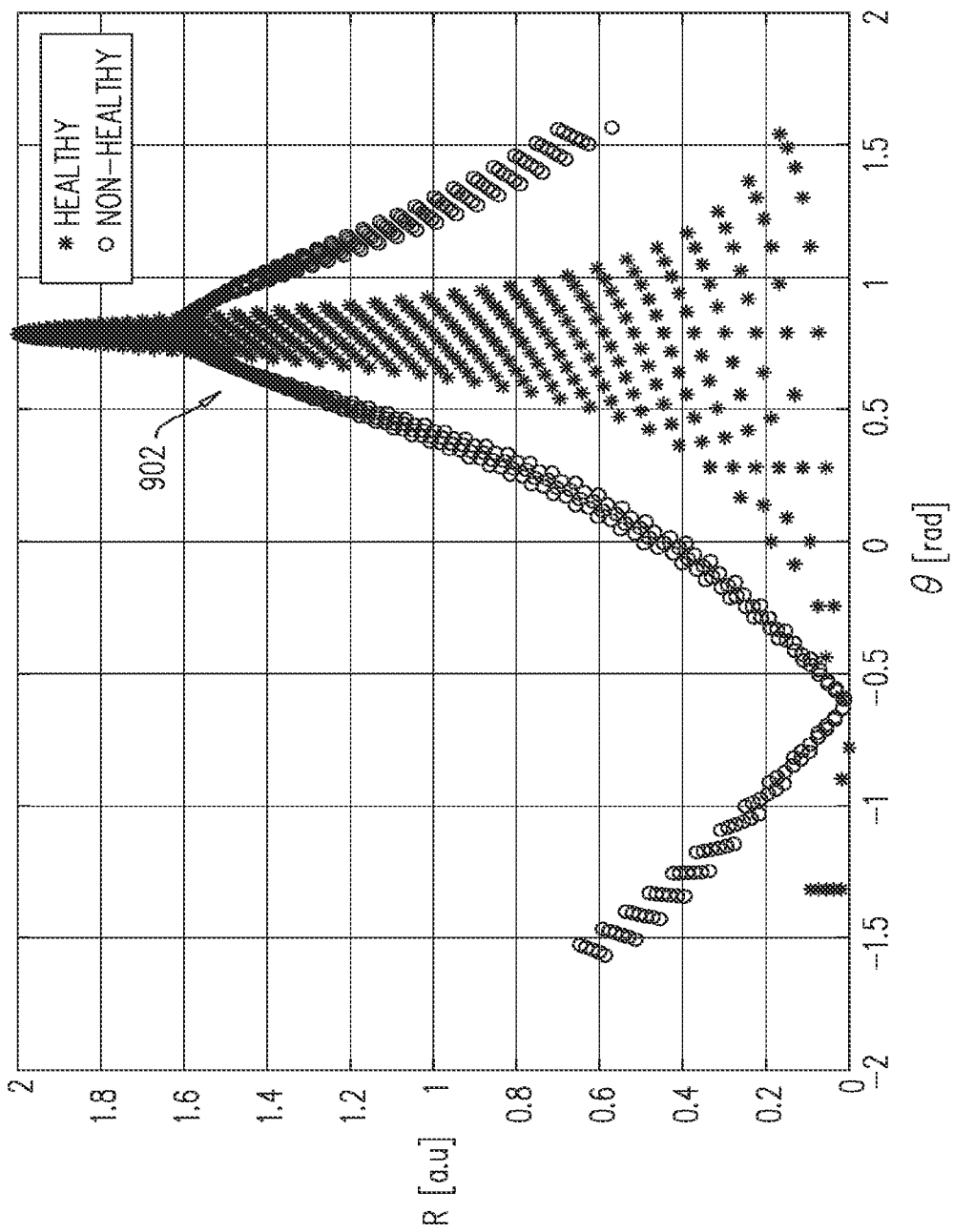
FIG. 9 is a phase plot based on data acquired by magnetic sampling along a single channel and synchronous vibrational sampling along multiple channels for a properly and improperly operating asynchronous electrical machine, as acquired by a system of any of the types illustrated in FIGS. 1-4.

A phase plot for data acquired using the sensor arrangement giving rise to the data of FIG. 8 is displayed in FIG. 9.

Reference is now made to FIG. 9, which is a phase plot based on data acquired by synchronous magnetic and vibrational sampling along multiple channels for a properly and improperly operating asynchronous electrical machine, as acquired by a system of any of the types illustrated in FIGS. 1-4.

As seen in FIG. 9, the relative phase of the relative magnetic and vibration signals θ as measured by a single sensor module 110 is plotted against the sum of the magnetic and vibration signal energies, as represented by the radius R of the orbit plot, for both a healthy and non-healthy asynchronous motor 104. The relative phase may be defined as θ=arctan (magnetic signal/vibration signal). The radius R may be defined as $R=(B^2+V^2)^{0.5}$, where B is the magnetic field and V is the vibration, both measured simultaneously.

In the case of asynchronous motor 104 being in a faulty, improperly operating state, the relative phases are more broadly distributed than for a healthy properly operating state, leading to an increased width of peak seen in a region 902 in the case of an unhealthy motor. This may indicate a mechanical fault in motor 104, such as looseness or a bearing fault. Various statistical measures, such as a comparison of moments of the probability density function, may be used in order to evaluate phase plots such as those shown in FIG. 9, in order to derive the condition, including type and severity of fault, of motor 104.

Figure 10:
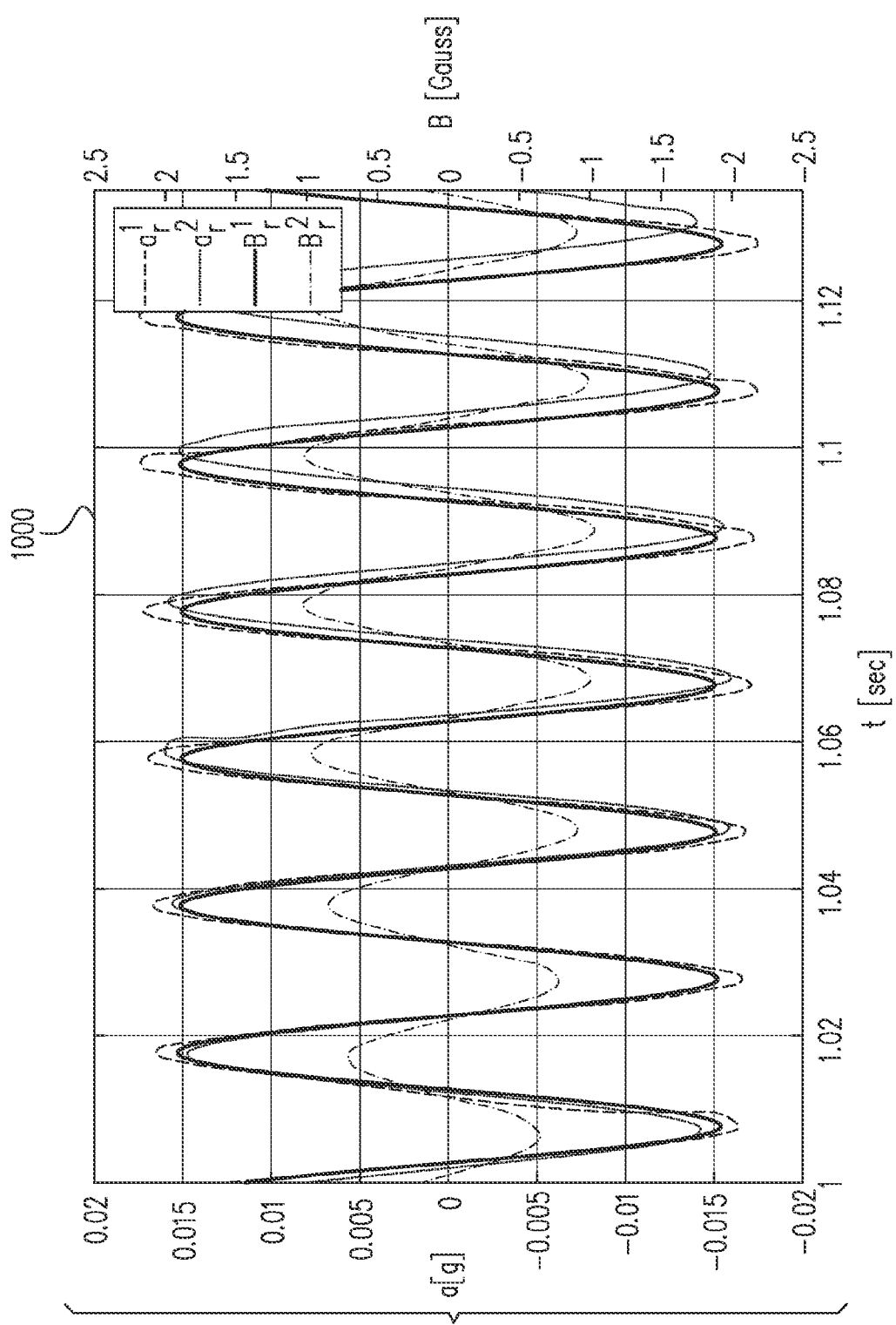
FIG. 10 is a simplified graph displaying magnetic and vibrational data synchronously acquired along multiple channels by a system of any of the types illustrated in FIGS. 1-4, as measured for a properly operating asynchronous electrical machine.

Reference is now made to FIG. 10, which is a simplified graph displaying magnetic and vibrational data synchronously acquired along multiple channels by a system of any of the types illustrated in FIGS. 1-4, as measured for a properly operating asynchronous electrical machine.

As seen in FIG. 10, a graph 1000 is provided displaying synchronous vibration measurements $a_r^1$ and $a_r^2$ for motor 104 and device 106 as measured by two radial vibration sensors, such as one vibration sensor 140 in sensor module 112 mounted on motor 104 and one vibration sensor 140 in sensor module 118 mounted on device 106, and synchronous magnetic field emission measurements $B_r^1$ and $B_r^2$ for motor 104 as measured by two magnetic sensors, such as sensors 130 in sensor modules 112 and 116. It is appreciated that that only the radial components of the measured vibrations are included, for the purpose of clarity, although θ and z-direction vibration signal components may also be measured by such as system.

As appreciated from consideration of graph 1000, the vibration signals are generally synchronized, although a small phase offset is seen between the signals due to real-life influences on the data collected, such as due to the transfer function of motor 104 and device 106. The data displayed in FIG. 10 is filtered in order to show the rpm.

It is appreciated that the almost coincident phase of magnetic signals $B_r^1$ and $B_r^2$ and vibration signals indicate motor 104 and device 106 to be in a properly operating, healthy state. Should motor 104 and/or device 106 be in a faulty or impending faulty state, the phase relationship of magnetic signals $B_r^1$ and $B_r^2$ and of the vibration signals would be disrupted and the amplitude of magnetic and vibration signals would change. Features of synchronous magnetic and vibration data of the type displayed in FIG. 10, including signal phase and amplitude, may thus be used to ascertain that motor 104 and device 106 is in a properly operating, healthy state. It is appreciated that such analysis is enabled by the synchronous sampling of magnetic and vibrational signals.

It is noteworthy that graph 1000 displays synchronized magnetic and vibration data acquired by sensor modules located on connected electrical and mechanical machines, in this case embodied as asynchronous motor 104 and pump 106. This illustrates the utility of synchronous signal acquisition and consequent phase analysis of signals acquired by multiple sensor modules, such as multiple sensor modules 110, located on different machines rather than a single machine, operation of which multiple sensor modules 110 may be synchronized by data acquisition module 150.

Figure 11:
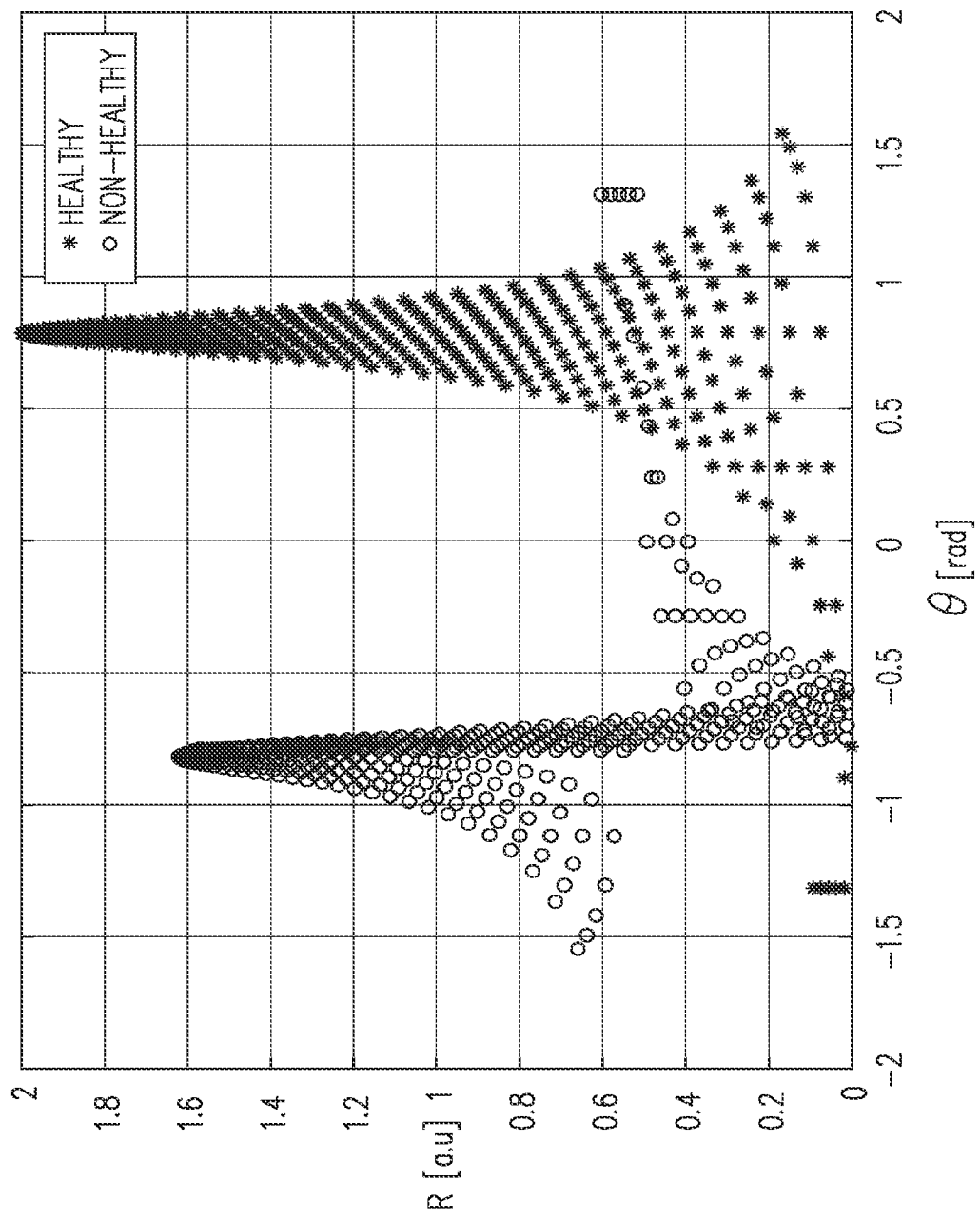
FIG. 11 is a phase plot based on data acquired by synchronous magnetic and vibrational sampling along multiple channels for a properly and improperly operating asynchronous electrical machine, as acquired by a system of any of the types illustrated in FIGS. 1-4.

A phase plot for data acquired using the sensor arrangement giving rise to the data of FIG. 10 is displayed in FIG. 11. Reference is now made to FIG. 11, which is a phase plot based on data acquired by synchronous magnetic and vibrational sampling along multiple channels for a properly and improperly operating asynchronous electrical machine, as acquired by a system of any of the types illustrated in FIGS. 1-4.

As seen in FIG. 11, the relative phase θ between the radial magnetic and vibration signals as measured by two sensor modules 110 is plotted against the sum of the magnetic and vibration signal energies, as represented by the radius R of the orbit plot. In the case of asynchronous motor 104 and pump 106 being in a faulty, improperly operating state, the energy peak is rotated by an angle of approximately π relative to the energy peak of the healthy operating state. This may indicate a misalignment between motor 104 and pump 106. Various statistical measures, such as a comparison of probability density function moments, may be used in order to evaluate phase plots such as those shown in FIG. 11, in order to derive the condition, including type and severity of fault, of motor 104 and/or device 106 connected thereto.

Figure 12:
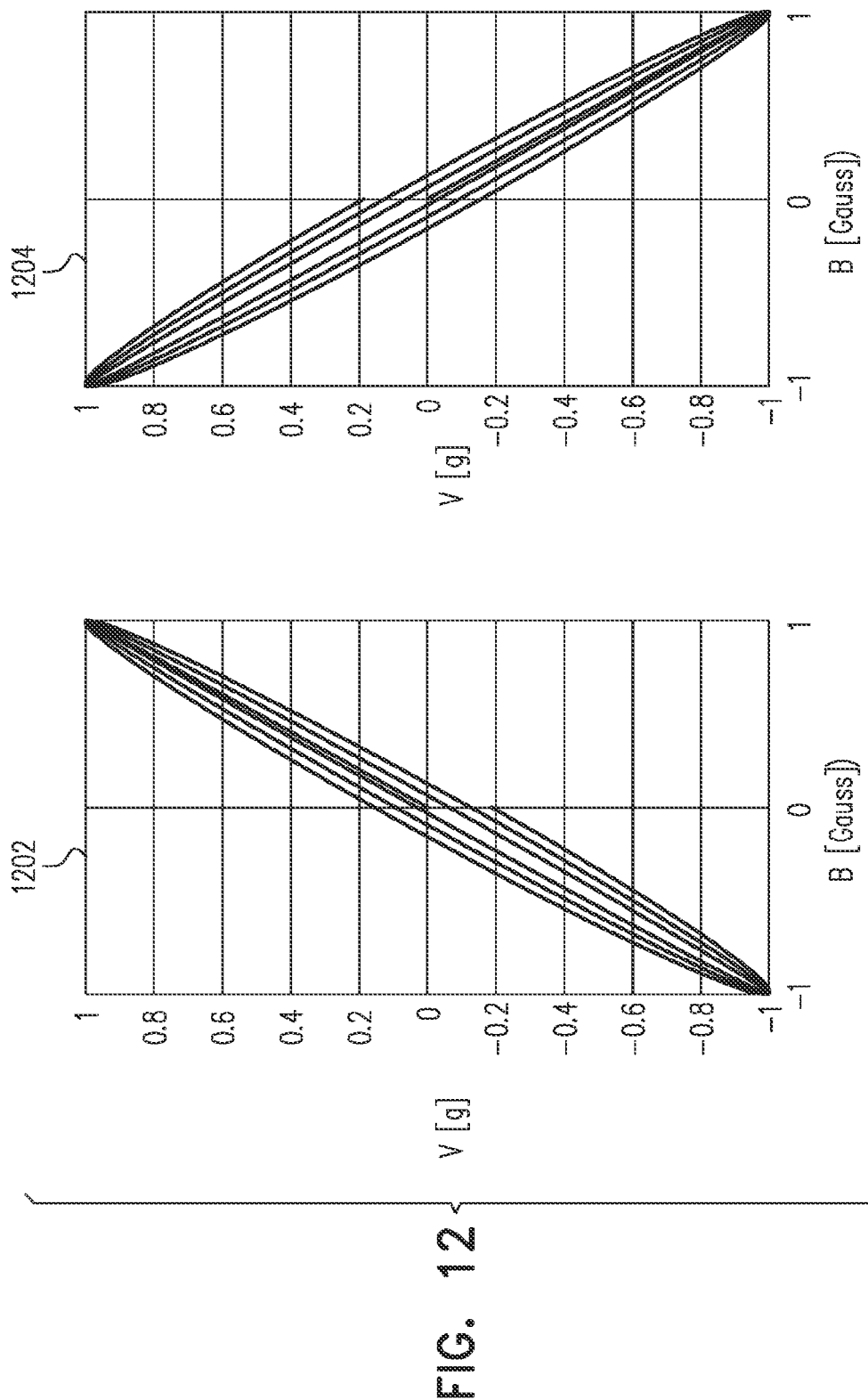
FIG. 12 is an orbit plot representation of data acquired by synchronous magnetic and vibrational sampling along multiple channels for an improperly operating mechanical device coupled to an asynchronous electrical machine, as acquired by a system of any of the types illustrated in FIGS. 1-4.

The same fault identified based on the phase plot of FIG. 11 may also be indicated by an orbit plot of the type shown in FIG. 12. As seen in a first orbit plot 1202 in FIG. 12, when motor 104 and device 106 are in a healthy operating state, the synchronous vibration and magnetic signals are seen to have a well-defined phase relationship. Misalignment between motor 104 and pump 106 which gives rise to a phase difference of π is seen to lead to a rotation of the phase relationship, as seen in a second orbit plot 1204 representing a faulty condition of motor 104 and pump 106.

It is appreciated that in this case, the well-defined phase relationship between the vibration and magnetic signals is maintained during faulty operation. However, the direction of the phase relationship rotates, thus indicating the presence of a fault such as misalignment between the motor 104 and pump 106. It is further appreciated that the detection of a fault such as misalignment between motor and pump based on synchronous magnetic and vibration signals is more accurate than detection of such a fault based on vibration signals alone, due to the reduced influence of the machine transfer function on magnetic signals.

Figure 13:
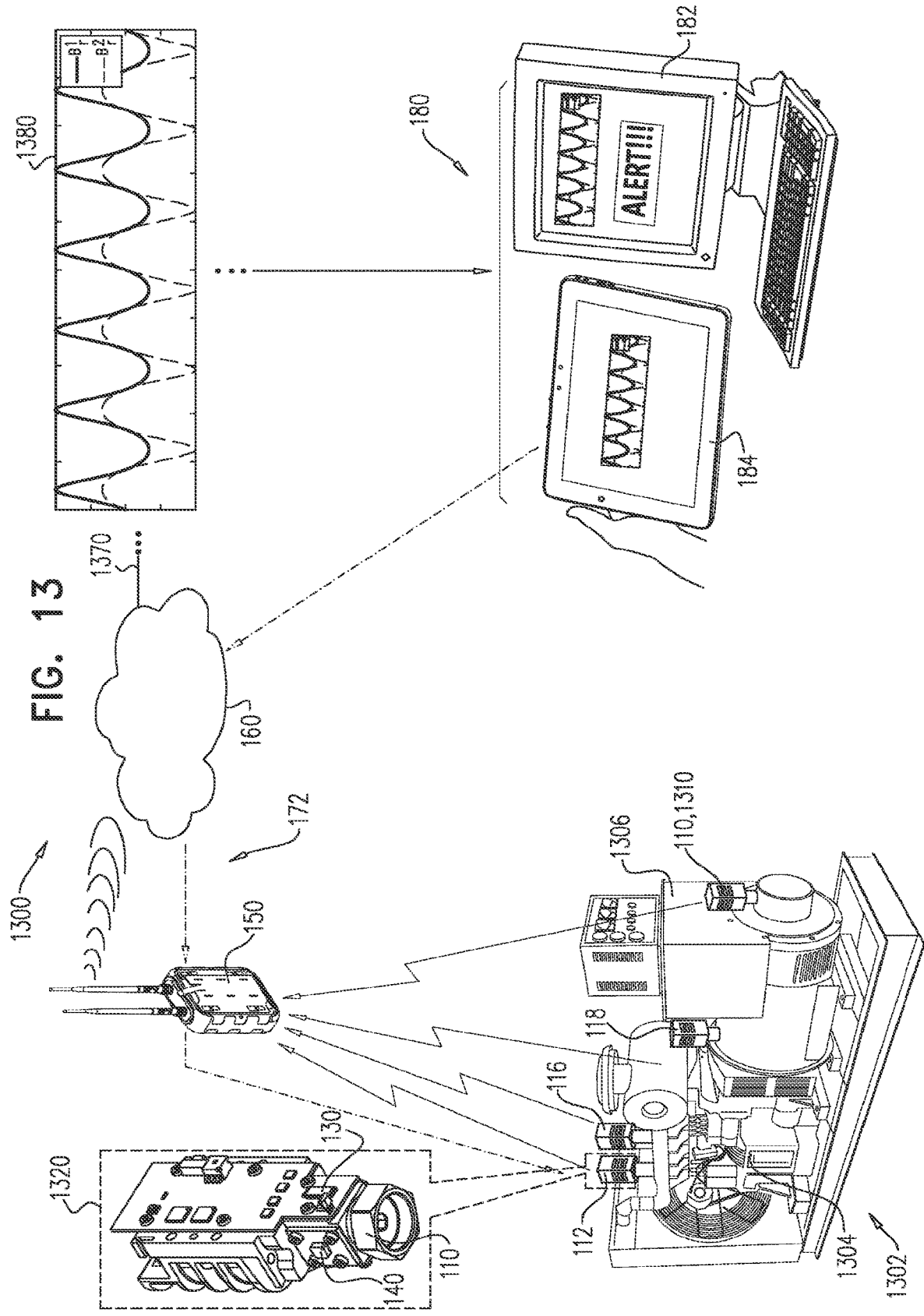
FIG. 13 is a simplified schematic illustration of a system for monitoring a machine, constructed and operative in accordance with another preferred embodiment of the present invention.

Reference is now made to FIG. 13, which is a simplified schematic illustration of a system for monitoring a machine, constructed and operative in accordance with another preferred embodiment of the present invention.

As seen in FIG. 13, there is provided a system 1300 for monitoring, preferably although not necessarily continuously, operation of at least one machine 1302. Machine 1302 may be one or more of a mechanical machine and/or an electrical machine, which electrical machine may be an asynchronous electrical machine, such as an asynchronous motor or generator, or a synchronous electrical machine such as a synchronous motor or generator. Machine 102 may furthermore be embodied as an alternating current (AC) or direct current (DC) electrical machine. Here, by way of example, at least one machine 1302 is seen to be embodied as a synchronous generator 1304 cooperatively coupled to an engine 1306.

It is appreciated that the term synchronous as used herein to refer to a synchronous electrical machine is to be distinguished from the term synchronous as used herein to refer to synchronous signal sampling. As is well known in the art, a synchronous electrical machine is an electrical machine in which the shaft speed is identical to the rotation speed of the magnetic field inside the electrical machine. As described hereinabove, synchronous signal sampling as used herein refers to the sensing of signals by two or more sensors when the sampling difference in time between the sensors is of the order of less than or equal to about $0.01/F_s$ where $F_s$ is the sensor sampling frequency.

Operation of generator 1304 and engine 1306 connected thereto is preferably monitored by at least one sensor module, here embodied as sensor module 110, for sensing operating parameters of at least one of generator 1304 and machine 1306. Here, by way of example, at least one sensor module 110 is seen to be embodied as first sensor module 112 and second sensor module 116 mounted on generator 1304 and third sensor module 118 and a fourth sensor module 1310 mounted on engine 1306. It is appreciated, however, that system 1300 may include a fewer or greater number of sensor modules 110 distributed between generator 1304 and engine 1306.

Sensor modules 112, 116, 118, 1310 are preferably mounted on various locations of the frames of generator 1304 and engine 1306, for example in close proximity to machine bearings. Multiple ones of sensor modules associated with a particular machine, such as sensor modules 112 and 116 associated with generator 1304, may be mounted at mutually similar orientations or may be mounted at different orientations depending on the nature of the operating parameter to be sensed and monitored thereby. Sensor modules 110 may be in physical contact with the machine monitored thereby, as here illustrated to be the case for sensor modules 112, 116, 118, 1310 with respect to generator 1304 and engine 1306. Alternatively, sensor modules 110 may be physically offset from the machine monitored thereby, provided that sensor modules 110 are positioned so as to be capable of sensing at least one operating parameter of the machine to be monitored thereby.

Each sensor module 110 preferably comprises at least one sensor, and more preferably a collection of sensors, for sensing at least one operating parameter of at least one of generator 1304 and engine 1306. As seen most clearly at an enlargement 1320, sensor module 110 may comprise at least one magnetic sensor 130 for sensing magnetic fields emitted by generator 1304. Sensor module 110 may additionally comprise at least one vibration sensor 140 for sensing vibrations arising from generator 1304, engine 1306 or both. Sensor module 110 may further includes additional sensors for sensing a variety of operational parameters including, but not limited to, temperature and acoustic emission, as is detailed henceforth.

It is a particular feature of a preferred embodiment of the present invention that in the case that generator 1304 is monitored by at least two magnetic sensors 130, the at least two magnetic sensors 130 are preferably operative to mutually synchronously sense magnetic fields emitted by the at least one machine being monitored thereby, here embodied as generator 1304, along a corresponding plurality of signal channels. The two or more magnetic sensors 130 may be included in a single sensor module 110 or in multiple individual ones of sensor module 110.

It is a further particular feature of a preferred embodiment of the present invention that in the case that generator 1304 is monitored by at least one magnetic sensor 130 and at least one vibration sensor 140, the at least one magnetic sensor 130 and at least one vibration sensor 140 are operative to synchronously sense magnetic fields and vibrations emitted by the at least one machine being monitored thereby, here embodied as at least one of generator 1304 and engine 1306. The at least one magnetic sensor 130 and at least one vibration sensor 140 may both be included in a single sensor module 110 or in separate ones of sensor module 110.

Further details pertaining to the preferable structure and operation of sensor module 110 are provided hereinabove with reference to FIGS. 1 and 2A-2E.

Sensor module 110 preferably includes communication functionality and is preferably adapted for wireless communication with at least one data processing module 150. Preferably, a single data processing module 150 is operative to receive data in the form of signals from multiple ones of sensor module 110 mounted on at least one machine, here embodied, by way of example as four sensor modules 112, 116, 118 and 1310 mounted on generator 1304 and engine 1306 and all in communication with data processing module 150.

Data processing module 150 may be located remotely from the various sensor modules 110 in communication therewith, provided that data processing module 150 is capable of receiving signals from the various sensor modules 110. By way of example, data processing module 150 may be mounted on the wall of a room in which generator 1304 and engine 1306 are located. Further details pertaining to the preferable structure and operation of data processing module 150 are provided hereinabove with reference to FIGS. 1 and 3A-3C.

At least a portion of the data received at data processing module 150 is preferably transmitted thereby to server 160, typically on the cloud, for processing. Server 160 is preferably operative to receive data from at least one data processing module 150 and to analyze the data in accordance with automatic algorithms, preferably including machine learning algorithms. Analysis of data by server 160 may include processing of information in a cloud server as described in U.S. Pat. No. 9,835,594, filed Oct. 22, 2012 and entitled AUTOMATIC MECHANICAL SYSTEM DIAGNOSIS, the disclosure of which is hereby incorporated by reference.

Analysis of data by server 160 may include the execution of algorithms for detection of a condition of generator 1304 and/or engine 1306, including detection or prediction of mechanical and electrical faults, efficiency analysis and analysis of degradation of performance of generator 1301 and/or engine 1306. Furthermore, analysis of data by server 160 may be used to identify possible security breaches in control of generator 1304 and/or engine 1306, due for example to hacking or other malicious activities directed against generator 1304 and/or engine 1306 via computerized controls thereof.

Further details pertaining to the processing steps performed by server 160 are provided hereinabove with reference to FIGS. 1, 5A and 5B.

At least one of data processing module 150 and server 160 preferably provides an output 1370 based on the analysis performed thereby, which output 1370 preferably includes at least an indication of a condition of the at least one machine being monitored, such as generator 1304 and/or engine 1306.

It is appreciated that, data processing module 150 in combination with server 160 thus preferably constitutes a particularly preferred embodiment of signal analyzer 172, receiving at least a portion of the signals sensed by sensor module 110, performing analysis of the signals and providing an output based on the analysis, which output preferably includes at least an indication of a condition of the at least one machine being monitored.

System 1300 further preferably includes control module 180, receiving the indication of a condition of the machine being monitored from server 160 and/or data processing module 150. Control module 180 may be any computing device, such as a computer 182 or personal communication device 184 illustrated herein. Control module 180 preferably initiates at least one of a repair event on the at least one machine being monitored, an adjustment to a maintenance schedule of the at least one machine and an adjustment to an operating parameter of the at least one machine based on the indication provided thereto.

Here, by way of example, magnetic signal phase analysis performed by server 160 and/or data processing unit 150 may automatically yield an indication of an actual or incipient fault in generator 1304 based on a phase analysis plot 1380. Control module 180 may receive indication of the fault predicted or detected and repair, deactivate or otherwise adjust generator 1304 responsively. It is appreciated that the control actions performed by control module 180 thus preferably serve to improve the efficacy of the at least one machine being monitored.

Examples of various machine conditions identifiable based on analysis by data sensor module 150 and/or server 160 of signal output by at least one sensor module 110 in system 1300 are provided hereinbelow with reference to FIGS. 14-17. More specifically, examples of various synchronous electrical machine conditions identifiable based on analysis of magnetic field emission signals synchronously sensed along a plurality of channels, optionally in synchronous combination with vibration signals, are provided. It is appreciated, however, that the particular faults described hereinbelow are exemplary only and that systems and methods of the present invention may be used to derive a wide range of electrical and mechanical machine conditions.

Figure 14:
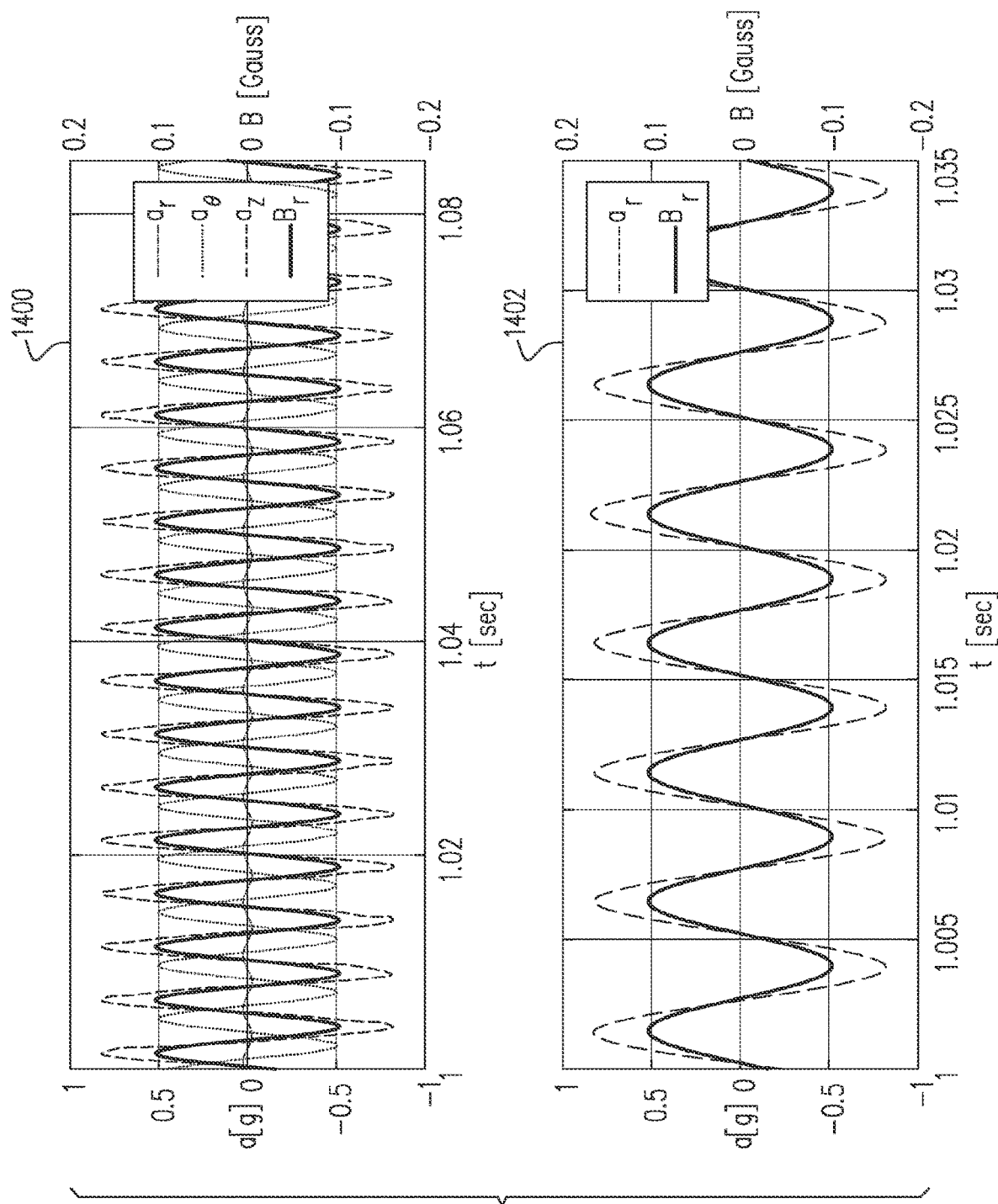
FIG. 14 is a simplified graphical representation of magnetic and vibrational data synchronously acquired by a system of the type illustrated in FIG. 13, as measured for a properly operating synchronous electrical machine.

Reference is now made to FIG. 14, which is a simplified first and second graph displaying magnetic and vibrational data synchronously acquired along multiple channels by a system of the type illustrated in FIG. 13, as measured for a properly operating synchronous electrical machine.

As seen in FIG. 14, a first graph 1400 and a second graph 1402 are provided, both of which first and second graphs 1400 and 1402 display vibration signals as synchronously measured by three vibration sensors in addition to magnetic signals as synchronously measured by a single magnetic sensor, all of which vibration and magnetic sensors are associated with synchronous generator 1304 connected to engine 1306, or any other type of synchronous electrical machine.

The signal denoted $B_r$ corresponds to the radial magnetic field signal as measured by magnetic sensor 130, for example included in sensor module 112; the signal denoted $a_r$ corresponds to the radial vibration acceleration signal, for example as measured by radial tri-axial vibration sensor 220; the signal denoted $a_\theta$ corresponds to the theta direction vibration acceleration signal, for example as measured by theta-direction vibration sensor 222; and the signal denoted a, corresponds to the z direction vibration acceleration signal, for example as measured by z-direction vibration sensor 224. It is understood that the radial magnetic field is measured in this case by way of example, due to the typical dominance thereof. It is appreciated that the data displayed in graphs 1400 and 1402 thus may correspond to data measured by sensors included in a single sensor module 110.

First graph 1400 displays synchronous magnetic and vibration data, filtered in order to show the rpm frequency. The rpm frequency is the frequency of the waves and is given by the reciprocal of the wave cycle period. As seen in graph 1400, the magnetic and vibration data is synchronized. Second graph 1402 displays synchronous magnetic and radial vibration acceleration data only. As best appreciated from consideration of second graph 1402, the magnetic signal $B_r$ varies at the same rate as the radial vibration acceleration signal $a_r$, indicating that the magnetic field speed is identical to the vibration rotation speed. This is as would be expected to be the case for a synchronous generator.

It is appreciated that coincident phase of vibration signals $a_r$ and magnetic signal $B_r$ indicates synchronous generator 1304 to be in a properly operating, healthy state. Should generator 1304 be in a faulty or impending faulty state, the phase relationship between both the vibration signals and the magnetic signals would be disrupted and the amplitude of one or both of the vibration and magnetic signals would change in correspondence with the severity of the fault. Features of synchronous magnetic and vibration data of the type displayed in FIG. 14, including signal phase and amplitude, may thus be used to ascertain that generator 1304 is in a properly operating, healthy state. It is appreciated that such analysis is enabled by the synchronous sampling of magnetic and vibration signals.

Reference is now made to FIGS. 15A and 15B, which are simplified graphs displaying magnetic field data synchronously acquired along multiple channels by a system of the type illustrated in FIG. 13, as respectively measured for a properly operating and improperly operating synchronous electrical machine.

As seen in FIGS. 15A and 15B, a first graph 1500 and a second graph 1502 are provided, both of which first and second graphs 1500 and 1502 display magnetic field emission signals as synchronously measured along two signal channels by two magnetic field emission sensors 130 associated with generator 1304. The signal denoted $B_r^1$ corresponds to the radial magnetic field signal as measured by a first magnetic sensor 130, for example included in sensor module 112 and the signal denoted $B_r^2$ corresponds to the radial magnetic field signal as measured by a second magnetic sensor 130, for example included in sensor module 116. It is appreciated that the two magnetic field emission sensors 130 may alternatively be included in a single sensor module 110. It is understood that the radial magnetic field is measured in this case by way of example, due to the typical dominance thereof.

As seen in graph 1500 of FIG. 15A, in the case of generator 1304 operating properly, magnetic signals $B_r^1$ and $B_r^2$ are of equal phase. In graph 1500, magnetic signals $B_r^1$ and $B_r^2$ are also shown to be of equal amplitude, although it is appreciated that this is not necessarily the case, since amplitude will differ depending on the distance of the sensor from the magnetic poll.

In the case of generator 1304 being in an unhealthy or improperly operating state, an amplitude variation between $B_r^1$ and $B_r^2$ is created, as seen in graph 1502 of FIG. 15B. Such amplitude variation between the magnetic field signals of two magnetic sensors on generator 1304 is indicative of a mechanical fault in generator 1304, such as unbalancing on the vertical axis of generator 1304. The amplitude of the magnetic signal $B_r^1$ may be expressed as $A(B_r^1) = B^1 \sin(\omega t)$ and the amplitude of the magnetic signal $B_r^2$ may be expressed as $A(B_r^2) = B^2 \sin(\omega t + \varphi)$, wherein $\varphi$ is the phase shift of $B_r^2$ with respect to $B_r^1$. In this case, $\varphi$ is equal to $\pi$ and is responsible for the variation in amplitude between $B_r^1$ and $B_r^2$ seen in graph 1502 of FIG. 15B, as a result of unbalancing.

Figure 16A:
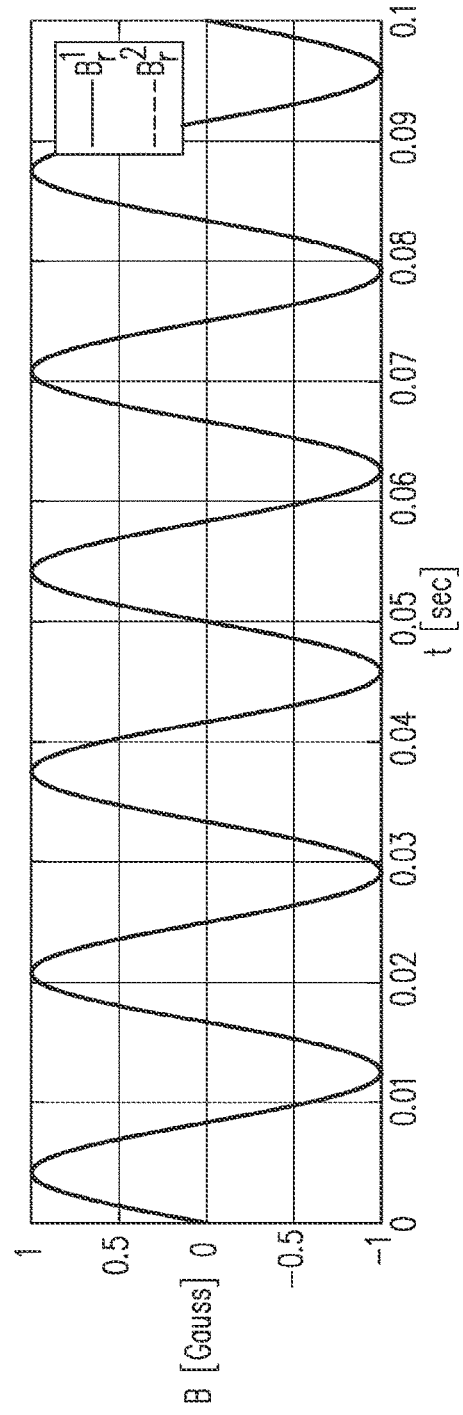
FIGS. 16A and 16B are simplified graphs respectively displaying magnetic field data and vibration data synchronously acquired along multiple channels by a system of the type illustrated in FIG. 13, for an improperly operating synchronous electrical machine.
Figure 16B:
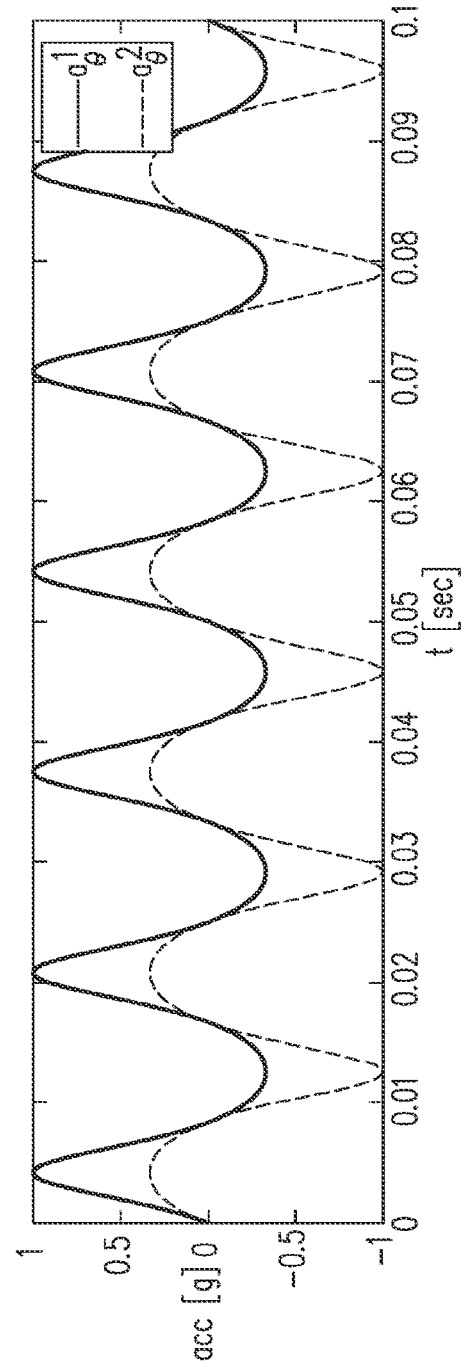

The mechanical problem indicated by data displayed in FIG. 15B may additionally or alternatively be derived based on synchronous magnetic and vibration monitoring of generator 1304, data for which is displayed in FIGS. 16A and 16B. In this case, generator 1304 is preferably synchronously monitored by two magnetic sensors 130 providing magnetic field emission signals $B_r^1$ and $B_r^2$ and two vibration sensors 140 providing vibration acceleration signals $a_{\theta 1}$ and $a_{\theta 2}$. Preferably, pairs of magnetic and vibration sensors 130, 140 are housed in two sensors modules 110 located at either end of a shaft of generator 1304.

As seen in FIG. 16A, the synchronous magnetic field emission signals are of coincident phase and amplitude and therefore do not give an indication of generator 1304 being in a faulty state. However, as seen in FIG. 16B, the vibration signals exhibit an amplitude variation on the horizontal machine axis that differs by a phase shift of $\pi$, as explained hereinabove with reference to FIG. 15B. The presence of such a phase shift indicates unbalancing to be present on the horizontal axis of generator 1304.

Figure 17:
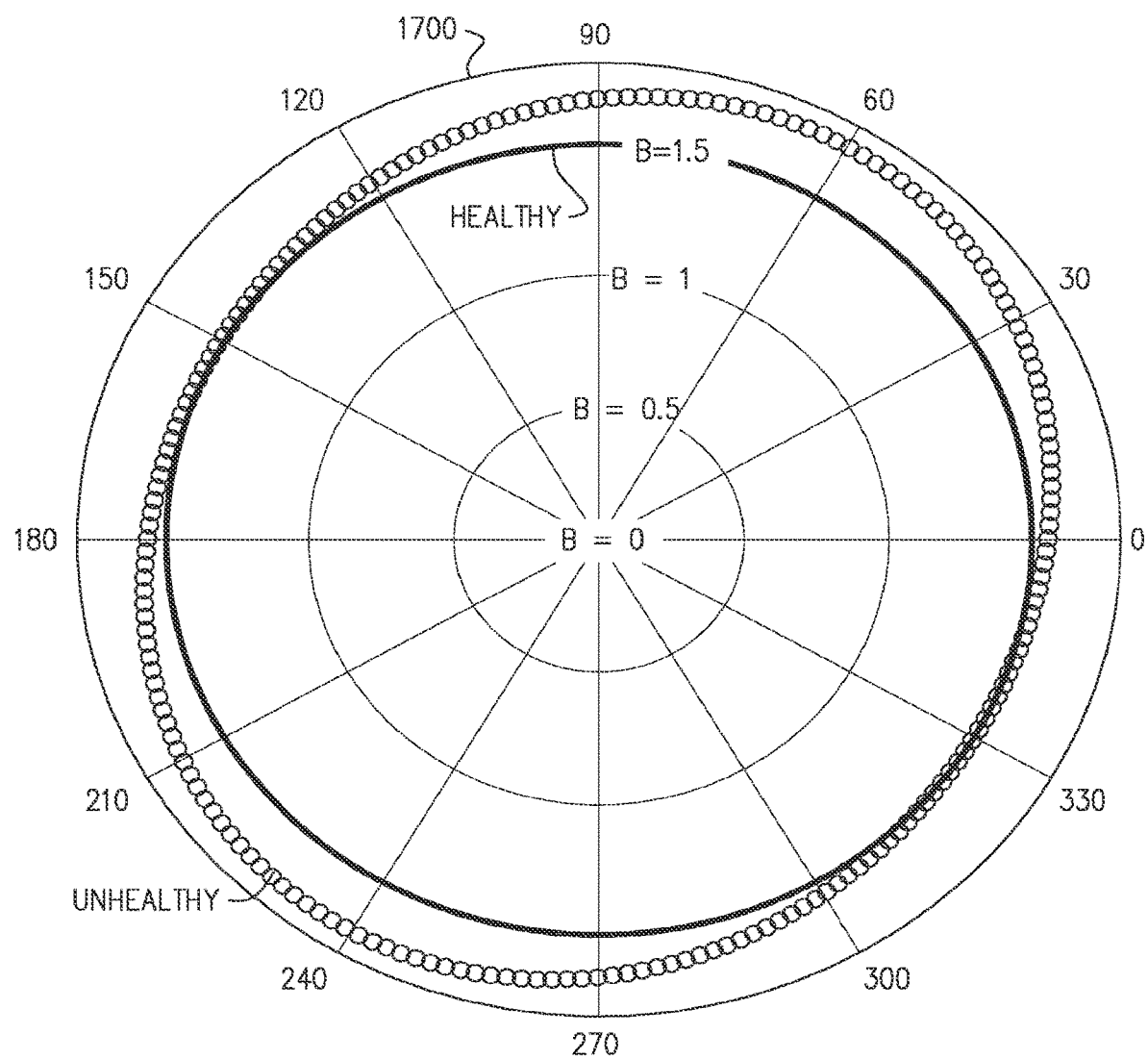
FIG. 17 is a phase plot based on data acquired by synchronous magnetic and vibrational sampling along multiple channels for an improperly operating synchronous electrical machine, as acquired by a system of the type illustrated in FIG. 13.

Reference is now made to FIG. 17, which is an orbit plot for two magnetic field emission signals synchronously measured along two signal channels, as measured for a properly and improperly operating synchronous electrical machine.

As seen in FIG. 17, a graph 1700 is provided displaying magnetic field data as measured by two magnetic field emission sensors 130 located on the same plane of generator 1304, but mutually rotated with respect to each other by $\pi/2$. The magnitude of the magnetic field as a function of angle inside the generator 1304 airgap is plotted in graph 1700. As appreciated from a comparison of the magnetic field data for a properly operating machine to the magnetic field data for an improperly operating machine, the orbit plot of the improperly machine has an elliptical shape in contrast to the circular orbit plot associated with a properly operating machine. The elliptical shape corresponding to the machine in an unhealthy operating state is indicative of a negative phase sequence, which negative phase sequence results in unbalanced rotation of the magnetic field. Such unbalanced rotation would lead to enhanced machine vibrations and thereby cause machine deterioration.

Features of synchronous magnetic data of the type displayed in FIG. 17, including signal phase and amplitude, may thus be used to ascertain the condition of generator 1304 and/or engine 1306. It is appreciated that such analysis is enabled by the synchronous sampling of magnetic signals, thereby facilitating the performance of phase analysis thereon.

It is appreciated that the machine condition derived based on analysis of signals monitored by sensor modules 110 in accordance with embodiments of the present invention is not limited detection of faults in machine operation. Rather, the machine condition derived may also include derivation of the machine energy consumption, machine slip, machine working states and downtimes, machine load and machine efficiency, based on one or more of which control module 180 may adjust operating metrics of the machine 102 being monitored.

Figure 18:
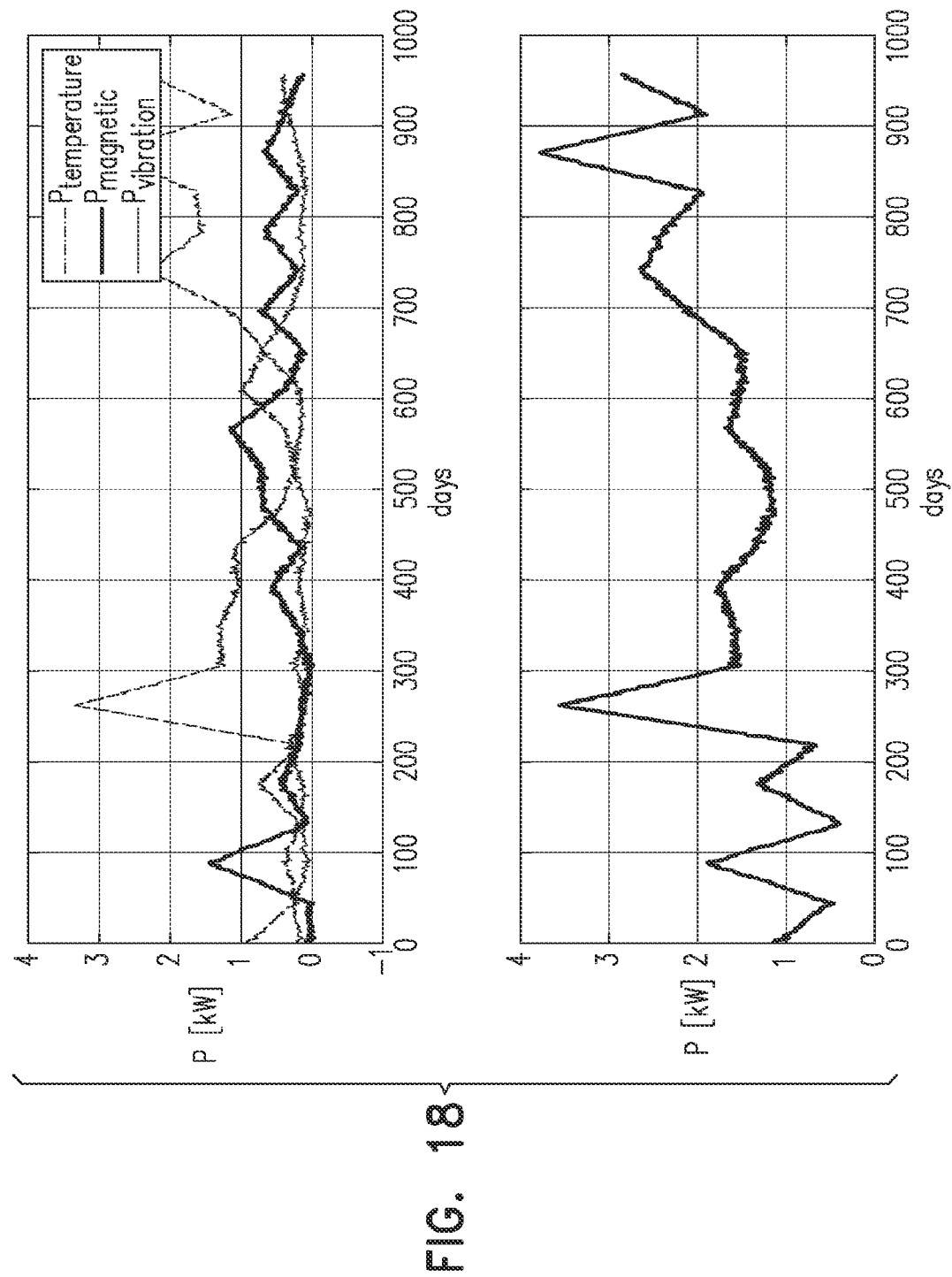
FIG. 18 is a simplified graphical representation of data showing trends in energy consumption for an electrical machine, as acquired by a system of any of the types illustrated in FIGS. 1, 4 and 13.
Figure 19:
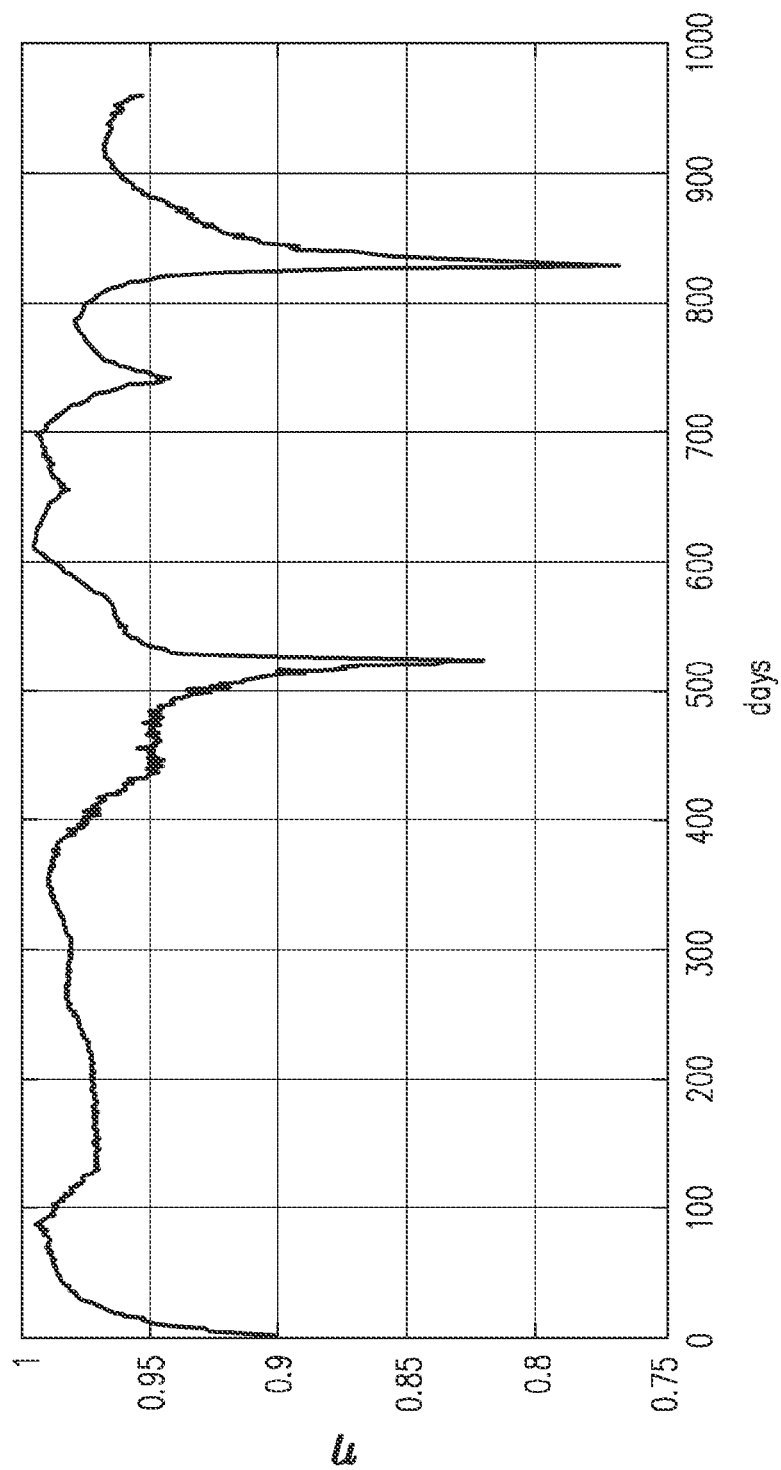
FIG. 19 is a simplified graph displaying data showing trends in efficiency for an electrical machine, as acquired by a system of any of the types illustrated in FIGS. 1, 4 and 13.

Reference is now made to FIG. 18, which displays data showing trends in energy consumption for an electrical machine, as acquired by a system of any of the types illustrated in FIGS. 1, 4 and 13; and to FIG. 19, which is a simplified graph displaying data showing trends in efficiency for an electrical machine, as acquired by a system of any of the types illustrated in FIGS. 1, 4 and 13.

As seen in FIG. 18, energy dissipation in a machine being monitored according to embodiments of the present invention may be measured by multiple sensors, such as magnetic, temperature and vibration sensors included in one or more sensor modules 110 associated with a mechanical or electrical machine, such as a motor or generator.

As seen in FIG. 19, machine efficiency may be calculated by comparing the incoming power supplied to the machine to the power being dissipated by the machine. Incoming power to the machine may be calculated based on the magnetic field signal sensed by at least one magnetic sensor 130, since the magnetic power may be assumed to be proportional to the incoming current driving the machine. The specific relationship between the incoming power and magnetic power may be calibrated in order to take into account power losses due, for example, to eddy currents and attenuation created by the machine shielding.

Various methods may be used for ascertaining machine efficiency. In one possible method, in accordance with a preferred embodiment of the present invention, the acceleration generated by the moving parts inside the machine being monitored may be measured and translated into vibration energy, the machine temperature may be measured and translated into heat, and stray magnetic fields outside the machine may be measured and translated into wasted potential energy. Furthermore, the magnetic signal, which is proportional to the incoming power, may be measured and machine efficiency estimated based thereon.

In order to estimate the energy dissipation clue mechanical vibrations, the machine may be treated as a set of driven damped harmonic oscillators. The acceleration may be defined as $a(\omega)=-a_\omega \sin(\omega t)$, where $a_\omega$ is the acceleration amplitude per frequency. The work that the driving force performs is $dW=Fdx$; F is related to the acceleration by $F=ma$ and $dx$ is the enforced displacement. The total displacement is calculated by $$X_\omega(t) = \int_0^t \int_0^{t'} a_\omega(t'') dt'' dt'$$

Substituting the acceleration in the above expression yields $$X_\omega(t) = \int_0^t \int_0^{t'} -a_\omega \sin(\omega t'') dt'' dt' = \int_0^t \frac{a_\omega}{\omega} \cos(\omega t') dt'$$

The displacement differential is therefore $$dx_\omega = \frac{a_\omega}{\omega} \cos(\omega t) dt$$

and the energy density per frequency is $$dW_\omega = F dx_\omega = ma_\omega dx_\omega = -m\frac{a_\omega^2}{\omega} \cos(\omega t) \sin(\omega t) dt = -m\frac{a_\omega^2}{2\omega} \sin(2\omega t) dt$$

Thus the dissipated power density due to mechanical vibrations is $$P_{vib}(t) = \frac{dW_\omega}{dt} = -m\frac{a_\omega^2}{2\omega} \sin(2\omega t)$$

Summing all frequencies yields $$P_{vib}(t) = -\sum_\omega m\frac{a_\omega^2}{2\omega} \sin(2\omega t)$$

It is noted that the power oscillates at twice the phase of the oscillator since every period has two cycles of energy absorption and dissipation. The average vibration power per frequency may be calculated according to:

$$\langle P_{vib}(\omega) \rangle = m\frac{a_\omega^2}{2\omega} \frac{4}{T} \int_0^{T/4} \sin(2\omega t) dt = m\frac{a_\omega^2}{2\omega} \frac{2\omega}{\pi} \left( \frac{-\cos(2\omega t)}{2\omega} \right)_0^{\pi/2\omega} = \frac{ma_\omega^2}{\pi \omega}$$

The total dissipated power may be calculated by summing the measured frequency components in the acceleration spectrum for each axis $$\langle P_{vib} \rangle = \sum_{i=x,y,x} \sum_\omega m\frac{a_\omega^2(i)}{\pi \omega}$$

With regards to magnetic energy loss. It is noted that most of the driven power in the motor is translated into magnetic energy, which magnetic energy in turn generates currents in the rotor bars. These currents interact with the magnetic field by the Lorenz force causing the rotor to rotate. There are three mechanisms of energy dissipation due to magnetic fields, namely eddy currents heating, hysteresis heating, and wasted potential energy of the stray fields.

The first two of these dissipation mechanisms may be accounted for by the output of a temperature sensor, as further detailed hereinbelow. With regards to the energy loss by the stray fields, it is noted that the potential energy stored in a magnetic field is:

$$E = \frac{1}{2\mu} \int B^2 dV$$

The volume element in cylindrical coordinates is $dv=rd\theta dr dz$ leading to:

$$E = \frac{1}{2\mu} \int_{r_{motor}}^\infty B^2 r dr \int_0^{2\pi} d\theta \int_0^L dz$$

The field at the motor shielding may be expressed as:

$$B = \frac{\mu I}{4\pi} \int \frac{\vec{dl} \times \hat{r}}{r^2} = \frac{\vec{A_0}}{r^2}$$

where $A_0$ is the magnetic field amplitude.

In this treatment, it is assumed that the generated current flows in a long wire with a vector $\vec{dl}$ orthogonal to the machine radius. Furthermore, it is assumed that $$r_{det} - r_{motor} \ll r_{motor}$$

where $r_{det}=r_{motor}+h$ and h is the height of the sensor, $r_{det}$ is the distance from the sensor to the center of the motor and $r_{motor}$ is the radius of the motor. Under these assumptions $A_0$ is fixed and the measured field in the detector is $B(r_{det})=A_0/r_{det}^2$ leading to $A_0=B(r_{det})\cdot r_{det}^2$. Thus, the expression for the magnetic field at any radius is $B(r)=B_{det}\cdot r_{det}^2/r^2$. Substituting B(r) in the expression for the total energy:

$$E = \frac{1}{2\mu} B_{det}^2 \cdot r_{det}^4 \int_{r_{motor}}^{\infty} \frac{1}{r^3} dr \int_0^{2\pi} d\theta \int_0^L dz = \frac{\pi L B_{det}^2 \cdot r_{det}^4}{2\mu r_{motor}^2}$$

Since the magnetic field is frequency dependent, $B(\omega)=B_0 \sin(\omega t)$. Therefore, the magnetic dissipated power is:

$$P_\omega = \frac{dE}{dt} = \frac{\pi L B_{det}^2 \cdot r_{det}^4}{4\mu r_{motor}^2} \cdot \omega \sin(2\omega t)$$

and the averaged dissipated power is given by:

$$\langle P_{magnetic} \rangle = \sum_\omega \frac{\omega L B_{det}^2 \cdot r_{det}^4}{2\mu r_{motor}^2}$$

With regards to power dissipation due to heat loss, it is noted that during normal machine operation, when no mechanical or electrical problems are present, the dissipated power due to heat loss should be the dominant power dissipation mechanism. The various mechanisms of heat transfer, specifically heat conduction thermal radiation, and heat convention may be modeled.

Heat conduction may be calculated using Fourier's law and may be particularly useful for evaluating the thermal conduction in the solid parts of the motor according to $$P_{conduction} = kA\frac{dT}{dx} = k\frac{A}{L}(T_{rotor} - T_{room})$$

where k is the thermal conductivity and A and L are the conduction area and length respectively. Although the rotor temperature is not measured directly, the sensor temperature may be used as a lower limit thereof.

The heat convection may be calculated using Newton's law and may be useful for evaluating the air convection by the motor fan $$P_{convection} = hA(T_{machine} - T_{room})$$

where h is the convection coefficient. An accurate calculation of h requires the detailed structure of the fan and the geometry of the inner parts of the motor to be known. In order to overcome this requirement, a dedicated table with various values of h according to the motor dimensions and rpm may be provided.

For the thermal radiation emitted from the motor shielding/stator the Stephan Boltzmann law may be used:

$$P_{radiation} = \epsilon \sigma A T_{machine}^4$$

where $\epsilon$ is the emissivity and $\sigma$ is the Stephan Boltzmann constant.

In accordance with another preferred embodiment of the present invention, in the case of a motor, by way of example, the rotation of the motor is based on converting the electrical current $I_{in}$ into a rotating magnetic field B(t), which in turn induces current in the rotor bars $I_{rotor}$. The rotor current is coupled with the magnetic field by the Lorentz force $F(t)=I_{rotor} L \times B(t)$ leading to the rotation of the rotor. The rotor speed frequency $f_r$ must be lower than the magnetic field rotation frequency $f_b$, in order for current to be induced in the system. The relative difference in these frequencies is defined as the slip of the system:

$$s = \frac{f_b - f_r}{f_b}$$

$f_r$, $f_b$ may be calculated from the vibration and magnetic spectra, respectively. In the case of adding a load to the system, as when equipment is coupled to the motor, the slip is further increased. Since the slip is proportional to the load of the machine, the slip is also proportional to the power consumed by the motor. By calculating the magnetic energy which is proportional to the incoming power, the machine efficiency may be estimated.

It is appreciated that the various machine conditions, including electrical and mechanical faults described hereinabove with reference to FIGS. 6-12, as relating to asynchronous electrical machines, and with reference to FIGS. 14-17, as relating to synchronous electrical machines, are provided by way of example only. Systems of the present invention, such as systems 100, 400 and 1300 may additionally or alternatively be used in the identification of a wide range of mechanical and electrical faults of synchronous and asynchronous electrical machines.

Furthermore, it is understood that although systems of the present invention may advantageously allow the performance of phase analysis on data sensed thereby, due to the synchronous sampling of operational parameters by a plurality of sensors, such phase analysis is not necessarily performed by systems of the present invention.

Figure 20:
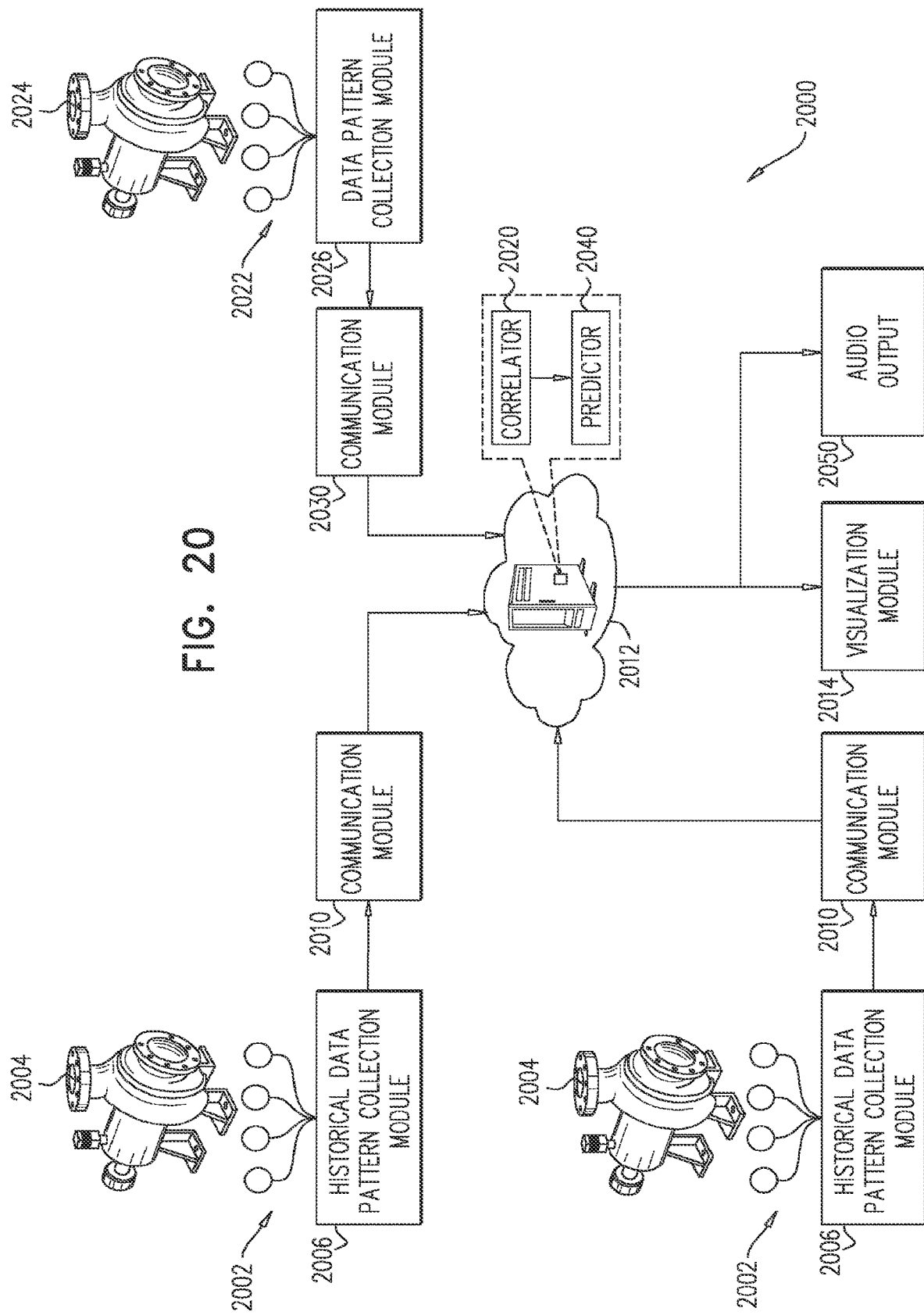
FIG. 20 is a simplified schematic illustration of a system for monitoring multiple machines, constructed and operative in accordance with yet another preferred embodiment of the present invention.

Reference is now made to FIG. 20, which is a simplified illustration of a system for automated monitoring of a machine, constructed and operative in accordance with another preferred embodiment of the present invention.

As seen in FIG. 20, there is provided a system 2000 for identifying potential failures and providing pre-failure alerts for at least one machine having at least one shared mechanical or electrical characteristic with a plurality of machines. System 2000 preferably includes a plurality of operational parameter sensing modules, such as operational parameter sensing modules 2002, associated with a plurality of machines having at least one common mechanical or electrical feature, such as mechanical machines 104, here embodied by way of example as pumps.

It is appreciated, however, that plurality of machines 104 may alternatively comprise a plurality of electrical machines, which electrical machines may be synchronous or asynchronous electrical machines including motors or generators. Alternatively, plurality of machines 2004 may include a combination of mechanical and electrical machines, which mechanical and electrical machines may be interconnected, such as a generator connected to an engine or a motor connected to a pump.

Plurality of machines 2004 may include two or more machines, here illustrated, for the sake of simplicity, as comprising only two machines. Plurality of machines 2004 preferably share at least one common mechanical or electrical feature, such as, by way of example, a common mechanical structure (e.g. centrifugal pump), machine type (e.g. part number), environmental feature such as location (e.g. collocated machines), operating parameters or performance characteristics (such as load, temperature/humidity), operational purpose (e.g. machines working on similar tasks or in parallel on the same task), similar or identical constituents (e.g. same or similar motor, pump).

Machines 2004 may be of the same type, as in the case of pumps 2004 shown in FIG. 20. Alternatively, machines 2004 may be of different types, provided that machines 2004 have at least one common mechanical or electrical feature.

Each one of operational parameter sensing modules 2002 is preferably respectively associated with an individual one of pumps 2004. Each one of operational parameter sensing modules 2002 is preferably configured and operative to provide output indications of at least one operational parameter of each of plurality of machines 2004. Particularly preferably, each one of operational parameter sensing modules 2002 is operative to provide historical output indications of at least changes over time in at least one operational parameter of each of plurality of machines 2004.

By way of example, operational parameter sensing modules 2002 may provide output indications of patterns of change over time in one or more of machine temperature, vibrations, acoustic emissions, currents, voltages, magnetic or electromagnetic flux. Operational parameter sensing modules 2002 preferably comprise one or more sensors for respectively sensing the one or more operational parameters of the machine with which the sensing modules are associated. For example, in one preferred embodiment of the present invention, operational parameter sensing modules 2002 may include a combination of some or all of vibration, acoustic, ultrasonic, magnetic, electromagnetic, current and temperature sensors.

Data relating to at least one operational parameter of each of plurality of machines 2004, and particularly preferably data relating to changes over time in the at least one operational parameter of each of plurality of mechanical machines 2004, as sensed by sensors of each of operational parameter sensing modules 2002, is preferably collected by a plurality of data collection modules 2006. Each data collection module 2006 may form a part of a corresponding operational parameter sensing module 2002. Alternatively, each data collection module 2006 may be provided as a distinct entity, separate from the operational parameter sensing module 2002 with which it is associated.

By way of example, operational parameter sensing module 2002 including data collection module 2006 may be embodied as an Auguscope(™), commercially available from Augury Systems Ltd, the assignee of the present application. Alternatively, operational parameter sensing module 2002 including data collection module 2006 may be embodied as sensor module 110. Operational parameter sensing module 2002 may be installed, either permanently or temporarily on each one of mechanical machines 2004.

Output indications relating to at least one operational parameter of each of plurality of machines 2004 and particularly preferably historical output indications relating to changes over time in at least one operational parameter of each of plurality of mechanical machines 2004, as sensed by operational parameter sensing modules 2002 associated with each one of machines 2004, are preferably transmitted by a communication module 2010 to a server 2012, typically on the cloud, for processing. Communication module 2010 may be incorporated within data collection module 2006 or may be provided as a separate component. For example, communication module 2010 may be embodied as data processing module having communication functionality incorporated therein. Server 2012 is particularly preferably embodied as server 160, and preferably includes algorithmic processing capabilities.

In order to reduce the quantity of data being transmitted to server 2012, processing may initially be performed locally at data collection module 2006 or at communication module 2010. Such local processing may include comparing a current recording of an operational parameter with historical recordings of that operational parameter of machine 2004 and sending the data relating to the current recording to the server 2012 only in case that the data relating to the current recording is significantly different than historical recordings.

Historical data from all of the sensing modules 2002 is preferably collected at the server 2012 for each machine 2004. At the server 2012, the data is analyzed by automatic software algorithms which generate results and present the generated results to users using a visualization module 2014, which may be a smartphone or a web application. In addition system 2000 may include audio output capabilities for sound playback 2015.

In addition to processing of information in a cloud server as described in U.S. Pat. No. 9,835,594, filed Oct. 22, 2012 and entitled AUTOMATIC MECHANICAL SYSTEM DIAGNOSIS, the disclosure of which is hereby incorporated by reference, there is additionally provided, in accordance with preferred embodiments of the present invention, an automatic algorithm that analyzes historical data and events on the machines 2004 and finds similar historical patterns. These types of patterns may be derived using Markov chains or similar algorithms.

More specifically, the processing of data in the cloud server 2012 preferably includes correlating, by a correlator 2020, patterns of changes in the at least one operational parameter in ones of the plurality of machines to past failures in corresponding ones of said plurality of machines and providing a correlation output indication. Analysis of repeating patterns in historical measurements between machines and correlation of these measurements to machine failures serves to provide valuable information in diagnosis of similar machines sharing mechanical or electrical characteristics with the measured machines.

In some embodiments of the present invention, results of automatic software algorithms may be provided to local processing components such as data collection module 2006 or communication module 2010, so as to allow correlating and predicting functionalities to be performed locally, thus obviating or reducing the need for transfer of data to server 2012.

System 2000 further preferably includes an operational parameter sensing module 2022 associated with a given machine 2024 having at least one mechanical or electrical feature in common with machines 2004, for providing an individual output indication of at least one operational parameter, and particularly preferably of at least a change over time in the at least one operational parameter of the given machine 2024. Data relating to changes over time in the at least one operational parameter of given machine 2024, as sensed by sensors of operational parameter sensing module 2022, is preferably collected by a data collection module 2026. The individual output indication from operational parameter sensing module 2022 is preferably provided to server 2012 via a communication module 2030. It is appreciated that operational parameter sensing module 2022, data collection module 2026 and communication module 2030, may be generally of the same type as operational parameter sensor modules 2002, data collection modules 2006 and communication modules 2010. Particularly preferably, operational parameter sensing module 2022 is embodied as sensor module 110 and communication module 2030 is embodied as data processing module 150 having communication functionality incorporated therein.

The processing of information at server 2012 preferably additionally includes predicting functionality, by a predictor 2040, operative to receive the correlation output indication from correlator 2020 and the individual output indication from operational parameter sensing module 2022 associated with given machine 2024. Predictor 2040 preferably provides a predictive output indication of an impending failure of given machine 2024 by applying the correlation output indication established based on plurality of machines 2004 to the individual output indication of given machine 2024, based on a similarity between the change over time in the at least one operational parameter of the given machine 2024 indicated by the individual output indication and the patterns of changes over time in the least one operational parameter of the plurality of machines 2004.

Visualization module 2014 may be embodied as a notification module, for providing notification of a status of the given machine 2024 based on the predictive output indication provided by predictor 2026. At least one of control, repair or maintenance activities are preferably performed upon given machine 2024 in accordance with the notification. In one embodiment, the notification may be a human-sensible notification and the control, repair or maintenance activities be manually or automatically performed in response to and in accordance with the notification. Additionally, in accordance with an embodiment of the invention, the system described may feedback the output of predictor 2040 to a controller of given machine 2024 in order to modify the machine operation.

In one possible embodiment, signals collected by sensing module 2022 are enhanced at server 2012 and played using audio playback capabilities at an audio module 2050. Such enhancement may be associated with the output of the correlator 2020 or predictor 2040, such that at least one characteristic of the audio signal corresponding to the predictive output indication of predictor 2040 is selectively enhanced. By way of example, sensing module 2022 may include a microphone or vibration accelerometer. Upon detection of mechanical or electrical malfunction by correlator 2020 and/or predictor 2040, such as, for example, a bearing fault, the signal features related to the malfunction may be selectively emphasized in the signal and an augmented signal played using audio playback capabilities module 2050. The playback of an augmented signal by audio module 2050 is preferably performed in parallel to notification and visualization of the signal at visualization module 2014.

Such enhancement may, by way of example, be generated by amplifying signal frequencies related to the mechanical or electrical malfunction while suppressing all other frequencies. An augmented audio signal may significantly aid a human analyst in data analysis.

Figure 21:
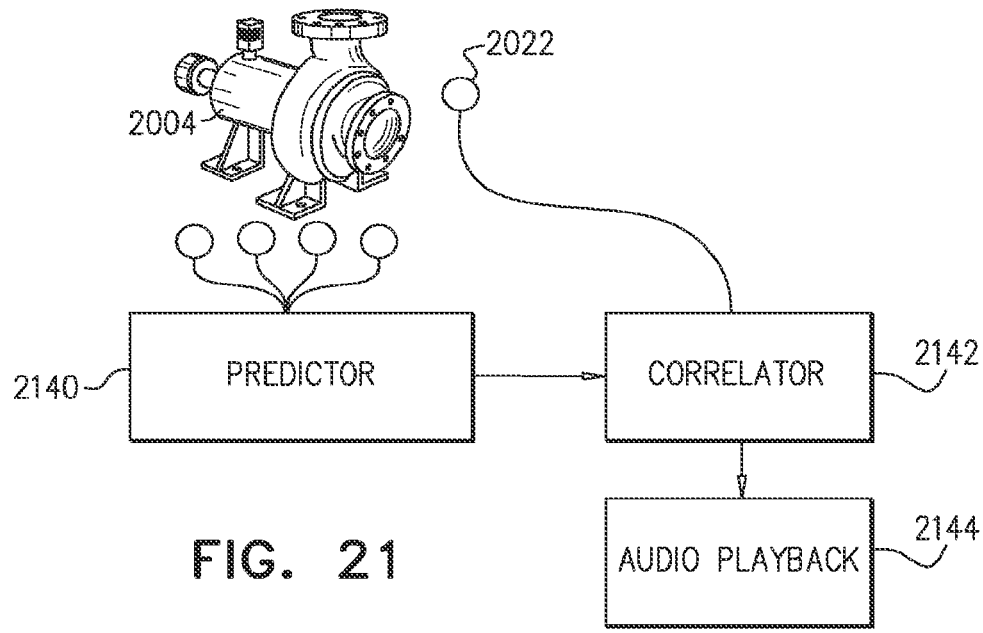
FIG. 21 is a simplified schematic partially pictorial, partially block diagram illustration of a portion of the system illustrated in FIG. 20, constructed and operative in accordance with a preferred embodiment of the present invention.
Figure 22:
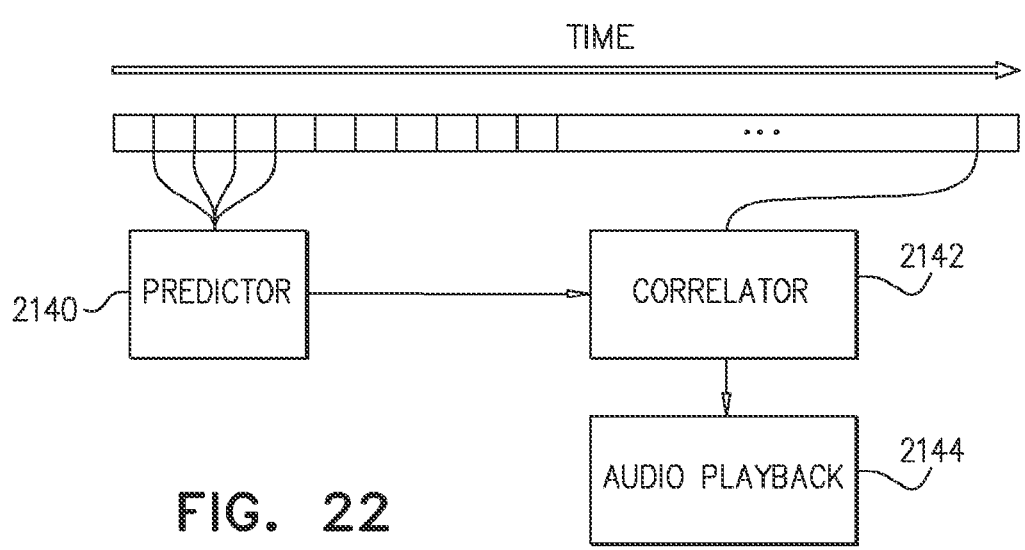
FIG. 22 is a simplified schematic partially pictorial, partially block diagram illustration of a portion of the system illustrated in FIG. 20, constructed and operative in accordance with another preferred embodiment of the present invention.

In accordance with one preferred embodiment of the present invention, data, such as magnetic or vibration signals, are predicted by a predictor module, such as a predictor module 2140 of FIGS. 21 and 22. The predicted data predicted by predictor module 2140 is subsequently correlated by a correlator 2142 to actual measured data provided by at least one sensor module such as sensor module 2022.

Based on the correlation, previously known signal components may be removed and new signal components, associated with a developing fault, enhanced at an audio playback module 2144. Such audio enhancement may be applied to an individual recording, as illustrated in FIG. 21, or to a continuous recording, as illustrated in FIG. 22.

Given machine 2024 is illustrated here as being outside of the group of historically monitored machines 2004, in order to distinguish given machine 2024 therefrom. Given machine 2024 may indeed be outside of the group of historically monitored machines 2004. Impending failure of given machine 2024 may be diagnosed by applying a correlation to data collected from given machine 2024, which correlation has been established based on historical patterns in data collected from group of machines 2004 having at least one mechanical or electrical characteristic in common with given machine 2024. Alternatively, given machine 2024 may be included in the group of historically monitored machines 2004. In this case, given machine 2024 may contribute data relating to historical changes in at least one operational parameter, based on which data relating to historical changes a correlation may be established and then applied to given machine 2024.

It is appreciated that system 400 described hereinabove with reference to FIG. 4 may be considered to be one possible implementation of system 2000. In the case that system 2000 is implemented as a crowd-sourcing system as shown in FIG. 4, plurality of machines 2004 may include plurality of electrical machines 402 having at least one shared electrical characteristic. Operational parameter sensing modules 2002 may include a plurality of magnetic sensors, such as magnetic sensors 130 in sensor modules 110, coupled to the corresponding plurality of electrical machines 402 having at least one shared characteristic for sensing magnetic fields generated thereby, the plurality of magnetic sensors 130 preferably providing output indications of the magnetic fields of the corresponding plurality of electrical machines 402. Plurality of magnetic sensors 130 are preferably included in sensor modules 110, operating synchronously as described hereinabove. Operational parameter sensing modules 2002 may additionally include a plurality of vibration sensors 140 operating synchronously with plurality of magnetic sensors 130.

Processing at data collection module 2006 and/or cloud server 2012 may include correlating functionality, wherein the output indications of the magnetic fields of the corresponding plurality of electrical machines 402 are received at correlator 2020 and a correlation output indication of a correlation between the magnetic fields and past failures of corresponding ones of the plurality of electrical machines 402 is provided.

Operational parameter sensing module 2022 associated with given machine 2024 having at least one mechanical or electrical feature in common with machines 402 may include at least one magnetic sensor 130 associated with given electrical machine 2024 having the at least one shared characteristic for providing an individual output indication of magnetic fields generated by the given electrical machine. Operational parameter sensing module 2022 associated with given machine 2024 may additionally include at least one vibration sensor 140 operating synchronously with the at least one magnetic sensor 130 in sensor module 110.

Processing at data collection module 2006 and/or cloud server 2012 may further include predicting functionality, wherein the correlation output indication and the individual output indication are received by predictor 2040 and a predictive output indication is provided. The predictive output indication may include an indication of an impending fault, the impending fault comprising at least one of a crawling fault, eccentricity, a damaged rotor bar, a stator short, electrical discharge, mechanical imbalance, energy loss, negative phase sequence and faults arising from extremum operating conditions, as detailed hereinabove with reference to FIG. 4. The predictive output indication may additionally or alternatively include a prediction of time to failure of the given electrical machine, based on applying the correlation output indication to the individual output indication.

Figure 23:
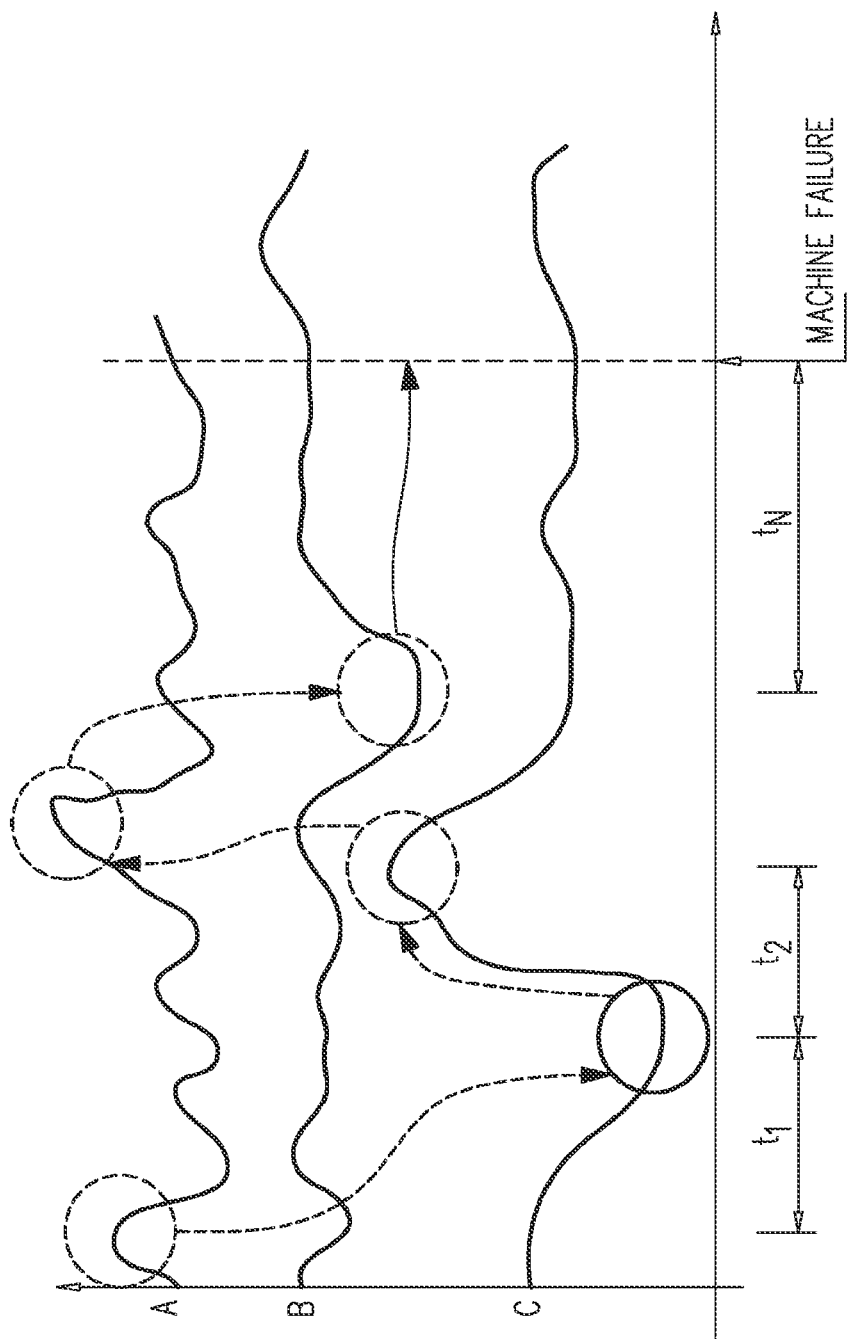
FIG. 23 is a simplified visualization of a concept of event driven machine diagnosis.

Prediction of time to failure, based on historical changes in operational parameters, may be better understood with reference to FIG. 23.

Reference is now made to FIG. 23, which is a simplified graphical presentation of patterns of change in operational parameters of a mechanical or electrical machine prior to machine failure.

As seen in FIG. 23, operational parameters A, B, and C may be collected from one or more than one machine. By way of example, for wide-band signals such as vibration, acoustic, ultrasonic, magnetic and electromagnetic signals, parameters A, B, and C may be energy at specific frequencies or energy in predefined frequency bands. For narrow-band signals, such as temperature, humidity, or concentration of specific particulates in the air, parameters A, B and C may correspond to an average value over a specified time period or an exponentially weighted average or any higher level moments such as variance or skewness. For images, such as thermographic images for example, parameters may be average RCB levels of the pixels related to a particular component. Parameters A, B and C may be collected synchronously for a particular machine or non-synchronously for a particular machine. Parameters A, B and C may also be collected synchronously for a group of machines having a common mechanical feature or non-synchronously for a group of machines having a common mechanical feature. Particularly preferably, parameters A, B and C may be collected by sensor module 110 in communication with data processing module 150 and cloud server 160, as described hereinabove with reference to FIGS. 1-5.

These operational parameters may be measured and values thereof calculated based on data collected from the one or more machines. Various data handling methods may be applied to the data collected including various different types of transformations such as, for example, derivatives of smoothed raw data, measurement of overall vibrations at various ranges of frequencies, values from FFT calculated spectra and the derivatives thereof and others.

Diagnosis of the operation of a machine may be based on patterns of change in machine parameters A, B and C over time. Patterns of change in machine operational parameters may be characterized by a start of a sequence of events, an order of successive events, time intervals between successive events and an end of the sequence of events. Each event is preferably characterized by a condition that triggered the event and the duration of the event and is reflected as a pattern of change over time of a particular parameter. For example, referring to FIG. 23, a rise in parameter A is the start event of a pattern. Rise in parameter A is followed by a decrease in parameter C after time $t_1$, followed by a fast rise in parameter C with duration of $t_2$, and so on.

The end event of the pattern is a failure of a specific machine component, indicated as 'machine failure' in FIG. 23, following time $t_n$.

Event duration and time intervals between successive events may additionally or alternatively be measured in machine cycles or number of rotations performed by the machine. The x-axis of FIG. 23 may therefore be replaced by units of number of machine cycles rather than time.

The patterns leading to machine failure are flexible in time and are influenced by load, machine usage patterns, operating conditions and other factors. For example, rate of fault development in continuously working machines with a high load is higher than the rate of fault development in the same or similar machines with a low load. The pattern of events preceding machine failure for a machine working under high load will therefore span a shorter time compared to the pattern of events preceding machine failure for a machine working under a low load.

Characteristic failure deterioration rate may be roughly estimated based on operating parameters and fine-tuned based on the timing of the chain of deterioration event patterns. Such event patterns may be automatically extracted from the historical data collected from the plurality of machines 402 or 2004 during a learning stage, using machine learning algorithms. The extracted patterns may be used to characterize development of specific machinery faults.

A learning process to characterize development of specific machinery faults preferably includes detection of significant events in multiple parameters and correlation between significant events to known component failure. Detection of significant events is preferably performed on historical data obtained from plurality of machines 402 or 2004 and preferably includes detection of irregular values of operational parameters. Such irregular values may include local maximums or minimums.

Correlation between significant events is preferably performed automatically based on historical data using known algorithms. For example, correlator 2020 may use one of the Markov models such as Hidden Markov chains for process modeling. Maximum-likelihood, Bayesian interference and other approaches may be used for learning a model from data.

During an evaluation stage, the system preferably correlates data received from given machine 2024 and the historical data to one of the learned patterns. In a case that significant correlation is found, the system preferably provides a probability that the specific pattern indeed exists in the given machine 2024 and gives an indication of estimated time to failure for a specific fault. It is understood that such learning and evaluation processes may be confined to processing algorithms within server 160 or 2012 or may be at least partially performed by data processing module 150 or data collection module 2006.

Figure 24:
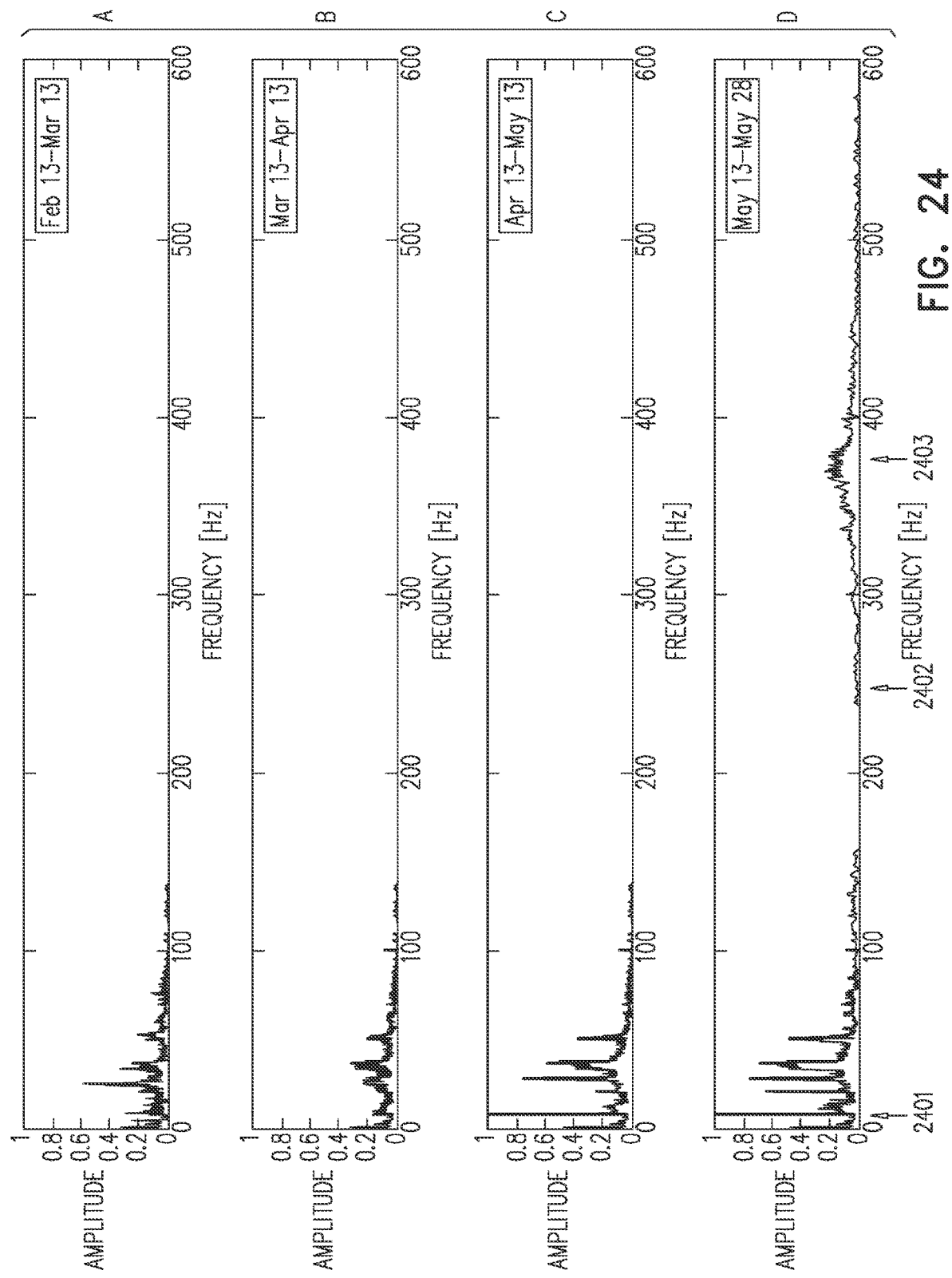
FIG. 24 is a graphical representation of patterns of change in operational parameters of a machine during development of a fault in the machine.

Data relating to patterns of change in an operational parameter preceding failure of a monitored machine are displayed in FIG. 24. In this case, the machine being monitored was an exhaust fan and the monitored operational parameter was energy of the peak at a first marker 2401, energy of a band around a second marker 2402 and energy of the band around a third marker 2403. Graphs A-D display data respectively obtained over four immediately successive time intervals spanning several months, with graph A showing data for the earliest recording, obtained during normal machine operation, and graph D showing data for the latest recording, taken several days before machine failure.

As is readily appreciated from a comparison of the spectra of graphs A-D, the spectra obtained from the machine are seen to change significantly over time, in the lead up to machine failure.

Figure 25:
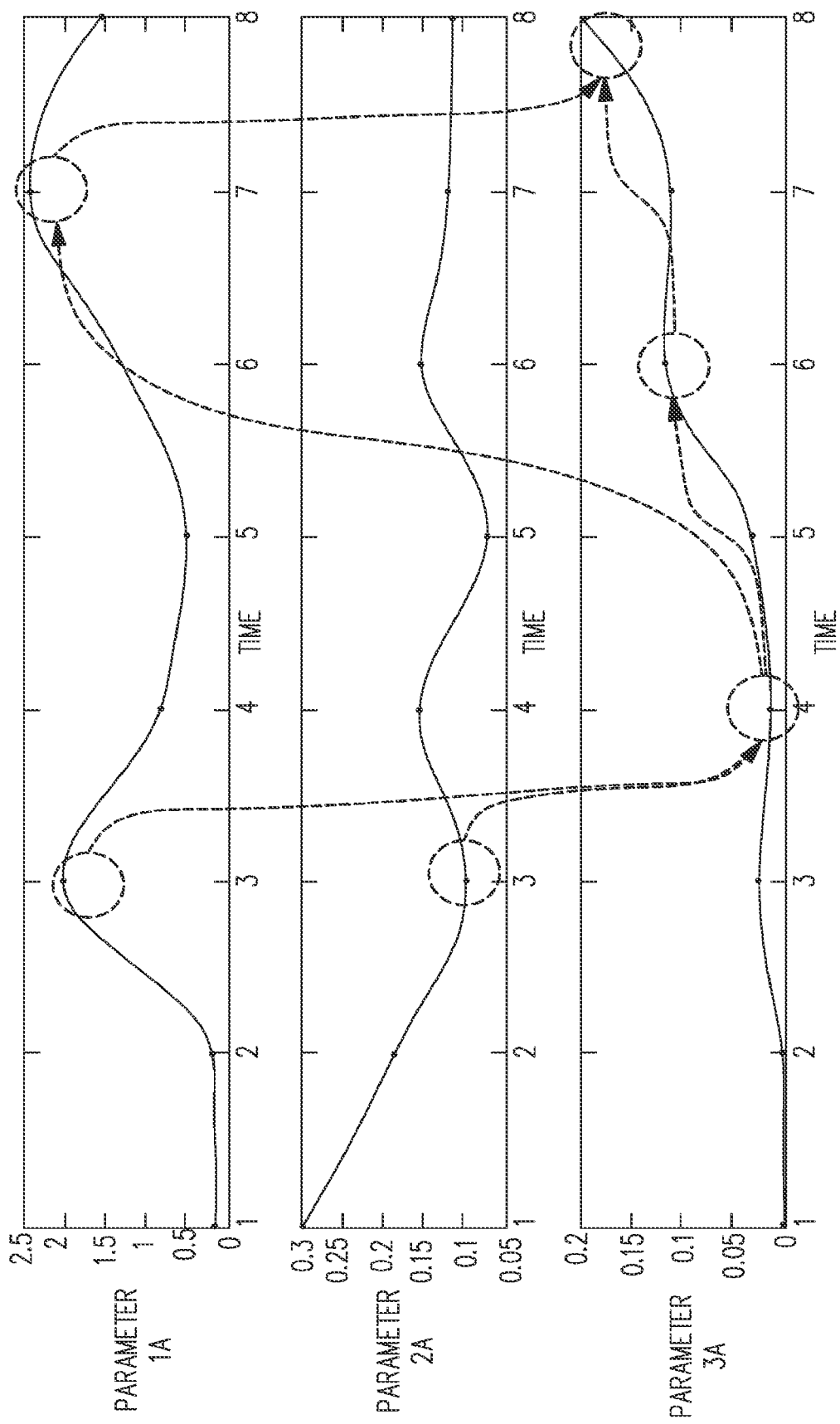
FIG. 25 is a simplified visualization of event driven machine diagnosis corresponding to the patterns of change displayed in FIG. 24.

Changes in three major operating parameters preceding the failure of the same machine for which data is shown in FIG. 24, are charted in FIG. 25. Data presented in FIG. 25 corresponds to a smoothed version of several data recordings collected over time, including the data displayed in FIG. 24.

In this case, the event pattern associated with failure of the machine starts at time point 3, when there is a significant rise in value of parameter 1A and significant decrease in value of parameter 2A. This is followed by a gradual rise in parameter 3A, concurrent with an additional rise in parameter 1A a few days before failure.

In a preferred embodiment of the present invention, patterns of change in parameters monitored by various sensors may automatically be combined. By way of example, patterns of change of multiple operational parameters may be measured by a continuous monitoring platform of the type of system 100, 400 or 1300, including tri-axial synchronous measurement of vibrations as well as temperature and magnetic sensing. Systems well-suited for such continuous monitoring include electrical motors and generators, transmission and driven equipment.

In one exemplary data-collection set-up carried out by the present inventors, a continuous monitoring platform of the type shown in system 100 was used to monitor electrical motors and driven equipment. Sensors were installed on two motor locations near to the motor bearings and on the driven equipment near to the equipment bearings.

The process of bearing deterioration was found to be as follows:

Initially, significant changes in the magnetic field of the motor in comparison to historical data were detected at one of the motor locations. Changes in the magnetic field were sensed by magnetic sensors of a type resembling magnetic sensor 130 in sensor module 110. This failure is believed to be related to the development of faults in motor electrical circuits such as, for example, cracked rotor bars. Subsequently, further development of electrical faults was found to generate more severe changes in magnetic field. The non-symmetric magnetic fields caused vibrations of the rotor, which vibration levels were found to increase over time as the fault progressed. Such vibrations were recorded by vibration sensors of a type resembling vibration sensors 220, 222, 224. High vibrations of the rotor generated higher load on motor bearings and as a result caused accelerated material fatigue of the bearings. At early stages of development of bearing failure the indications were primarily available in very high vibrational frequencies and in rise of energies in demodulated spectra. Progressive hearing failure generated energy that was found to become visible at lower frequencies. Advanced bearing failures caused a rise in temperature of the bearings and were recorded by a temperature sensor included in sensor module 110.

The following parameters may be related to the above-described chain of events:
(1) Magnetic field of motor relative to historical baseline of a given electrical machine or other similar electrical machines operating under similar operating conditions;
(2) Total energy in high frequency spectra relative to historical baseline of given machine or other similar machines;
(3) Total energy in demodulated spectra relative to historical baseline of a given machine or other similar machines;
(4) Non-synchronous energy relative to historical baseline of a given machine or other similar machines;
(5) Bearing temperature relative to historical baseline of a given machine or other similar machines.

The above-described chain of events is indicated by a rise in parameters (1) to (5) in sequential order with time. Machine learning algorithms may be provided with the patterns of change of these historical parameters and may be used to automatically extract that sequence (1) to (5) will ultimately result in machine failure. Such machine learning algorithms may be executed by server 160 and/or data processing module 150.

The input of machine learning algorithms is a normalized set of parameters as described herein above and the desired output may be, for example, predicted time-to-failure. Training of such machine learning algorithms is performed by providing historical examples of hearing failures. During an evaluation stage, each time data is recorded from the sensors, parameters (1)-(5) are calculated on the data. During a training stage these and other parameters are calculated using historical data as the input to the algorithm and time-to-failure provide as a target output.

Figure 26:
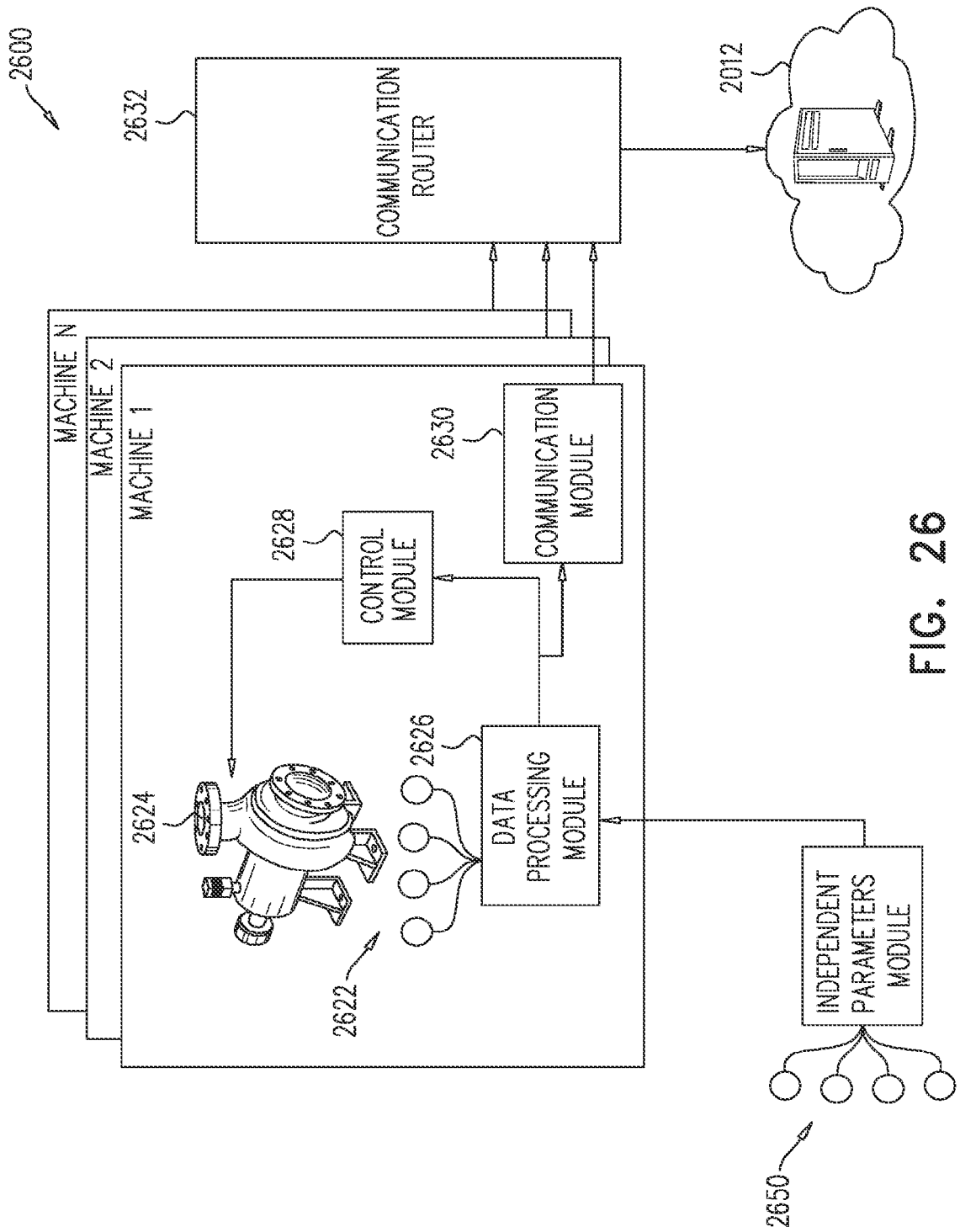
FIG. 26 is a simplified illustration of a portion of a system for automated monitoring and control of a machine, constructed and operative in accordance with yet a further preferred embodiment of the present invention.

Reference is now made to FIG. 26, which is a simplified illustration of a portion of system for automatic monitoring and control of a machine, constructed and operative in accordance with another preferred embodiment of the present invention.

In accordance with a preferred embodiment of the present invention, there is preferably provided a plurality of operational parameter sensing modules associated with a plurality of electrical or mechanical machines having at least one common electrical or mechanical feature, the plurality of operational parameter sensing modules providing historical output indications of at least one operational parameter of each of the plurality of mechanical devices over time, as illustrated in FIG. 20. The system preferably additionally includes a correlator, such as correlator 2020 shown in FIG. 20, operative to correlate at least one operational parameter in ones of the plurality of machines to at least one optimization metric in corresponding ones of the plurality of machines and to provide a correlator output.

Additionally, the system preferably includes an operational parameter sensing module associated with a given machine having the at least one common electrical or mechanical feature for providing an individual output indication of the at least one operational parameter of the given machine and a control output generator operative to receive the correlator output and the individual output indication, for providing a control output useful for enabling the given machine to operate in accordance with an operational parameter which is correlated by the correlator to have a desired optimization metric value.

FIG. 26 illustrates a portion of a system 2600 constructed and operative in accordance with this embodiment of the present invention. As is appreciated from consideration of FIG. 26, only a given machine to be controlled by the system is shown, denoted Machine 1, and the plurality of machines, based on the performance of which plurality of machines the control output is generated, are denoted as Machines 2-N. The plurality of machines 2-N and the components associated therewith are generally as shown in FIG. 20. Given machine 1 and machines 2-N preferably share at least one common electrical or mechanical feature.

As seen in FIG. 26, an operational parameter sensor module 2622 is preferably associated with a given machine 2624, for providing an individual output indication of at least one operational parameter of machine 2624. By way of example, machine 2624 may be a mechanical or electrical machine and is here illustrated to comprise a pump. Operational parameter sensor module 2622 may be any type of sensor module suitable for monitoring operational parameters of machine 2624. Operational parameter sensor module 2622 is particularly preferably embodied as one or more sensor modules 110 including a plurality of sensors, preferably although not necessarily operating synchronously. By way of example, operational parameter sensor module 2622 may at least include magnetic sensor 130 and three tri-axial vibration sensors 220, 222 and 224 preferably operating mutually synchronously.

The individual output indication from operational parameter sensing module 2622 is preferably provided to a data processing module 2626. Data processing module 2626 may be embodied as data processing module 150, by way of example only. Data processing module 2626 may process data received thereat relating to the sensed operational parameter of machine 2624. Particularly preferably, data processing module 2626 may analyze the individual output indication in accordance with any of the automatic algorithms described hereinabove, in order to derive a condition of machine 2624. By way of example, data processing module 2626 may detect impending failure of machine 2624 based on the condition thereof, as sensed by operational parameter sensing module 2622.

Upon detection of impending failure, data processing module 2626 preferably sends a signal to a control module 2628 interfacing with a machine controller and limits functionality of the machine 2624 in order to prevent rapid deterioration of machine 2624. For example, high overall vibration levels are a reliable indicator of inefficient machinery performance and possible failure development. By altering machine operation, for example by reducing the load on machine 2624, machine vibrations may be correspondingly reduced and further development of failure thereby halted or delayed.

Changes in machine operation may be reported by a communication module 2630 to main server 2012 by way of a communication router 2632 or to a local node such as data collection module 2626, so as to alert maintenance staff on limited system performance. Maintenance staff may manually override this behavior using one of the system interfaces, such as email, a smartphone application or web application.

In accordance with embodiments of the present invention, the system of FIG. 26 may be used to examine trends in given machine 2624 and a control output may be fed to the machine 2624 in order to cause the machine to operate so as to realize a desired optimization metric value. The desired optimization metric may be machine efficiency, machine power consumption, machine vibration levels or estimated time of failure. In this case, operational parameter sensor module 2622 may sense one or more optimization metrics or one or more optimization metrics may be obtained from external sources, such as electricity usage, maintenance records etc.

System performance may be optimized, by way of example, based on estimated time-to-failure. By way of example, for each machine being continuously monitored, a threshold may be set for action based on known availability and repairs scheduling. For example, a machine repair cycle may be scheduled for 3 months ($T_r$=90 days). Using systems as described above in reference to FIGS. 20-25, time-to-failure ($\tilde{T}_i$) on each machine 1-N may be calculated each time a recording is performed. If the calculated time-to-failure crosses a repair cycle threshold or approaches this threshold such that it will cross the threshold before the next repair cycle and additional machines are available for performing the same task as is performed by the failing machine, control module 2628 may be used to change machine operation in order to maximize minimal time-to-failure on all machines such that $$\forall i: \min \tilde{T}_i(t) > T_r$$

For example, two pumps may be connected to the same line. Based on vibration levels one of the pumps is expected to reach a dangerous state in 30 days. The other pump, based on vibration levels, is expected to reach that state in 200 days. Based on these estimations, the system may transfer majority of the load to the healthier pump using control module 2628 such that total machine availability remains high. At the same time, an alert may be generated to maintenance staff to prepare for pump maintenance.

A control output from control module 2628 may be an alert, a recommendation, an alarm or indication to machine operator, instead of or in addition to being an output, which directly causes a given machine to operate in a calculated manner.

System 2600 may additionally include an independent parameter sensor module 2650. Data processing module 2606 may collect additional information about the operating conditions of the machine using input from independent parameter sensor module 2650 and diagnostic patterns may be generated as described hereinabove with reference to FIG. 20 and/or control outputs delivered based on these parameters. Such parameters may include, for example, outside temperature, humidity, density of particulates in the air and others. Independent parameter sensor module 2650 may form a part of a separate supporting system or may be a dedicated entity in system 2600. Alternatively, parameters supplied by independent parameter sensor module 2650 may be calculated or estimated based on other additional data.

Additional information such as global operating parameters may also be collected by the main server 2012 or by other components in system 2000 or 2600 such as communication module 2630. Such global information may be a date, month, day of the week, financial market information, TV schedule or any other information not directly related to machine operation.

Based on these parameters, the system may predict future performance and load and thus optimize machine operations accordingly. By way of example, the number of visits to an emergency room in a hospital may be statistically lower during weekends than on other days. HVAC (Heat Ventilation Air Conditioning) machine performance may therefore be optimized based on the expected number of visitors. Further by way of example, unusually high outside morning temperatures may lead to the prediction of high loads on cooling systems near opening hours and cooling may hence be activated before the opening occurs.

Further by way of example, patterns of water consumption may change significantly during major events having many spectators. Predicting utilities consumption may allow more efficient machine usage and lower operational costs.

Additionally in accordance with another preferred embodiment of the present invention, the system as described hereinabove with reference to FIGS. 20-26 may be configured and operative to sense control inputs provided to the machine 2624, collect data from machine 2624 and correlate control inputs and data with other similar machines over time such as machines 2-N, optionally including machine 2624 itself. The system may learn and/or establish correlations between control inputs and data. Based on these correlations, the system may identify anomalous control inputs and/or system performance and alert maintenance staff accordingly. Such anomalies may be due to errors in machine operation or significant changes in machine control procedure, for example as a result of malicious software or invalid usage.

In the case that system 2000 of FIG. 20 and/or system 2600 is implemented in order to automatically sense problematic conditions in machine systems due to external malicious intervention, correlator 2020 is preferably operative to correlate the at least one operational parameter in ones of the plurality of machine systems 1-N to at least one other parameter in ones of the plurality of machine systems 1-N and provide a correlation output indication. The at least one other parameter may or may not be a mechanical or electrical parameter.

Operational parameter sensing module 2022 associated with a given machine having the at least one common mechanical or electrical feature preferably provides an individual output indication of the at least one of said operational parameter and the other parameter of the given machine.

In this case, control module 2628 and communication module 2630 of system 2600 may operate as an anomaly alert generator operative to receive the correlation output indication and the individual output indication and to provide an anomaly alert based on a dissimilarity between at least one of the operational parameter and the other parameter of the given machine indicated by the individual output indication and at least one of said operational parameter and the other parameter indicated by the historical output indications.

Additionally or alternatively, control module 2628 may operate as a control output generator operative to receive the correlation output indication and the individual output indication and preferably providing a hacking responsive control output to the given machine based on a dissimilarity between at least one of the operational parameter and the other parameter of the given machine indicated by the individual output indication and at least one of the operational parameter and the other parameter indicated by the historical output indications.

Based on historical data collected for a given machine or machines at similar locations it is possible to create a model of machine operation. For example, in the case of a chiller it is possible to generate a model based on outside temperature, chiller power consumption and chiller load that will predict inside temperature, according to:

$$\hat{t}_{ins}=f(t_{out},P,L)$$

where $t_{ins}$ is temperature inside the building, $t_{out}$ is the temperature outside, P is power consumption and L is chiller load. If significant deviations are found to exist between predicted temperature and measured temperature, an alert may be generated. To find significant deviations an estimation error may be calculated such as:

$$e(t)=t_{ins}(t)-\hat{t}_{ins}(t)$$

where $\hat{t}_{ins}$ is the actual temperature inside the building. The calculated errors may then be compared to error distributions known from historical data and reflecting inherent model accuracy. Such a comparison may be made using statistical tools such as hypothesis testing or Bayesian methods. Machine models used may be purely statistical such as used in statistical process control (SPC), machine learning or any other suitable kind of anomaly detection algorithms.

In the case that the monitored machine is part of a system including many machine components, one machine in the system may be diagnosed based on monitoring of at least one operational parameter associated with another machine in the same system. An exemplary system for analysis of one electrical or mechanical machine within a machine system, based on monitoring of another electrical or mechanical machine within the same system is illustrated in FIG. 27.

Figure 27:
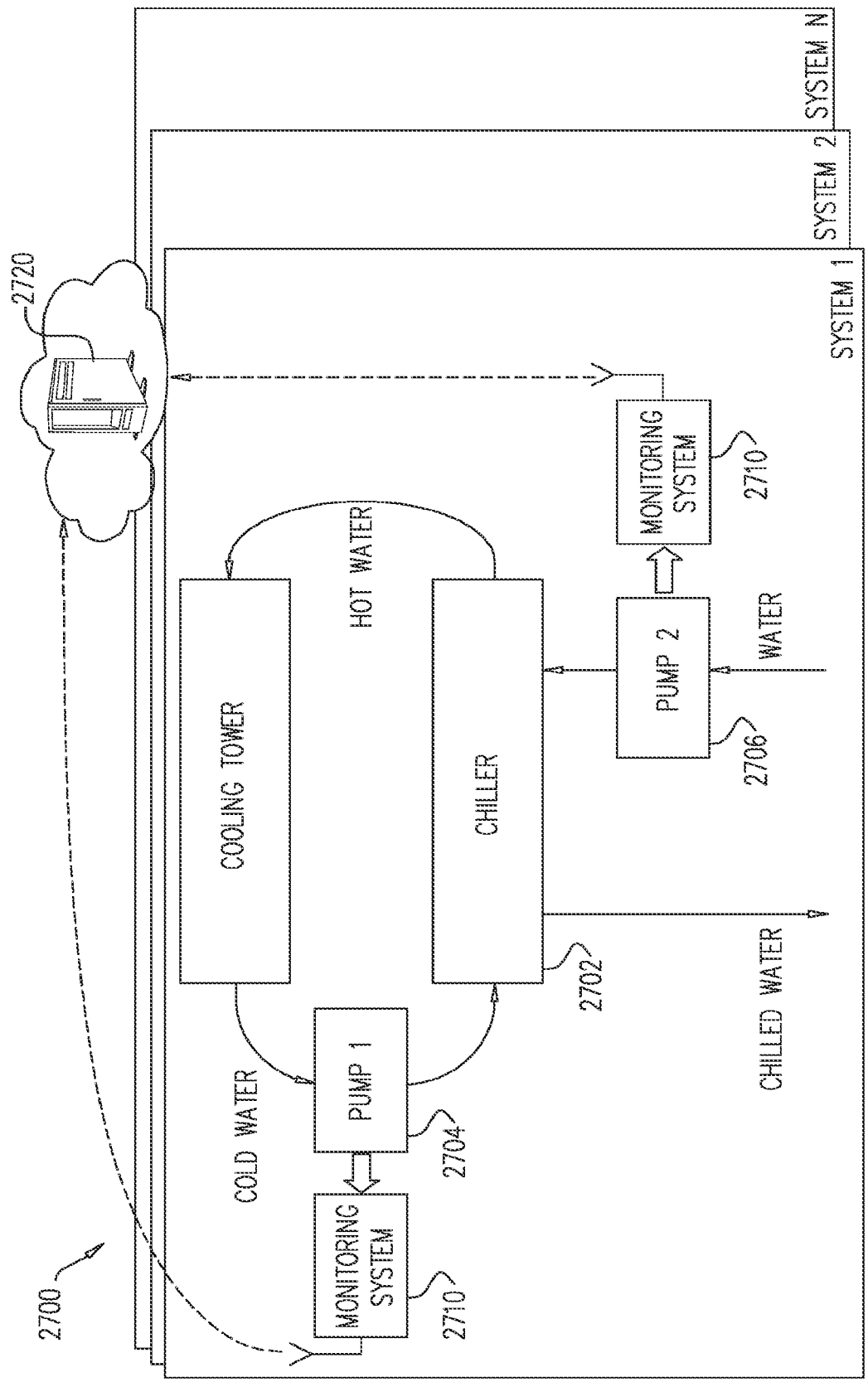
FIG. 27 is a simplified illustration of a system for monitoring multiple machines within a single system, constructed and operative in accordance with a still further preferred embodiment of the present invention.

As seen in FIG. 27, a machine system 2700 may comprise a chiller 2702 connected to a first pump 2704 and a second pump 2706. Operating parameters of first and second pumps 2704 and 2706 are preferably monitored and the condition of each of first and second pumps 2704 and 2706 is preferably ascertained by way of a monitoring system 2710 preferably associated with each of first and second pumps 2704 and 2706.

Monitoring system 2710 may be embodied as of any of the monitoring system types described hereinabove with reference to FIGS. 1-4 and FIGS. 20-26 and preferably includes at least one operating parameter sensor module such as sensor module 110 or sensor module 2002 in communication with at least one data processing module such as data processing module 150 or data processing module 2606. Monitoring systems 2710 are preferably in communication with a server 2720, which server 2720 may be embodied as server 160 or server 2012, by way of example only.

It is appreciated that chiller 2702 is preferably not directly monitored by monitoring system 2710. By way of example, failure of chiller 2702 forming part of system 2700 may be diagnosed based on changes in at least one operating parameter, such as changes in vibrations, arising from one or both of first and second pumps 2704 and 2706. It is appreciated that the operating state of a particular electrical or mechanical machine within a machine system may thus be identified without necessarily directly obtaining data from that machine, by way of monitoring of a different machine cooperating with the machine be diagnosed. Further by way of example, a defect or failure of a pump impeller may be diagnosed based on monitoring operational parameters such as magnetic flux associated with a motor driving the pump.

A system for diagnosing a particular machine within a system comprising a plurality of machines, such as system 2700, may include at least one operational parameter sensing module, such as operational parameter sensing nodule 2002 of FIG. 20, providing historical output indications of at least one operational parameter of at least one machine. For example, the sensing module may be a vibration sensor providing historical output indications of vibrations arising from first and second pumps 2704 and 2706 in system 2700. Further by way of example, the sensing module may be embodied as sensor module 110 synchronously sensing at least magnetic and vibration data from first and second pumps 2704 and 2706.

The system may further include a correlator, such as correlator 2020 of FIG. 20, for correlating the historical output indications of the at least one operational parameter to historical indications of at least one additional parameter associated with at least one other machine in the system and providing a correlation output indication. By way of example, the correlator may correlate historical output indications of vibrations arising from first and second pumps 2704, 2706 with corresponding historical output indications of an operating state of chiller 2702 connected to pumps 2704, 2706. The correlation output indication provided by correlator 2020 may include a correlation between vibrations of the pumps 2704 and 2706 and operating states of the chiller 2702, possibly including vibrations associated with defective chiller operation or vibrations associated with failure of the chiller. The correlation output may be based on historical data from system 2700 only, denoted system 1, or from similar systems 2-N.

The system may further include an operational parameter sensing module, such as operational parameter sensing module 2022, associated with a given machine having at least one mechanical or electrical feature, environmental feature or performance feature in common with the at least one machine for which historical output indications were obtained. The operational parameter sensing module 2022 preferably provides an individual output indication of the at least one operational parameter of the given machine. For example, the operational parameter sensing module may be a vibration sensor sensing vibrations generated by the same or a similar pump to that for which the historical vibrations and correlation were obtained.

The system may further include a control output generator, such as control module 2628, operative to receive the correlation output indication and the individual output indication, for applying the correlation output indication to the individual output indication for deriving the additional parameter and providing a control output to the given machine or machine system based on the additional parameter derived. For example, control module 2628 may receive the sensed vibrations from pump 2704 and 2706 and apply thereto the correlation output indication correlating pump vibrations to the chiller state. The control output generator may thus derive the operating state of chiller 2702 without directly measuring current operating parameters of chiller 2702.

It will be appreciated by persons skilled in the art that the present invention is not limited by what has been particularly claimed hereinbelow. Rather, the scope of the invention includes various combinations and subcombinations of the features described hereinabove as well as modifications and variations thereof as would occur to persons skilled in the art upon reading the forgoing description with reference to the drawings and which are not in the prior art.

The invention claimed is:

1. A system for continuously monitoring at least one machine comprising:
    at least one magnetic sensor sensing magnetic field emission intrinsically generated by operation of at least one machine and outputting magnetic field emission signals corresponding to said magnetic field emission;
    at least one vibration sensor sensing vibrations arising from said at least one machine and outputting vibration signals corresponding to said vibrations, said sensing of said vibrations being performed synchronously with said sensing of said magnetic field emission;
    a signal analyzer receiving at least a portion of said magnetic field emission signals and said vibration signals, performing phase analysis of said magnetic field emission signals in order to extract a phase of said magnetic field emission signals, and analyzing said vibration signals with respect to said phase extracted from said magnetic field emission signals,
    said signal analyzer providing an output based on said analysis, said output comprising an indication at least of the presence or absence of at least one fault of said machine; and
    a control module receiving said indication and, in a case of said indication indicating said fault to be present, initiating at least one of a repair event on said at least one machine, an adjustment to a maintenance schedule of said at least one machine and an adjustment to an operating parameter of said at least one machine based on said indication.

2. The system according to claim 1, wherein said signal analyzer is additionally operative to ascertain a condition of said machine based on said phase of said magnetic field emission signals and amplitudes of both said magnetic field emission signals and said vibration signals.

3. The system according to claim 1, wherein said phase analysis comprises generation of an orbit plot representing characteristics of said machine.

4. The system according to claim 3, wherein said phase analysis comprises generation of a phase plot, wherein said phase plot comprises a plot of a relative phase of said magnetic field emission signals and vibration signals against a sum of said magnetic field emission and vibration signals energies.

5. The system according to claim 1, wherein said signal analyzer is at least partly incorporated in at least one of said magnetic sensor and said vibration sensor and at least partly incorporated in the cloud.

6. The system according to claim 1, wherein each of said magnetic field emission signals and said vibration signals are sensed along multiple channels.

7. The system according to claim 1, and also comprising at least one low-power consumption sensor module having a lower power uptake than each of said magnetic sensor and said vibration sensor, said at least one low-power consumption sensor module continuously sensing an operating parameter of said at least one machine and controlling operation of at least one of said magnetic sensor and vibration sensor based on said sensed operating parameter.

8. The system according to claim 7, wherein said low-power consumption sensor comprises a magnetic field emission sensor.

9. The system according to claim 7, wherein said low-power consumption sensor initiates operation of said at least one of said magnetic sensor and vibration sensor responsive to said sensed operating parameter exceeding a threshold.

10. The system according to claim 1, wherein said at least one machine comprises a synchronous or asynchronous electrical machine.

11. A method for continuously monitoring at least one machine comprising:
    sensing magnetic field emission intrinsically generated by operation of at least one machine and outputting magnetic field emission signals corresponding to said magnetic field emission;
    sensing vibrations arising from said at least one machine and outputting vibration signals corresponding to said vibrations, said sensing of said vibrations being performed synchronously with said sensing of said magnetic field emission;
    receiving at least a portion of said magnetic field emission signals and said vibration signals, performing phase analysis of said magnetic field emission signals in order to extract a phase of said magnetic field emission signals, and analyzing said vibration signals with respect to said phase extracted from said magnetic field emission signals,
    providing an output based on said analysis, said output comprising an indication at least of the presence or absence of at least one fault of said machine; and
    in a case of said indication indicating said fault to be present, initiating at least one of a repair event on said at least one machine, an adjustment to a maintenance schedule of said at least one machine and an adjustment to an operating parameter of said at least one machine based on said indication.

12. The method according to claim 11, and also comprising ascertaining a condition of said machine based on said phase of said magnetic field emission signals and amplitudes of both said magnetic field emission signals and said vibration signals.

13. The method according to claim 11, wherein said phase analysis comprises generating an orbit plot representing characteristics of said machine.

14. The method according to claim 11, wherein said phase analysis comprises generating a phase plot, wherein said phase plot comprises a plot of a relative phase of said magnetic field emission signals and vibration signals against a sum of said magnetic field emission and vibration signals energies.

15. The method according to claim 11, wherein said analyzing is at least partly performed within at least one of a magnetic sensor and a vibration sensor respectively sensing said magnetic field emission signals and said vibration signals and at least partly performed in the cloud.

16. The method according to claim 11, wherein each of said magnetic field emission signals and said vibration signals are sensed along multiple channels.

17. The method according to claim 15, and also comprising providing at least one low-power consumption sensor module having a lower power uptake than each of said magnetic sensor and said vibration sensor, said at least one low-power consumption sensor module continuously sensing an operating parameter of said at least one machine and controlling operation of at least one of said magnetic sensor and vibration sensor based on said sensed operating parameter.

18. The method according to claim 17, wherein said low-power consumption sensor comprises a magnetic field emission sensor.

19. The method according to claim 17, wherein said low-power consumption sensor initiates operation of said at least one of said magnetic sensor and vibration sensor responsive to said sensed operating parameter exceeding a threshold.

20. The method according to claim 11, wherein said at least one machine comprises a synchronous or asynchronous electrical machine.

\* \* \* \* \*